(12) United States Patent
Wang et al.

(10) Patent No.: US 11,303,789 B2
(45) Date of Patent: Apr. 12, 2022

(54) CAMERA MODULE AND ARRAY CAMERA MODULE WITH CIRCUIT BOARD UNIT AND PHOTOSENSITIVE UNIT AND MANUFACTURING METHOD THEREOF

(71) Applicant: NINGBO SUNNY OPOTECH CO., LTD., Zhejiang (CN)

(72) Inventors: Mingzhu Wang, Ningbo (CN); Bojie Zhao, Ningbo (CN); Takehiko Tanaka, Ningbo (CN); Feifan Chen, Ningbo (CN); Qimin Mei, Ningbo (CN); Liang Ding, Ningbo (CN); Heng Jiang, Ningbo (CN)

(73) Assignee: NINGBO SUNNY OPOTECH CO., LTD., Zhejiang Province (CN)

( * ) Notice: Subject to any disclaimer, the term of this patent is extended or adjusted under 35 U.S.C. 154(b) by 0 days.

(21) Appl. No.: 16/908,723

(22) Filed: Jun. 22, 2020

(65) Prior Publication Data
US 2020/0322514 A1    Oct. 8, 2020

Related U.S. Application Data

(60) Continuation of application No. 16/436,934, filed on Jun. 11, 2019, now Pat. No. 10,735,637, which is a continuation of application No. 16/101,509, filed on Aug. 12, 2018, now Pat. No. 10,367,983, which is a division of application No. 15/460,236, filed on Mar.
(Continued)

(51) Int. Cl.
*H04N 5/225* (2006.01)
*H01L 27/146* (2006.01)
*H04N 13/239* (2018.01)

(52) U.S. Cl.
CPC ....... *H04N 5/2257* (2013.01); *H01L 27/1469* (2013.01); *H01L 27/14618* (2013.01); *H01L 27/14634* (2013.01); *H01L 27/14636* (2013.01); *H04N 5/2252* (2013.01); *H04N 5/2253* (2013.01); *H04N 5/2254* (2013.01); *H04N 5/2258* (2013.01); *H04N 13/239* (2018.05); *H01L 2224/48091* (2013.01); *H04N 2213/001* (2013.01)

(58) Field of Classification Search
CPC .. H04N 5/2257; H04N 5/2252; H04N 13/239; H04N 5/2258; H04N 5/2253; H04N 5/2254; H04N 2213/001; H01L 27/14618; H01L 27/14636; H01L 27/14634; H01L 27/1469; H01L 2224/48091
See application file for complete search history.

(56) References Cited

U.S. PATENT DOCUMENTS 10,084,949 B2 *  9/2018  Wang .................. H04N 5/2253
10,367,983 B2 *  7/2019  Wang ................ H01L 27/14636
(Continued)

*Primary Examiner* — Albert H Cutler
(74) *Attorney, Agent, or Firm* — Wenderoth, Lind & Ponack, L.L.P.

(57) ABSTRACT

A camera module and array camera module with circuit board unit and photosensitive unit and manufacturing method thereof is provided. The array camera module comprises two or more camera lenses and a circuit unit. The circuit unit comprises a circuit board portion for electrically connecting two or more photosensitive sensors of the array camera module, and a conjoined encapsulation portion integrally encapsulated on the circuit board portion. The camera lenses are respectively arranged along the photosensitive paths of the photosensitive sensors.

20 Claims, 56 Drawing Sheets

Related U.S. Application Data

16, 2017, now Pat. No. 10,084,949, which is a continuation of application No. 15/075,192, filed on Mar. 20, 2016, now Pat. No. 10,750,071.

(56) References Cited

U.S. PATENT DOCUMENTS

| | | | |
|---|---|---|---|
| 10,735,637 B2* | 8/2020 | Wang | H04N 5/2254 |
| 2015/0109526 A1* | 4/2015 | Lee | H04N 5/2254 |
| | | | 348/374 |
| 2015/0138436 A1* | 5/2015 | Wong | H01L 27/14683 |
| | | | 348/374 |
| 2015/0373239 A1* | 12/2015 | Choi | G02B 5/208 |
| | | | 348/360 |
| 2016/0109783 A1* | 4/2016 | Chen | H04N 5/2253 |
| | | | 348/375 |
| 2016/0150133 A1* | 5/2016 | Suzuki | H04N 5/2256 |
| | | | 348/376 |

* cited by examiner

CAMERA MODULE AND ARRAY CAMERA MODULE WITH CIRCUIT BOARD UNIT AND PHOTOSENSITIVE UNIT AND MANUFACTURING METHOD THEREOF

CROSS REFERENCE OF RELATED APPLICATION

This application is a Continuation application that claims the benefit of priority under 35 U.S.C.§ 120 to a non-provisional application, application Ser. No. 16/436,934, filed Jun. 11, 2019, which is a Continuation application that claims the benefit of priority under 35 U.S.C.§ 120 to a non-provisional application, application Ser. No. 16/101,509, filed Aug. 12, 2018, which is a Divisional application that claims the benefit of priority under 35 U.S.C.§ 120 to a non-provisional application, application Ser. No. 15/460,236, filed Mar. 16, 2017, which is a Continuation application that claims the benefit of priority under 35 U.S.C.§ 120 to a non-provisional application, application Ser. No. 15/075,192, filed Mar. 20, 2016, which is incorporated herewith by reference in its entity.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to the field of camera module, and more particularly to a single and/or array camera module with circuit board unit and photosensitive unit and the manufacturing method thereof.

Description of Related Arts

COB (Chip On Board, chip packaging) technique is a very important technical process in the process of assembling and producing camera module. A camera module produced by means of the conventional COB technique is assembled of a circuit board, a photosensitive sensor, a lens holder, a motor drive, and a camera lens.

FIG. 1 refers to a perspective view of a camera module produced by means of the conventional COB technique. The camera module includes a circuit board 1P, a sensor 2P such as a photosensitive chip, a lens holder 3P, an optical filter 4P, a motor 5P, and a camera lens 6P. The sensor 2P is installed on the circuit board 1P. The optical filter 4P is installed on the lens holder 3P. The camera lens 6P is installed on the motor 5P. The motor 5P is installed on the lens holder 3P, so that the camera lens 6P is positioned along a photosensitive path of the sensor 2P.

It is worth mentioning that there is often a plurality of circuit components 7P, such as resistors, capacitors, and etc., installed on the circuit board 1P. These circuit components 7P protrude from the surface of the circuit board 1P. However, the lens holder 3P has to be mounted on the circuit board 1P with the circuit components 7P. According to the conventional COB technology, there are disadvantages in the assembling and coordination relationships among the circuit board 1P, the circuit components 7P, and the lens holder 3P, which also restrict the development for the camera module to become lighter and thinner.

It is also worth mentioning that the sensor 2P is usually electrically connected with the circuit board 1P with conductive elements such as gold wires 8P for data transmission between the sensor 2P and the circuit board 1P. Based on the feature and structure of the gold wires 8P, the gold wires 8P are usually curvedly bent and protruded from the surface of the circuit board 1P. Therefore, the assembling process of the sensor 2P, like the circuit components 7P, has the similar adverse effects to the camera module.

In particular, firstly, the circuit components 7P and the gold wires 8P are directly exposed on the surface of the circuit board 1P. As a result, they will inevitably be affected during the subsequent assembling processes, such as adhering the lens holder 3P, soldering the motor 5P, and etc., wherein solder resists, dusts and etc. during the soldering process may easily stick to the circuit components 7P. Besides, because the circuit components 7P and the sensor 2P are connected and provided in a common space, those dusts and pollutants can easily and adversely affect the sensor 2P that can result in undesirable occurrences such as dark spots of the assembled camera module, which increases the defective rate of the camera module.

Secondly, the conventional lens holder 3P is positioned at the outer side around the circuit components 7P. Therefore, to mount the lens holder 3P on the circuit board 1P, a safe distance is required to be reserved between the lens holder 3P and the circuit components 7P in both horizontal direction and upward direction, that results in increasing the thickness of the camera module and the difficulty to the thickness reduction of the camera model.

Thirdly, during the COB assembling process, the lens holder 3P or the motor 5P is adhered on the circuit board 1P with adhesive material, such as glue. During the adhering, an Active Arrangement (AA) technique is usually required to adjust the central axis lines of the sensor 2P and the camera lens 6P being aligned coincidently in both horizontal and vertical directions. Therefore, in order to satisfy the practice of the AA technique, it is required to additionally provide more glue between the lens holder 3P and the circuit board 1P as well as between the lens holder and the motor 5P, so as to reserve adjustment space between each other. Nevertheless, this adjustment space requirement will not only further increase the thickness of the camera module, rendering it substantially being more difficult to reduce the thickness of the camera module, but also cause tilt discrepancy of the assembling more easily during such multiple adhering process. Moreover, it further requires a higher evenness for the lens holder 3P, circuit board 1P and motor 5P.

In addition, in the conventional COB technology, the circuit board 1P forms the basic affixing and supporting body for the camera module, so that the circuit board 1P is required to have a predetermined structural strength. This requirement makes the circuit board 1P having a larger thickness, which also increases the thickness of the camera module from another aspect.

Along with the development of all kinds of electronic product and smart device, camera modules are also developed to achieve higher performance and more compact size. Meanwhile, in order to meet the various requirements of high performance development, including high resolution and high image quality, more and more electronic components are provided in the circuit, the size and surface area of the sensor becomes larger and larger, and the passive components, such as driving resistors and capacitors, are correspondingly increased. As a result, the size of the electronic device becomes larger and larger, the assemble difficulty thereof increases accordingly, and the overall size of the camera module becomes bigger and bigger. In view of the above factors, the conventional assembling method of the lens holder, circuit board, and circuit components becomes a great restriction, to a certain extent, to the development of a lighter and thinner camera module.

Referring to FIG. 29, a sectional perspective view of an array (twin-lens) camera module assembled by the above conventional COB assembling method is illustrated.

Currently, most electronic products tend to have more functions integrated, that creates more and more cross-categorical products. For example, cellular phones have been transformed from communication devices to highly integrated mobile electronic devices that integrally achieve the diverse and multi-dimensional functions of communication, photography, internet accessing, navigation, and etc.

However, the camera module installed in the current mobile electronic devices is usually a single lens camera module that can no longer satisfy the user's multi-functional application demand of the mobile electronic device in both image quality and effects of photography.

Accordingly, camera module with more than one lens, for example array camera module such as twin-lens camera module, is provided to produce shooting modes that imitate the arrangement of the two eyes of a human being. Moreover, such twin-lens camera module provides better performances than the single lens camera module in 3D photographing and scanning, gesture position recognition, naturalness of color, auto-focusing, panoramic and deep photography, bokeh photography, and etc. Therefore, it will be an important direction of development in the camera module industry to have camera module with more than one camera lens. When a twin-lens camera module is capturing images, it utilizes two imaging modules that are different in spatial positions to respectively capture images from two positions. Then the images respectively captured by these two imaging modules are synthesized according to an image synthesis process, so as to bring a final image of the multi-lens camera module. It is understandable that, in this process, the consistency of the image effect of the resolution, the shading, the color, and etc. of each camera module of the multi-lens camera module and the deviances in the horizontal, vertical and longitudinal directions are important factors to judge the image quality of the twin-lens camera module.

However, currently, the structure and technology of manufacturing and assembling the twin-lens camera module are far away from ensuring the image quality of the twin-lens camera module as demanded. FIG. 29 illustrates a twin-lens camera module made by the conventional assembling method, which includes a circuit board 10P, two lens holders 20P, and two imaging modules 30P, wherein each of the imaging modules 30P includes a motor-camera lens unit 31P. The lens holder 20P is independently arranged at the same side of the circuit board 10P and connected with the other lens holder 20P by means of the circuit board 10P. The motor-camera lens units 31P are arranged on the lens holders 20P respectively so as to be supported by the lens holders 20P respectively. It is understandable that, according to the conventional assembly technology for the twin-lens camera module, since each lens holder 20P is independently adhered on the circuit board 10P, it is really difficult to control the dimensions, positions and etc. between the lens holders 20P.

As a consequence, the consistency of the parameters, such as the dimensions and positions between the frames of the twin-lens camera modules, is poor. In view of the structure of the conventional twin-lens camera module, each lens holder 20P is independent by itself and merely connected to the circuit board 10P. Nonetheless, the circuit board 10P is usually a PCB, printed circuit board, which is relatively soft and easy to be distorted, that it is difficult to ensure the overall rigidity of the conventional twin-lens camera module. In addition, during the usage after the twin-lens camera module is assembled, such independent structure can easily cause high positioning tolerance and instability of the relative dimensions among the elements, such as the motor-camera lens units 31P, of the imaging module 30P. Moreover, other problems, like the photosensitive axis of the imaging module 30P easily deviating from the designated position, may easily happen. Once any of these situation occurs, the image quality of the twin-lens camera module will be adversely affected. For example, there are uncontrolled factors or bigger adverse impacts to the final imaging effect of the image synthesis.

Besides, the assembling of the multi-lens camera module is based on the conventional Chip On Board (COB) technology, wherein there are usually protruded circuit components 11P on the circuit board 10P. The circuit board 10P also comprises a photosensitive element such as a sensor 12P mounted thereon. The sensor 12P is usually connected to the circuit board 10P with conductive elements such as gold wires 121P which are normally curvedly protruded from the circuit board 10P. As a result, these protruding circuit components 11P and gold wires 121P also cause certain disadvantageous factors to the assembling of the camera module.

The circuit components 11P and the gold wires 121P are directly exposed on the surface of the circuit board 10P. Accordingly, they inevitably affect the subsequent assembling processes, such as the adhering the lens holders 20P, soldering the motor-camera lens units 31P, and etc., wherein solder resist, dust and etc. from the soldering process can easily stick on the circuit component s11P. Besides, because the circuit components 11P and the sensors 12P are disposed in a common space, the dusts and pollutants can easily affect the sensors 12P and such influences can result in undesirable occurrences such as dark spots of the assembled camera module that decreases the product yield rate.

In addition, the lens holders 20P are positioned at the outer side of the circuit components 11P. Therefore, to adhere the lens holders 20P on the circuit board 10P, a predetermined safety distance must be reserved among the lens holders 20P and the circuit components 11P in both horizontal direction and upward direction, that substantially increases the thickness of the twin-lens camera module and the difficulty to reduce the thickness of the twin-lens camera model.

Besides, comparing to the single-lens camera module, the multi-lens camera module relates to issues of coordination between multiple camera modules. The photosensitive axises among all camera lenses are required to be consistent. However, the consistency of the photosensitive axes of multiple camera lens modules based on the traditional COB technology is hard to be ensured. Furthermore, the overall size of a conventional multi-lens camera module is larger, which is more sensitive to the strength and smoothness of the circuit board and, therefore, the circuit board is thicker.

SUMMARY OF THE PRESENT INVENTION

An object of the present invention is to provide a camera module and array camera module with circuit board unit and photosensitive unit and manufacturing method thereof, wherein the photosensitive unit includes an encapsulation portion and a photosensitive portion. The encapsulation portion is encapsulated to form on the photosensitive portion.

An object of the present invention is to provide a camera module and array camera module with circuit board unit and photosensitive unit and manufacturing method thereof, wherein the photosensitive portion of the photosensitive unit includes a sensor and a main circuit board. The sensor electrically connects to the main circuit board through at least a connecting element and the encapsulation portion of the photosensitive unit wraps up the connecting element to prevent it from being directly exposed to the outside.

An object of the present invention is to provide a camera module and array camera module with circuit board unit and photosensitive unit and manufacturing method thereof, wherein the connecting elements are integrally enclosed, encapsulated and/or wrapped up in the encapsulation portion through a molding manufacturing process.

An object of the present invention is to provide a camera module and array camera module with circuit board unit and photosensitive unit, and manufacturing method thereof, wherein the photosensitive unit includes at least one circuit element. The circuit element is enclosed, encapsulated and/or wrapped up in the encapsulation portion, so as to prevent it from being directly exposed to the outside.

An object of the present invention is to provide a camera module and array camera module with circuit board unit and photosensitive unit and manufacturing method thereof, wherein the circuit element is integrally enclosed, encapsulated and/or wrapped up in the encapsulation portion through a molding manufacturing process.

An object of the present invention is to provide a camera module and array camera module with circuit board unit and photosensitive unit and manufacturing method thereof, wherein the sensor of the photosensitive unit has a photosensitive portion and a non-photosensitive portion. The non-photosensitive portion of the sensor is molded by the encapsulation portion to reduce the size of the photosensitive unit and the assembled camera module.

An object of the present invention is to provide a camera module and array camera module with circuit board unit and photosensitive unit and manufacturing method thereof, wherein the main circuit board has at least an inner groove and the sensor of the photosensitive unit is installed in the inner groove, so as to reduce a height of the encapsulation portion as demanded.

An object of the present invention is to provide a camera module and array camera module with circuit board unit and photosensitive unit and manufacturing method thereof, wherein the encapsulation portion includes an enclosure section and an optical filter installation section, wherein the installation section is integrally connected with enclosure section by molding, wherein the installation section is adapted to install an optical filter so that no additional optical filter mounting frame is required.

An object of the present invention is to provide a camera module and array camera module with circuit board unit and photosensitive unit and manufacturing method thereof, wherein the photosensitive unit comprises at least an optical filter and the optical filter is molded on the sensor of the photosensitive unit so as to protect the sensor through the optical filter, wherein the back focal length of the camera module after assembled is reduced that further reduces the height of the camera module.

An object of the present invention is to provide a camera module and array camera module with circuit board unit and photosensitive unit and manufacturing method thereof, wherein the photosensitive unit comprises a reinforced layer, wherein the reinforced layer is overlappedly attached to a bottom side of the main circuit board so as to enhance a structural strength of the main circuit board, that allows the use of a thinner main circuit board while enhancing the thermal dissipation ability of the main circuit board.

An object of the present invention is to provide a camera module and array camera module with circuit board unit and photosensitive unit and manufacturing method thereof, wherein the main circuit board has at least a reinforced hole therein, wherein the encapsulation portion extends into the reinforced hole so as to enhance the bonding strength between the encapsulation portion and the photosensitive unit and increase the structural strength of the main circuit board.

An object of the present invention is to provide a camera module and array camera module with circuit board unit and photosensitive unit and manufacturing method thereof, wherein the encapsulation portion is adapted for mounting a motor or a camera lens thereon, functioning as a conventional frame that supports the motor or the camera lens in position. Besides, the encapsulation portion is molded to form and provide a better smoothness and evenness that substantially reduces the tilt deviation during the assembling of the camera module.

An object of the present invention is to provide a camera module and array camera module with circuit board unit and photosensitive unit and manufacturing method thereof, wherein the camera module is assembled and produced by molding that improves the conventional COB technique of the camera module.

An object of the present invention is to provide a camera module and array camera module with circuit board unit and photosensitive unit and manufacturing method thereof, wherein the photosensitive circuit unit is manufactured by molding, so that an integral and molded photosensitive unit is achieved.

An object of the present invention is to provide a camera module and array camera module with circuit board unit and photosensitive unit and manufacturing method thereof, wherein the circuit board unit includes a conjoined encapsulation portion and a circuit board portion. The conjoined encapsulation portion is encapsulated to form on the circuit board portion. The conjoined encapsulation portion is adapted for installing multiple camera lenses.

An object of the present invention is to provide a camera module and array camera module with circuit board unit and photosensitive unit and manufacturing method thereof, wherein the circuit board unit includes a main circuit board and at least one circuit element protruded from the main circuit board. The circuit elements are encapsulated and enclosed by the conjoined encapsulation portion so as to prevent them from being directly exposed to the outside.

An object of the present invention is to provide a camera module and array camera module with circuit unit and photosensitive unit and manufacturing method thereof, wherein the array camera module includes a plurality of photosensitive sensors and the conjoined encapsulation portion is deployed surrounding the outer edges of each of the photosensitive sensors.

An object of the present invention is to provide a camera module and array camera module with circuit unit and photosensitive unit and manufacturing method thereof, wherein the conjoined encapsulation portion includes an optical filter installing section that is adapted for installing a plurality of optical filters without the need of any extra independent supporting component.

An object of the present invention is to provide a camera module and array camera module with circuit unit and photosensitive unit and manufacturing method thereof, wherein the main circuit board has a plurality of inner grooves, wherein each photosensitive sensor is disposed in of the respective inner groove, that substantially reduces a relative height of the photosensitive sensor and the main circuit board, and thus the height demand to the conjoined encapsulation portion is reduced.

An object of the present invention is to provide a camera module and array camera module with circuit unit and photosensitive unit and manufacturing method thereof, wherein the main circuit board has a plurality of passages and a plurality of outer grooves communicating with the passages respectively, wherein each of the outer groove is adapted for installing the respective photosensitive sensor in an inversion manner.

An object of the present invention is to provide a camera module and array camera module with circuit unit and photosensitive unit and manufacturing method thereof, wherein the circuit board portion includes a reinforced layer overlappedly provided on the bottom of the main circuit board to enhance the structural strength and heat dissipation of the main circuit board.

An object of the present invention is to provide a camera module and array camera module with circuit unit and photosensitive unit and manufacturing method thereof, wherein the main circuit board has at least a reinforced aperture, wherein the conjoined encapsulation portion extends into the reinforced aperture to enhance the structural strength of the main circuit board.

An object of the present invention is to provide a camera module and array camera module with circuit unit and photosensitive unit and manufacturing method thereof, wherein the conjoined encapsulation portion includes an camera lens installing section provided as installation site for installing a plurality of camera lenses.

An object of the present invention is to provide a camera module and array camera module with circuit unit and photosensitive unit and manufacturing method thereof, wherein the photosensitive unit includes a conjoined encapsulation portion and a photosensitive portion. The photosensitive portion includes a main circuit board and a photosensitive sensor. The photosensitive sensor is molded to connect to the main circuit board by means of the conjoined encapsulation portion.

An object of the present invention is to provide a camera module and array camera module with circuit unit and photosensitive unit and manufacturing method thereof, wherein the photosensitive sensor is electrically connected to the main circuit board through at least one connecting element which is wrapped up and encapsulated by the conjoined encapsulation portion.

An object of the present invention is to provide an array camera module and its molded circuit unit and photosensitive unit and manufacturing method thereof, wherein the photosensitive sensor has a photosensitive area and a non-photosensitive area. The conjoined encapsulation portion is extended to the non-photosensitive area that inwardly extends the molding area of the conjoined encapsulation portion to cover the outer edges of the photosensitive unit.

An object of the present invention is to provide an array camera module with circuit unit and photosensitive unit and manufacturing method thereof, wherein the molded circuit unit includes a main circuit board and at least one circuit element. The circuit element protruded from the main circuit board is wrapped and encapsulated by the conjoined encapsulation portion, so as to avoid from being directly exposed to outside.

An object of the present invention is to provide an array camera module with circuit unit and photosensitive unit and manufacturing method thereof, wherein the conjoined encapsulation portion includes an optical filter installing section adapted for installing a plurality of optical filters without the need of any extra independent supporting part.

An object of the present invention is to provide an array camera module with circuit unit and photosensitive unit and manufacturing method thereof, wherein the main circuit board has a plurality of inner grooves, wherein each photosensitive sensor is disposed in the respective inner groove to reduce the relative height of the photosensitive sensor and the main circuit board, so as to meet the height reduction demand of the conjoined encapsulation portion.

An object of the present invention is to provide an array camera module with circuit unit and photosensitive unit and manufacturing method thereof, wherein the main circuit board has a plurality of passages and a plurality of outer grooves communicating with the passages respectively, wherein each of the outer grooves is adapted for installing the photosensitive sensor in an inversion manner.

An object of the present invention is to provide an array camera module with circuit unit and photosensitive unit and manufacturing method thereof, wherein the circuit board portion includes a reinforced layer overlappedly provided on the bottom of the main circuit board to enhance the structural strength and heat dissipation of the main circuit board.

An object of the present invention is to provide an array camera module with circuit unit and photosensitive unit and manufacturing method thereof, wherein the main circuit board has at least a reinforced aperture, wherein the conjoined encapsulation portion is extended into the reinforced aperture to enhance the structural strength of the main circuit board.

An object of the present invention is to provide an array camera module with circuit unit and photosensitive unit and manufacturing method thereof, wherein the conjoined encapsulation portion includes a camera lens installing section providing one or more installation sites adapted for installing a plurality of camera lenses respectively.

In order to achieve the above objects and other objects and advantages of the present invention, the present invention, from an aspect, provides a camera module which includes a camera lens and a photosensitive unit, wherein the photosensitive unit includes an encapsulation portion and a photosensitive portion. The photosensitive portion includes a main circuit board and a photosensitive sensor. The encapsulation portion is encapsulated to form on the main circuit board and surround the photosensitive sensor. The camera lens is installed along a photosensitive path of the photosensitive sensor.

According to a preferred embodiment of the present invention, the encapsulation portion of the camera module has a window corresponding to the photosensitive sensor so as to provide the photosensitive sensor a light path thereof.

According to a preferred embodiment of the present invention, a top portion of the encapsulation portion is adapted for installing the frame, optical filter, camera lens or motor of the camera module.

According to a preferred embodiment of the present invention, the photosensitive portion of the camera module comprises at least one connecting element. Each connecting element electrically connects the photosensitive sensor with the main circuit board. The encapsulation portion wraps up and encloses the connecting element to avoid the connecting element from being directly exposed to outside.

According to a preferred embodiment of the present invention, the photosensitive sensor of the camera module includes a photosensitive area and a non-photosensitive area, wherein the non-photosensitive area is positioned around the periphery of the photosensitive area. The encapsulation portion is molded to extend to the non-photosensitive area of the photosensitive sensor to inwardly expand the molding area to reduce an overall dimension of the encapsulation portion.

According to a preferred embodiment of the present invention, the photosensitive portion in the camera module comprises at least one circuit element protruded from the main circuit board. The encapsulation portion encapsulates and wraps up the circuit element to prevent the circuit element from being directly exposed to outside.

According to a preferred embodiment of the present invention, the photosensitive portion in the camera module comprises an optical filter covering the photosensitive sensor. The encapsulation portion is encapsulated to form on the main circuit board and surround the photosensitive sensor and the optical filter, so as to protect the photosensitive sensor with the optical filter and reduce a back focal length and a height of the camera module.

Another aspect of the present invention provides an array camera module, which comprises at least two camera lenses and a circuit unit, wherein the circuit unit comprises a circuit board portion for electrically connecting at least two photosensitive sensors of the array camera module and a conjoined encapsulation portion integrally encapsulated at the circuit board portion, wherein the camera lenses are respectively arranged along photosensitive paths of the photosensitive sensors.

According to a preferred embodiment of the present invention, the encapsulation portion of the array camera module has at least two windows formed corresponding to the at least two photosensitive sensors respectively, so as to provide light paths for the photosensitive sensors.

According to a preferred embodiment of the present invention, the circuit board portion in the array camera module comprises at least one circuit element protruded from the main circuit board. The conjoined encapsulation portion encapsulates and wraps up the circuit element to prevent the circuit element from being directly exposed to outside.

According to a preferred embodiment of the present invention, the circuit unit of the array camera module comprises at least two motor connecting structures, each of which comprises a lead wire. The lead wire is disposed in the conjoined encapsulation portion and electrically connected with the main circuit board. The lead wire comprises a motor coupling end revealed on the conjoined encapsulation portion for connecting a motor terminal.

According to a preferred embodiment of the present invention, the circuit unit of the array camera module comprises at least two motor connecting structures, each of which comprises a lead wire and a terminal slot. The lead wire is arranged on the conjoined encapsulation portion and electrically connected with the main circuit board. The terminal slot is provided in a top portion of the conjoined encapsulation portion. The lead wire comprises a motor coupling end wiring on a bottom wall of the terminal slot, so as to allow a motor terminal to electrically connect with the motor coupling end when the motor terminal is inserted in the terminal slot.

According to a preferred embodiment of the present invention, the circuit unit of the array camera module comprises at least two motor connecting structures, each of which comprises a terminal slot and a circuit junction. The circuit junction is electrically connected with the main circuit board. The terminal slot is provided in the conjoined encapsulation portion and extended from the main circuit board to the top of the conjoined encapsulation portion. The circuit junction is revealed at the terminal slot so as to allow a motor terminal to electrically connect with the circuit junction when the motor terminal is inserted in the terminal slot.

According to a preferred embodiment of the present invention, the circuit unit of the array camera module comprises at least two motor connecting structures, each of which comprises a carving line. The carving line is provided on the conjoined encapsulation portion and electrically connected with the main circuit board for electrically connecting a motor terminal.

Another aspect of the present invention provides an array camera module which includes at least two camera lenses and a photosensitive unit, wherein the photosensitive unit includes a conjoined encapsulation portion and a photosensitive portion. The photosensitive portion includes a main circuit board and at least two photosensitive sensors. The conjoined encapsulation portion integrally encapsulates the main circuit board and surrounds each photosensitive sensor. The camera lenses are respectively deployed along photosensitive paths of the photosensitive sensors.

According to a preferred embodiment of the present invention, the encapsulation portion of the array camera module has at least two windows provided corresponding to the at least two photosensitive sensors, so as to provide light paths for the photosensitive sensors.

According to a preferred embodiment of the present invention, the photosensitive portion comprises at least one connecting element in the array camera module. Each of the connecting elements electrically connects the photosensitive sensor with the main circuit board. The conjoined encapsulation portion encapsulates and wraps up the connecting element to avoid it from being directly exposed to outside.

According to a preferred embodiment of the present invention, the photosensitive sensor of the camera module includes a photosensitive area and a non-photosensitive area, wherein the non-photosensitive area is positioned around the periphery of the photosensitive area. The conjoined encapsulation portion is molded to extend to the non-photosensitive area of the photosensitive sensor so as to expand the molding area of the conjoined encapsulation portion inwardly to reduce the overall dimension of the conjoined encapsulation portion.

According to a preferred embodiment of the present invention, the photosensitive portion in the array camera module comprises at least one circuit element protruded from the main circuit board. The conjoined encapsulation portion encapsulates and wraps up the circuit element to prevent the circuit element from being directly exposed to outside.

According to a preferred embodiment of the present invention, the photosensitive unit of the array camera module includes at least two optical filters, wherein the optical filters are integrally encapsulated with the photosensitive sensors respectively.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
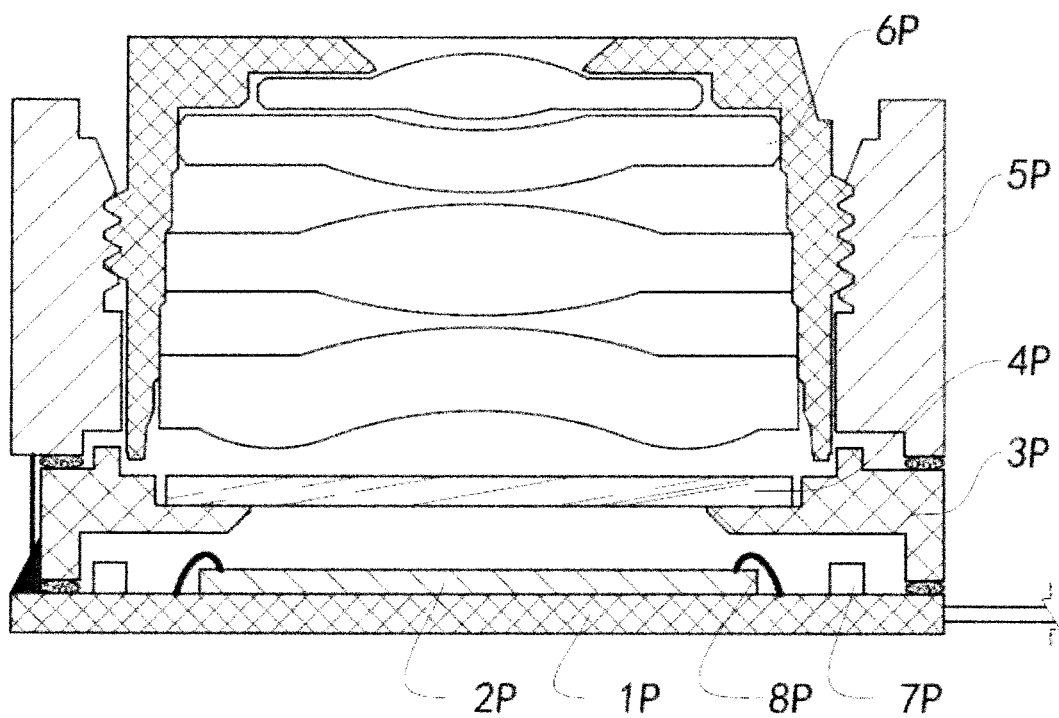
FIG. 1 is a sectional view illustrates the conventional COB technique of camera module.
Figure 2:
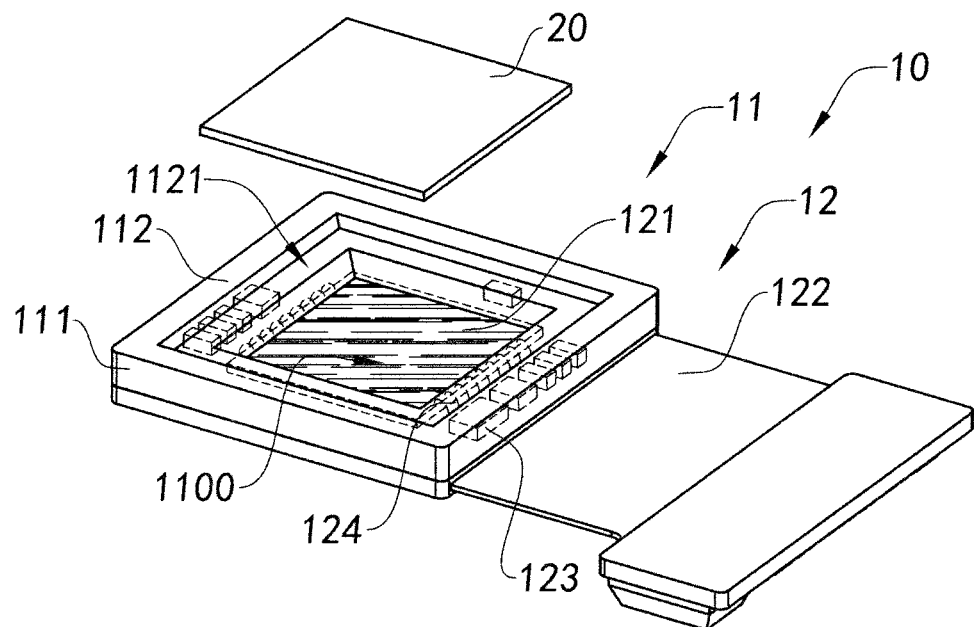
FIG. 2 is a perspective view of a photosensitive unit according to a first preferred embodiment of the present invention.
Figure 3:
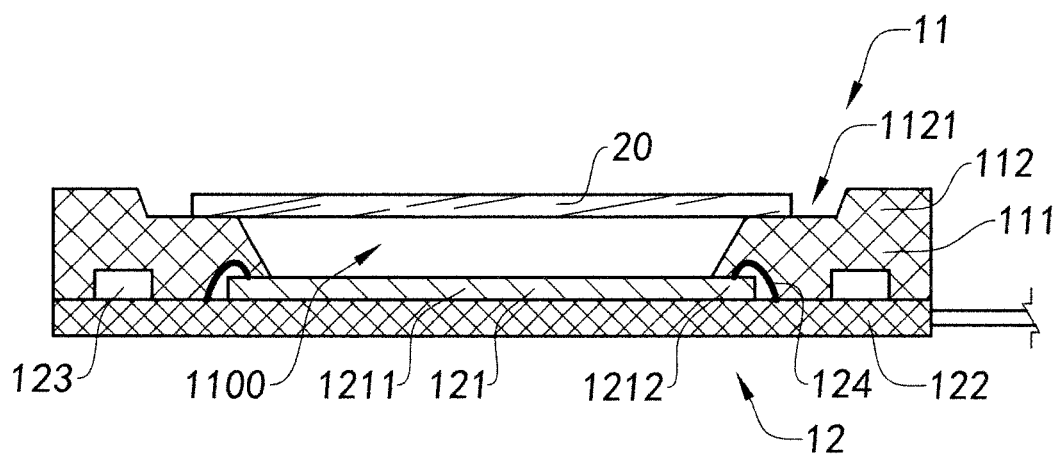
FIG. 3 is a sectional view of a photosensitive unit according to the above first preferred embodiment of the present invention.
Figure 4:
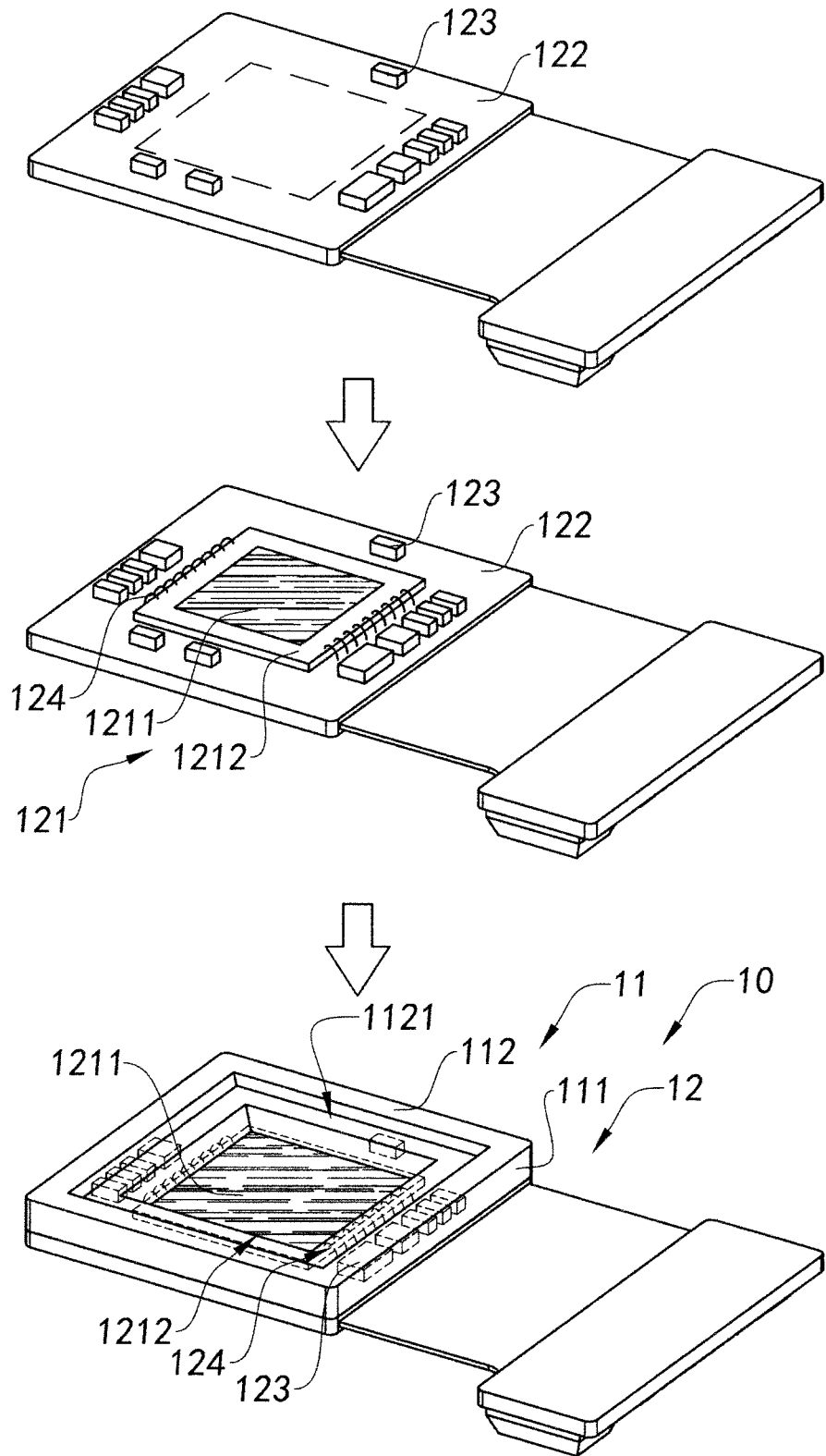
FIG. 4 is a manufacturing process diagram of a photosensitive unit according to the above first preferred embodiment of the present invention.
Figure 5:
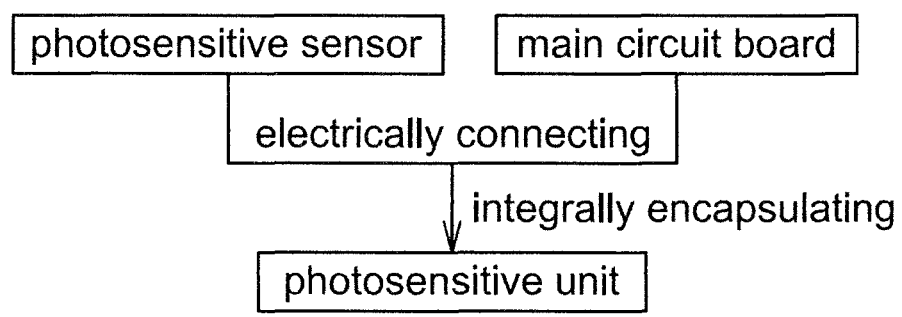
FIG. 5 is a block diagram of a photosensitive unit according to the above first preferred embodiment of the present invention.
Figure 6:
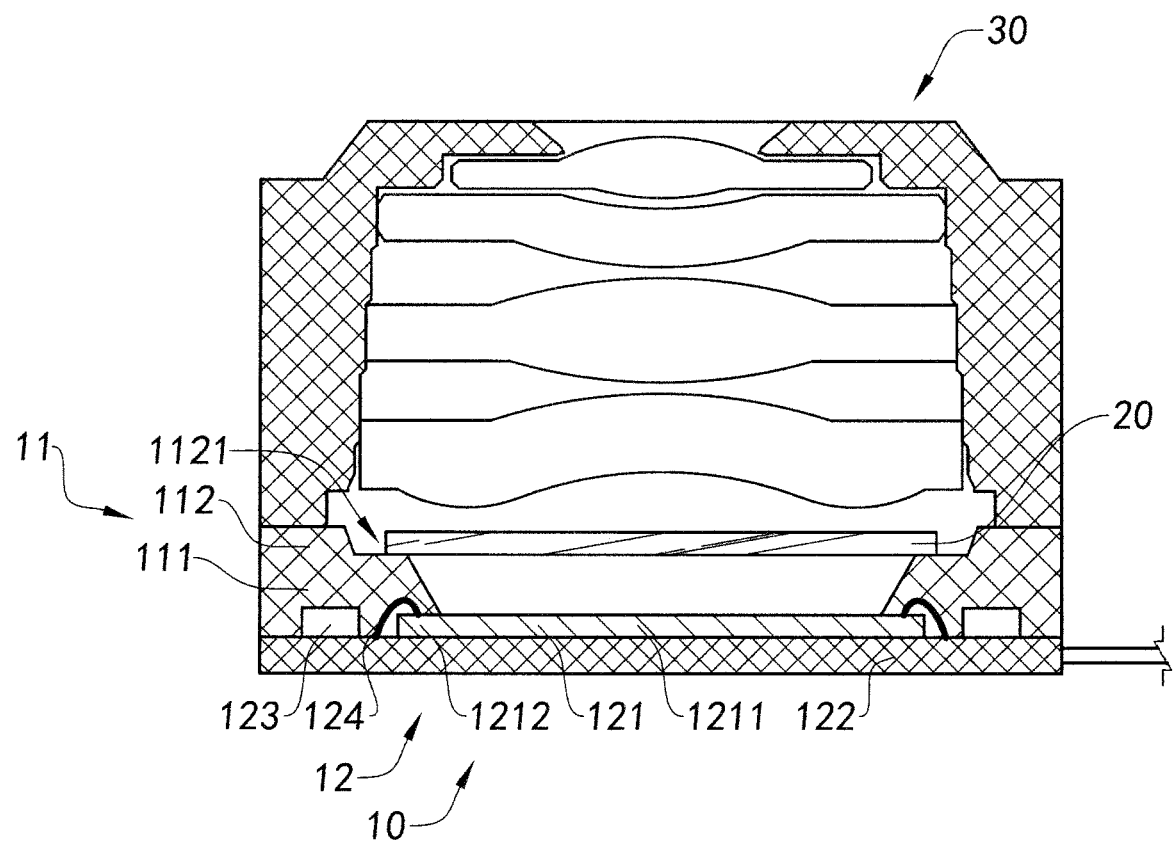
FIG. 6 is a sectional view of the camera module according to the above first preferred embodiment of the present invention.
Figure 7:
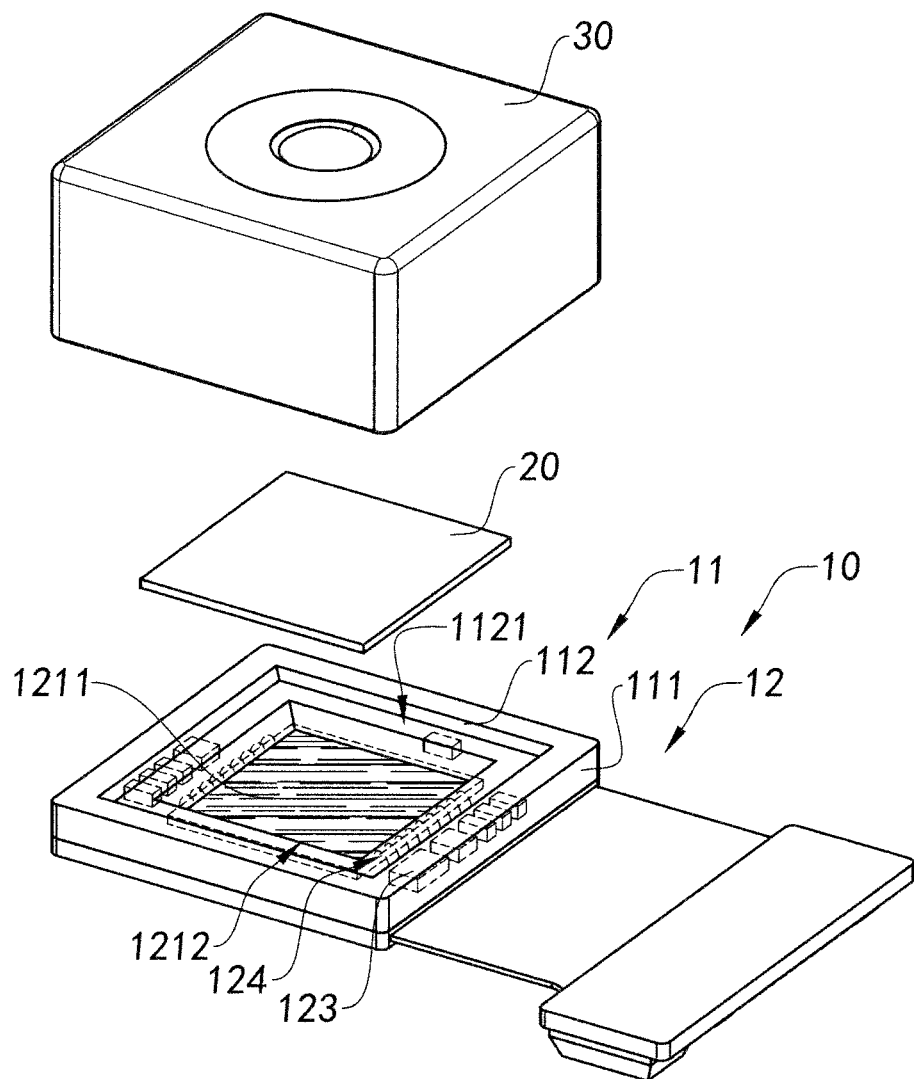
FIG. 7 is an exploded perspective view of the camera module according to the above first preferred embodiment of the present invention.
Figure 8:
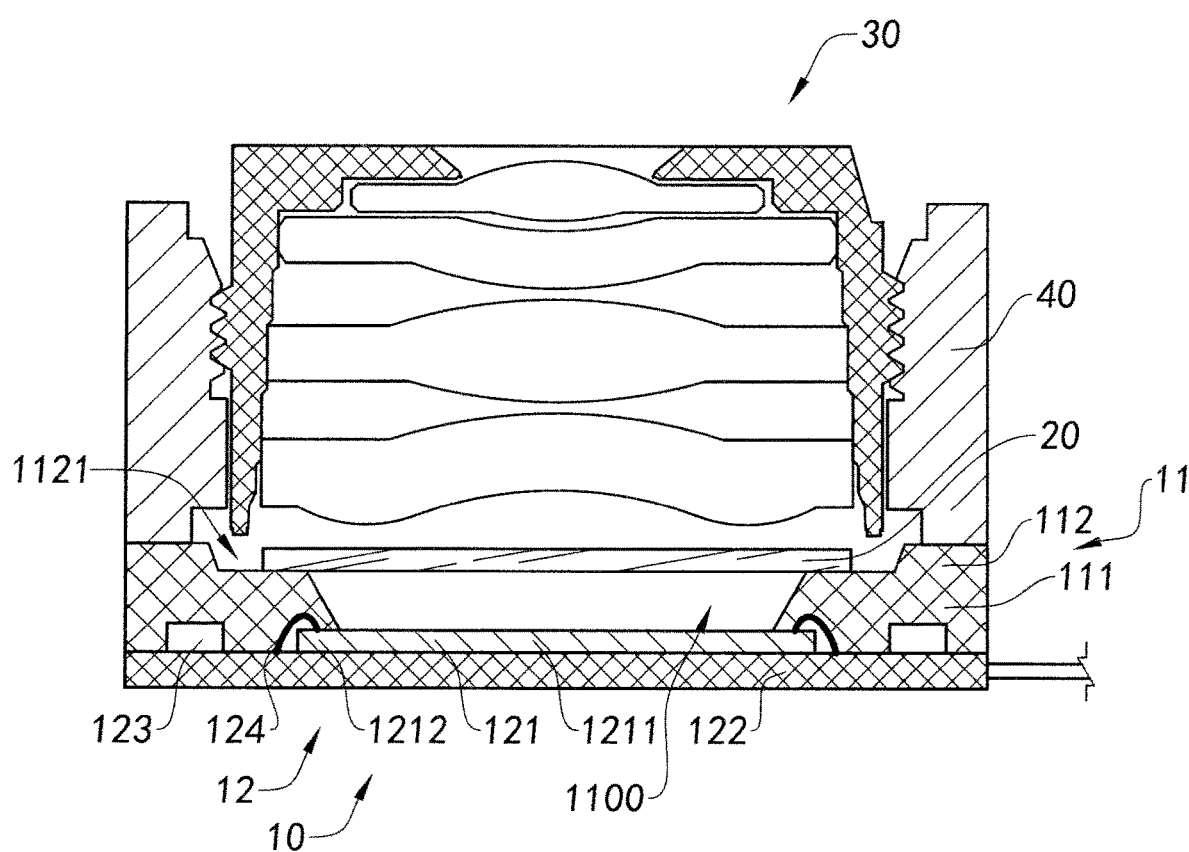
FIG. 8 is a sectional view of the camera module according to a first alternative mode of the above first preferred embodiment of the present invention.
Figure 9:
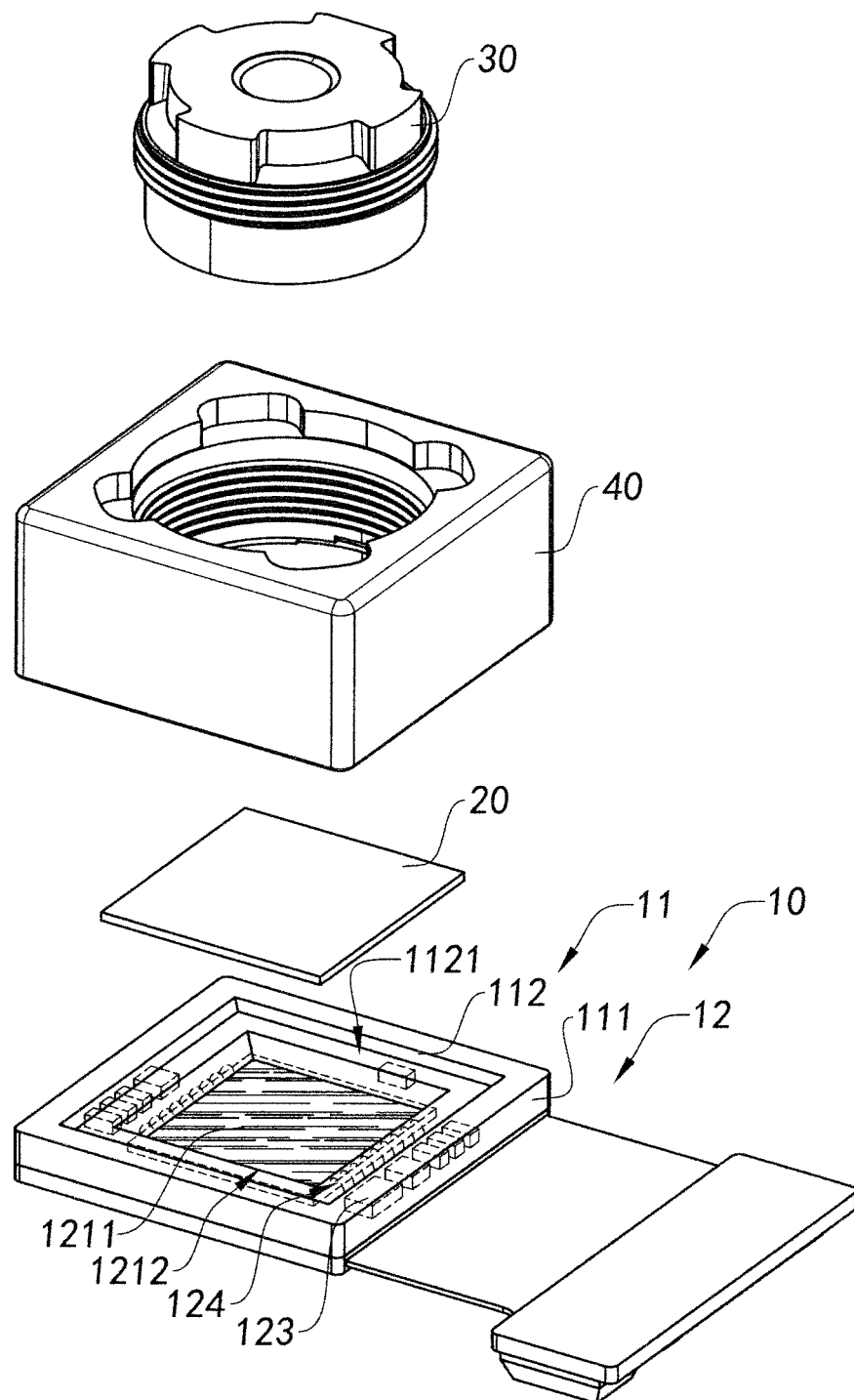
FIG. 9 is an exploded perspective view of the camera module according to the above alternative mode of the first preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Those skilled in the art should understand that in the disclosure of the present invention, terms such as "longitudinal," "lateral," "upper," "lower," "front," "back," "left," "right," "perpendicular," "horizontal," "top," "bottom," "inner," "outer," etc., which indicate directions or positional relations are based on the directions or positional relations demonstrated in the figures and only to better describe the present invention and simplify the description, rather than to indicate or imply that the indicated device or element must be applied to a specific direction or be operated or constructed in a specific direction. Therefore, these terms shall not be considered limits of the present invention.

Referring to FIGS. 2 to 7, a camera module and its photosensitive unit are illustrated according to a first preferred embodiment of the present invention. The photosensitive unit 10 is for assembling and producing the camera module. The photosensitive unit 10 includes an encapsulation portion 11 and a photosensitive portion 12, wherein the encapsulation portion 11 is integrally encapsulated and connected to the photosensitive portion 12, such as being molded to connect to the photosensitive portion 12.

The photosensitive portion 12 includes a main circuit board 122 and a photosensitive sensor 121, wherein the photosensitive sensor 121 is disposed on the main circuit board 122. Particularly, according to the present preferred embodiment of the present invention, the encapsulation portion 11 is molded on the photosensitive portion 12 with a technique like, but not limited to, the Molding on Chip (MOC) technique for molding a chip.

According to the present embodiment of the present invention, the photosensitive portion 12 includes a connecting circuit (not shown in the figures) and at least a circuit element 123. The connecting circuit is prearranged in the main circuit board 122 and the circuit element 123 is electrically connected to the connecting circuit and the photosensitive sensor 121 to process the photosensing function for the photosensitive sensor 121. The circuit element 123 is protrudedly deployed on the main circuit board 122. The circuit element 123 can be, for example but not limited to, resistors, capacitors, diodes, triodes, potentiometers, electric relays, or actuators.

It is worth mentioning that the encapsulation portion 11 encapsulates and wraps up the circuit element 123 therein, so that the circuit element 123 will not be directly exposed in any space, and more specifically, not be exposed in the environment that communicates with the photosensitive sensor 121. Therefore, during the assembling of the camera module, the circuit element 123 will not be contaminated with contaminants, such as dusts, and influence the photosensitive sensor 121, that is different from the arrangement of conventional camera module that the circuit components, such as resistance-capacitance components, are exposed to outside. So that by means of such molding encapsulation, sundries and dusts are prevented from staying on the surface of the circuit element 123 to avoid the photosensitive sensor 121 from being contaminated thereby that would result in dark spots and other defectives of the camera module.

It is worth mentioning that, in the present embodiment of the present invention, the circuit element 123 is recited as protruded on the main circuit board 122 as an example for the description, whereas in other embodiments of the present invention, the circuit element 123 can also be embedded in the main circuit board 123 without protruding from the main circuit board. Person skilled in the art should understand that the shape, type, and mounting position of the circuit element 123 should not limit the present invention.

The encapsulation portion 11 has a through hole window 1100 formed therein to provide a photosensitive path for the photosensitive sensor 121.

According to the present preferred embodiment of the present invention, the photosensitive portion 12 includes at least one connecting element 124 for electrically connecting the photosensitive sensor 121 with the main circuit board 122. Further, each of the connecting elements 124 can be embodied to be, specifically but not limited to, gold wire, copper wire, aluminum wire, and/or silver wire. In addition, the connecting elements 124 can curvingly connect the photosensitive sensor 121 with the main circuit board 122.

It is worth mentioning that each connecting element 124 is molded inside the encapsulation portion 11, so as to enclose, encapsulate and/or wrap up each of the connecting elements 124 by the encapsulation portion 11 to keep them from direct exposure to outside. Therefore, during the assembling of the camera module, the connecting element(s) 124 will not receive any collision and damage, and, at the same time, it reduces the adverse effect of the connecting element(s) 124 due to the environmental factors, such as temperature, so as to ensure a stable communication and connection between the photosensitive sensor 121 and the main circuit board 122. This is completely different from the conventional art.

Preferably, the window 1100 of the encapsulation portion 11 enlarges its size from a bottom thereof upwardly and gradually, having a smaller bottom size and a larger top size, to form an inclined shape slope side. Nonetheless, such inclined shape shall not be considered as a limitation to the present invention.

It is worth mentioning that the encapsulation portion 11 substantially covers and encloses, encapsulates and/or wraps up the circuit element 123 and the connecting element 124 that advantages in protecting the circuit element 123 and the connecting element 124 as well as in achieving a higher performance camera module. However, those skilled in the art should understand that the encapsulation portion 11 shall not be limited in wrapping up the circuit element 123 and/or the connecting element 124. In other words, in other embodiments of the present invention, the encapsulation portion 11 can be directly molded on the main circuit board 122 without circuit element 123 protruded thereon or be molded on various positions, such as the outer side portion and the periphery, of the circuit element 123.

In addition, the photosensitive sensor 121 has a photosensitive area 1211 and a non-photosensitive area 1212, wherein the non-photosensitive area 1212 is positioned around the periphery of the photosensitive area 1211. The photosensitive area 1211 is for conducting photosensitive function and process. The connecting element 124 is connected to the non-photosensitive area 1212.

According to this preferred embodiment of the present invention, the encapsulation portion 11 is extended to the non-photosensitive area 1212 of the photosensitive sensor 121, so as to overlappedly affix the photosensitive sensor 121 on the main circuit board 122 by means of molding. In this manner, such as the method of Molding on Chip (MOC), the molding area of the encapsulation portion 11 can be extended inwardly, so that the outer structural portions of the encapsulation portion 11 and the main circuit board 122 can be reduced, which further reduces the size in length and width of the photosensitive unit 10 as well as the size in length and width of the camera module assembled thereby.

In the present embodiment of the present invention, the encapsulation portion 11 is protrudingly formed to surround the outer portion of the photosensitive area 1211 of the photosensitive sensor 121. Particularly, the encapsulation portion 11 has an integral enclosure connection, providing good sealing ability and tightness, so that, when the photosensitive unit 10 is used to assemble the camera module, the photosensitive sensor 121 can be sealed inside the encapsulation portion 11 that forms a sealed interior space.

Practically, to produce the photosensitive unit 10, a conventional circuit board can be used to produce the main circuit board 122, wherein a photosensitive sensor 121 is provided on the main circuit board 122 and electrically connected by the connecting elements 124. And then, the assembled main circuit board 122 with photosensitive sensor 121 affixed thereon are molded by means of, for example, the compression molding technique that is commonly applied in semiconductor packaging industry, to form the encapsulation portion 11. Alternatively, the main circuit board 122 can be molded by means of insert molding technique by an injection molding machine to mold the main circuit board 122 which has been processed by a surface mount technology (SMT) to form the encapsulation portion 11. The main circuit board 122 can selectively be, for example but not limited to, rigid-flex circuit board, ceramic substrate circuit board (without flexible board), rigid PCB (without flexible board), and etc. The methods of forming the encapsulation portion 11 can be selected from, for example but not limited to, injection molding technique, pressing molding technique, and etc. The material of the encapsulation portion 11 can be, for example but not limited to, nylon, liquid crystal polymer (LCP), polypropylene (PP), and etc., for injection molding technique, and resin for pressing molding technique. Those skilled in the art should understand that the above available production methods and available materials are examples to describe available implementations of the present invention, rather than limitations of the present invention.

It is worth mentioning that according to the molding formation method of the photosensitive unit 10 of the present invention, the molded photosensitive unit 10 is suitable for making in form of combined board that can produce photosensitive units 10 as many as 90 pieces, for example, at the same time, while the conventional circuit board structure can merely be produced 8 pieces at one time.

Furthermore, the encapsulation portion 11 includes a covering section 111 and an optical filter installing section 112. The optical filter installing section 112 is integrally molded to connect with the covering section 111. The covering section 111 is molded to mount on the main circuit board 122 to encapsulate, wrap up and/or enclose the circuit element(s) 123 and the connecting element(s) 124. The optical filter installing section 112 is configured for installing the optical filter 40. In other words, when the photosensitive unit 10 is used for assembling the camera module, the optical filter 40 of the camera module is mounted at the optical filter installing section 112 to ensure the optical filter 40 be deployed along a photosensitive path of the photosensitive sensor 121 and does not require any additional mounting frame for installing the optical filter. In other words, the encapsulation portion 11 itself also provides the function as a conventional mounting frame and, in addition, according to the advantage of molding technique, the top of the optical filter installing section 112 would have good evenness and smoothness due to the molding technique, so as to allow the optical filter 40 to be installed in an even and flat manner that is more superior to the conventional camera modules. Particularly, the optical filter 40 can be an Infra-Red-Cut Filter (IRCF).

In addition, the optical filter installing section 112 has an installing groove 1121. The installing groove 1211 is communicated with the window 1100 to provide an adequate installation space for the optical filter 40 such that the optical filter 40 will not protrude from the top surface of the camera lens installing section 112. In other words, the installing groove 1121 is provided on top of the encapsulation portion 11 for the optical filter 40 to be installed therein.

It is worth mentioning that, in the present embodiment of the present invention, the installing groove 1121 can be used for the installation of the optical filter, whereas in other embodiments of the present invention, the installing groove 1121 can be used for the installation of other component, such as the camera lens, motor of the camera module, or etc. Person skilled in the art should understand that the use of the installing groove shall not consider as a limitation of the present invention.

It is worth mentioning that the inner wall of the encapsulation portion 11 is designed according to the shape to be mounted thereon. For example, it can be in sloped or inclined shape, so that while it encapsulates and wraps up the connecting element(s) 124, the photosensitive sensor 121 is capable of receiving as much light as possible. Person skilled in the art should understand that a specific shape of the encapsulation portion 11 will not limit the scope of the present invention.

Referring to FIGS. 2 to 7, according to a first preferred embodiment of the present invention, the camera module can be a fixed focus module (FFM). Such camera module includes one the photosensitive unit 10, one the optical filter 20, and one the camera lens 30.

The optical filter 20 and the camera lens 30 are mounted at the photosensitive unit 10.

More specifically, the optical filter 20 is mounted in the installing groove 1121 of the optical filter installing section 112 of the encapsulation portion 11 of the photosensitive unit 10. The camera lens 40 is mounted at a top portion of the optical filter installing section 112 of the encapsulation portion 11 of the photosensitive unit 10. In other words, the optical filter 20 is mounted in the installing groove, while the camera lens 40 is mounted on top of the encapsulation portion 11.

It is also worth mentioning that the camera lens 30 is supported on top of the optical filter installing section 112 of the encapsulation portion 11 of the photosensitive unit 10. Therefore, the encapsulation portion 11 functions as the frame of a conventional camera module to provide a supportive and holding site for the camera lens 30, but it is assembled by a different process from the process of the conventional COB technology.

The conventional frame of a conventional camera module assembled based on the conventional COB technique is glued to affix on the circuit board by adhesive, but the encapsulation portion 11 is molded to encapsulate and wrap up the main circuit board 122 by means of the molding technique without the requirement of any adhering and affixing process. With respect to the process of adhering and affixing, the molding process provides better connection stability and controllability thereof. Besides, it does not have to reserve adhering space for AA adjustment between the encapsulation portion 11 and the main circuit board 122 according to the present invention, and thus it saves the adhering space for AA adjustment of the conventional camera module. Accordingly, under the same achievement in structural strength with respect to the conventional camera module, the molded main circuit board 122 according to the molding technology of the present invention has a thinner thickness. The thickness of the molded main circuit 122 can be further reduced when the optical filter 20 is directly attached on the molded surface that enables a shorter back focal length of the camera lens 30, so as to further reduce the thickness of the camera module. On the other hand, the encapsulation and enclosure of the circuit elements 123 and the connecting elements 124 by the encapsulation portion 11 allows the supporting feature of conventional frame being provided overlappedly with the circuit elements 123 and the connecting element 124 spatially to save space, without the need of the conventional camera module that requires to reserve a safe distance around the circuit components. As a result, the height of the encapsulation portion 11 can be configured in a smaller range while providing its supporting function and feature, so as to provide a room of further reduction of the thickness of the camera module. Besides, the encapsulation portion 11 substitutes the conventional frame that prevents any tilt deviation occurred in adhering and assembling such conventional frame that reduces the accumulated tolerance of the assemble of the camera module. In addition, the encapsulation and wrapping up of the connecting element(s) 124 by the encapsulation portion 11 and the inner extension of the encapsulation portion 11 towards the non-photosensitive area 1212 of the photosensitive sensor 121 enables the size of the encapsulation portion 11 can be shrunk inwardly, so as to further decrease the lateral sizes in length and width of the camera module.

Referring to FIGS. 2, 3, 5, 8, and 9, another camera module according to the above first preferred embodiment of the present invention is illustrated. The camera module can be an Automatic Focus Camera Module (AFCM). Such camera module includes one the photosensitive unit 10, one the optical filter 20, one motor unit 40, and one the camera lens 30.

The optical filter 20 is installed at the photosensitive unit 10, while the camera lens 30 is installed at the motor unit 40 and the motor 60 is installed at the photosensitive unit (molded circuit unit) 10.

Furthermore, the optical filter 20 is mounted in the installing groove 1121 of the optical filter installing section 112 of the encapsulation portion 11 of the photosensitive unit 10. The motor unit 40 is mounted on top of the optical filter installing section 112 of the encapsulation portion 11 of the photosensitive unit 10. In other words, the optical filter 20 is mounted in the installing groove of the encapsulation portion 11, while the camera lens 30 is installed in the motor unit 40. The motor unit 40 is mounted on top of the encapsulation portion 11.

Those skilled in the art should understand that the structures and forms of the camera module mentioned above are just examples to describe ways of implementing the camera module, rather than limitations of the present invention.

Figure 10:
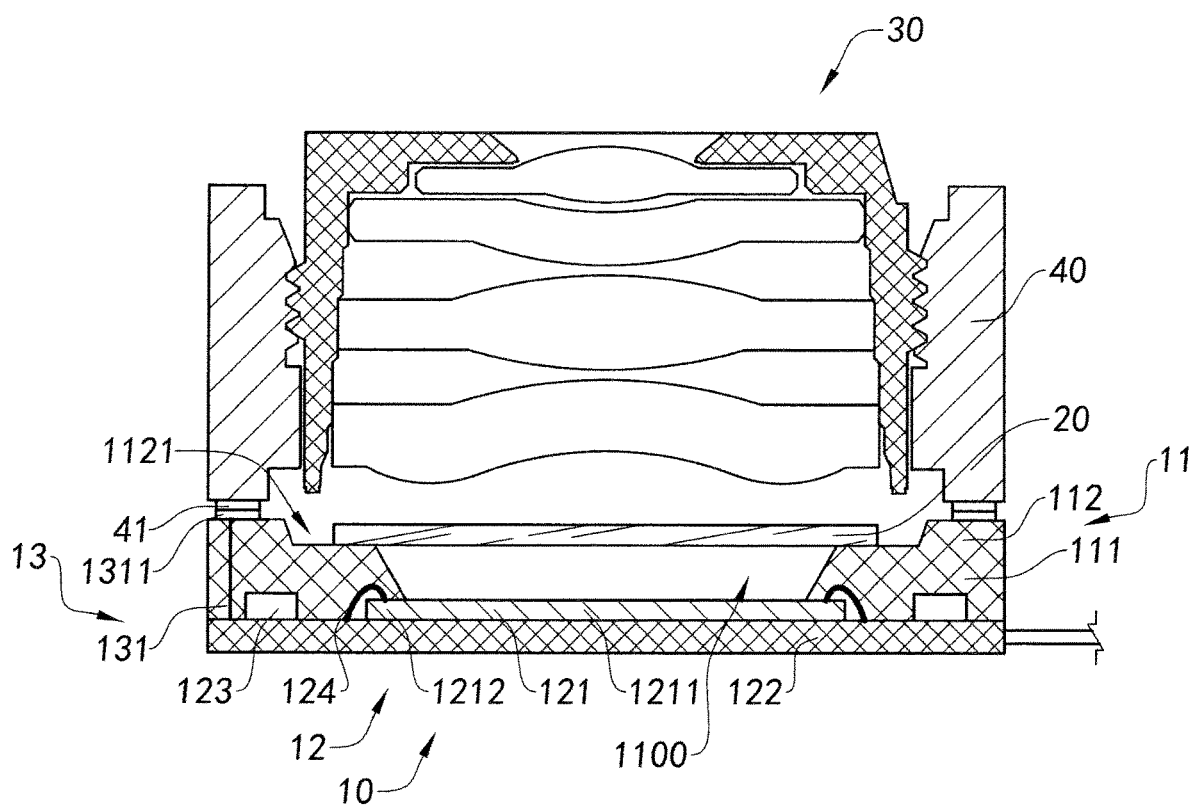
FIG. 10 is a sectional view of a camera module according to a second preferred embodiment of the present invention.

FIG. 10 illustrates a photosensitive unit and camera module according to a second preferred embodiment of the present invention.

According to the present second preferred embodiment of the present invention, the photosensitive unit 10 includes a motor connecting structure 13 for connecting to a motor unit 40 of the camera module. The motor unit 40 has at least one motor terminal 41. The motor connecting structure 13 includes at least one lead element 131, wherein each the lead element 131 is connected to the motor unit 40 and the main circuit board 122. Each of the lead elements 131 is electrically connected to the main circuit board 122. Further, the lead element 131 is electrically connected to the connecting circuit of the main circuit board 122. The lead element 131 is deployed in the encapsulation portion 11 and extended to the top of the encapsulation portion 11. The lead element 131 includes at least a motor coupling terminal 1311 exposed on top of the encapsulation portion 11 for being electrically connected to the motor terminal 41 of the motor unit 40. It is worth mentioning that the lead element 131 can be deployed by embedding during the molding formation of the encapsulation portion 11. In the conventional way of connection, component like driving motor is connected to the circuit board through individually arranged lead wires, which involve relatively complicated manufacture technique. However, according to the present invention, the embedding of the lead element 114 in the molding process not only can substitute the conventional motor soldering process, but also can provide a more stable electrical circuit connection. Particularly, in one preferred embodiment of the present invention, the lead element 131 is a conductor being embedded inside the encapsulation portion 11. For example, the motor terminal 41 can be connected to the motor coupling terminal 1311 with anisotropic conductive film or by welding and soldering.

It is worth mentioning that the embedding position of the lead element 131 and the revealing position of the motor coupling terminal 1311 of the lead element 131 in the encapsulation portion 11 may be arranged based on the needs. For instance, in one preferred embodiment of the present invention, the motor coupling terminal 1311 of the lead element 131 can be deployed on the periphery of the encapsulation portion 11, that is the top surface of the encapsulation portion 11 and the top surface of the optical filter installing section 112. However, in an alternative mode of the embodiment of the present invention, the motor coupling terminal 1311 can be deployed on the inner side of the encapsulation portion 11, that is the bottom side of the installing groove 121 of the encapsulation portion 11. Therefore, there may be various installation sites provided for the motor unit 40. In other words, when the motor unit 40 has to be installed on top of the encapsulation portion 11, the motor coupling terminal 1311 will be provided on the top surface of the outer side of the encapsulation portion. When the motor unit 40 has to be installed in the installing groove 121, the motor coupling terminal 1311 can be provided on the inner side of the encapsulation portion 11, that is the bottom of the installing groove 121.

In other words, when producing the photosensitive unit 10, firstly the photosensitive sensor 121 is attached in position, and then the encapsulation portion 11 is molded on the main circuit board 122 with the photosensitive sensor 121 attached thereon by means of such as the MOC technology. At the same time, the lead element(s) 131 can be embedded inside the encapsulation portion 11 during the molding while electrically connecting the lead element(s) 131 with the main circuit board 122 and revealing the motor coupling terminal(s) 1311 of the lead element(s) 131 on top of the encapsulation portion 11 for connecting with the motor terminal(s) 41 of the motor unit 40. For example, when the photosensitive unit 10 is used to assemble the camera module, each motor terminal 41 of the motor unit 40 is connected to the motor coupling terminal 1311 of the lead element 131 by welding or soldering so as to electrically connect the motor unit 40 with the main circuit board 122. An independent lead element can be deployed to connect the motor unit 40 with the main circuit board 122 to allow a length of the motor terminal 41 of the motor unit 40 to be shortened.

It is worth mentioning that the embedding position of the lead element(s) 131 can be configured based on the needs. For example, in one preferred embodiment of the present invention, the embedding position can be configured inside the encapsulation portion 11 to hide the lead element 131(*s*). In an alternative mode, the embedding position can be configured on the surface of the encapsulation portion 11. Person skilled in the art should understand that position of the lead element 131 shall not limit the scope of the present invention.

Especially, when the motor terminal 41 is affixed on the circuit junction by attaching with conducting adhesive, it does not require to solder any lead wire for connecting the motor unit 40 with the main circuit board 122 of the photosensitive portion 12, and thus it reduces the motor soldering process.

Figure 11A:
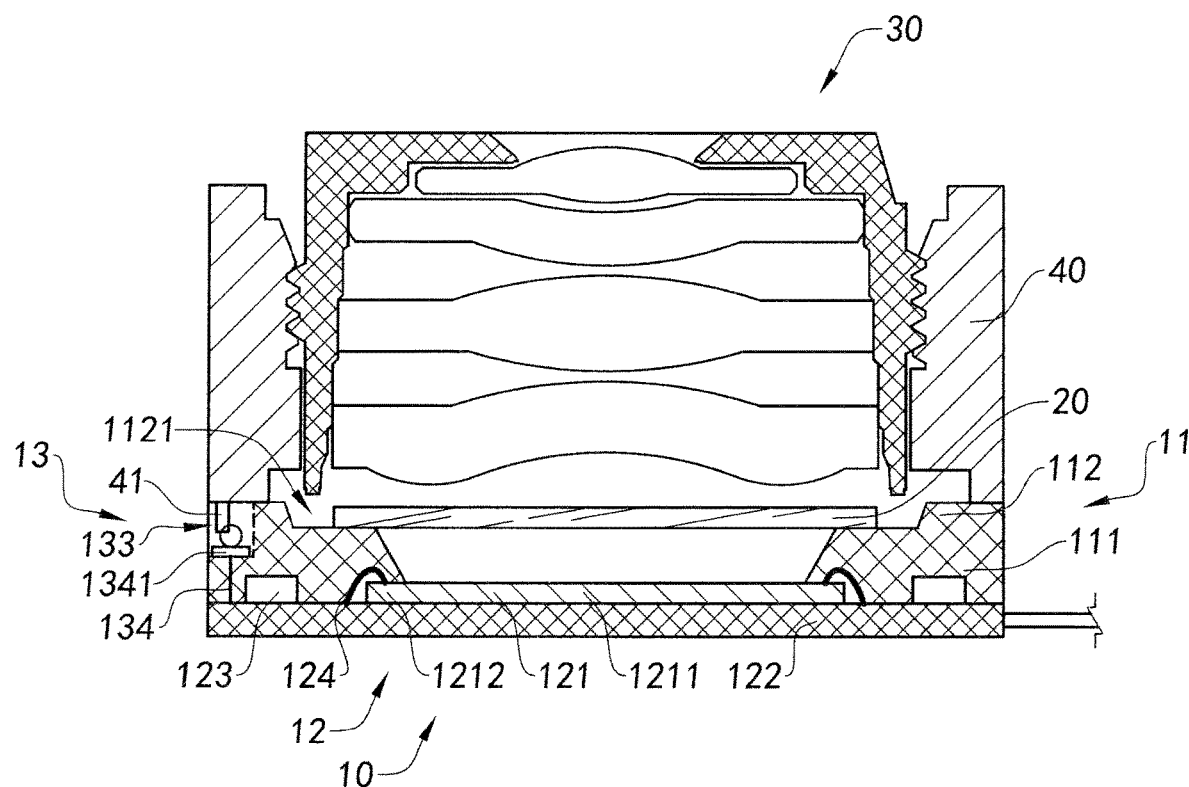
FIGS. 11A and 11B are sectional views of different alternative modes of the connecting structure of the photosensitive unit according to the above second preferred embodiment of the present invention.

FIG. 11A illustrates an equivalent embodiment of the motor connecting structure of the above preferred embodiment of the present invention. The motor connecting structure 13 includes at least one terminal slot 133. The terminal slot 133 is for accommodating the motor terminal 41 of the motor unit 40 of the camera module. The terminal slot 133 is deployed on top of the encapsulation portion 11. The motor connecting structure 13 includes at least one lead element 134, wherein each the lead element 134 is to electrically connect the motor unit 40 with the main circuit board 122. The lead element 134 is arranged in the encapsulation portion 11 and upwardly extended to the bottom wall of the terminal slot 133 of the encapsulation portion 11. The lead element 134 includes a motor coupling terminal 1341 exposed on the bottom wall of the terminal slot 133 of the encapsulation portion 11 for being electrically connected to the motor terminal 41 of the motor unit 40. Particularly, in an implementation, the motor coupling terminal 1341 can be embodied as a pad. The lead element 134 can be embodied as a conductor embedded inside the encapsulation portion 11.

In other words, when producing the photosensitive unit 10, in one embodiment, the photosensitive sensor 121 is firstly adhered to the main circuit board 122, and then the encapsulation portion 11 is molded on the main circuit board 122 and the photosensitive sensor 121 by means of the MOC technology, wherein the terminal slot 133 with predetermined length is provided in the encapsulation portion 11 to embed the lead element 134 therein during the molding process, while the lead element 134 is electrically connected with the main circuit board 122 and the motor coupling terminal 1341 of the lead element 134 is revealed on the bottom wall of the terminal slot 133 of the encapsulation portion 11 for connecting with the motor terminal 41 of the motor unit 40. For example, when the photosensitive unit 10 is used to assemble the camera module, each motor terminal 41 of the motor unit 40 is inserted into the terminal slot 133 and connected to the motor coupling terminal 1341 of the lead element 134 by welding or soldering so as to electrically connect the motor unit 40 with the main circuit board 122. An independent lead element is required to connect the motor unit 40 with the main circuit board 122 to ensure stable connection for the motor terminal 41 of the motor unit 40 and to avoid unnecessary contact from the motor terminal 41. Particularly, the lead element 134 can be embodied as a conductor embedded inside the encapsulation portion 11.

It is worth mentioning that the embedding position of the lead element 134 can be arranged according to the needs.

For example, in this preferred embodiment of the present invention, the embedding position can be provided inside the encapsulation portion 11 to hire the lead element 134. In an alternative mode, the embedding position can also be provided on the surface of the encapsulation portion 11. Person skilled in the art should understand that position of the lead element 134 shall not limit the present invention.

Figure 11B:
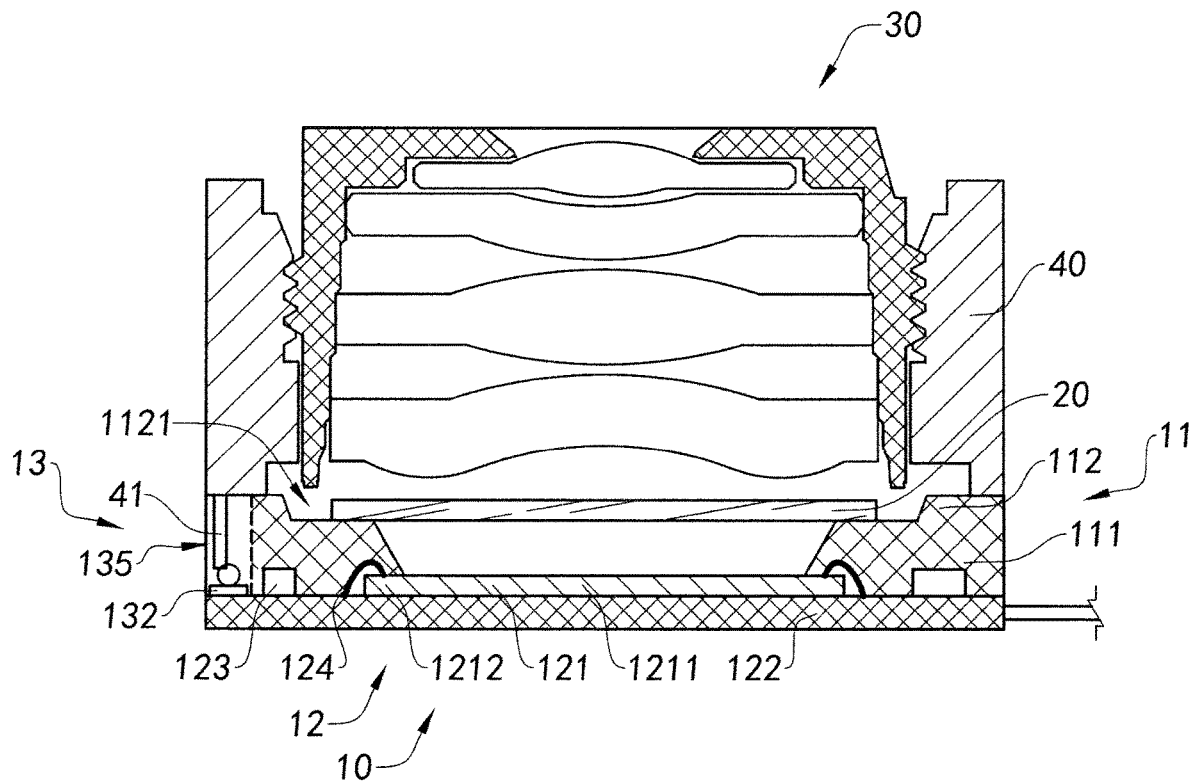

Referring to FIG. 11B, an alternative mode of the motor connecting structure of the above preferred embodiment of the present invention is illustrated. The motor connecting structure 13 includes a terminal slot 135 for accommodating the motor terminal 41 of the motor unit 40 of the camera module. The terminal slot 135 is provided inside the encapsulation portion 11. The motor connecting structure 13 includes at least one circuit connection junction 132, wherein the circuit connection junction 132 is arranged to be provided on the main circuit board 122 and electrically connected to the connecting circuit in the main circuit board 122. Furthermore, each the terminal slot 135 is extended from the top of the encapsulation portion 11 to the main circuit board 122 to present the circuit connection junction 132. In one preferred embodiment, the motor terminal 41 is adapted to insert into the terminal slot 135 and connected to the circuit connection junction 132 by soldering or welding.

In other words, when producing the photosensitive unit 10, each the circuit connection junction 132 is provided on the main circuit board 122 and the photosensitive sensor 121 is attached to the main circuit board 122. Then, the encapsulation portion 11 is molded on the main circuit board 122 and the photosensitive sensor 121 by means of the MOC technology, while the terminal slot 135 with predetermined length is provided and the circuit connection junction 132 is revealed through the terminal slot 135 for connecting with the motor terminal 41 of the motor unit 40. For example, when the photosensitive unit 10 is to be assembled to form the camera module, each motor terminal 41 of the motor unit 40 is inserted into the terminal slot 135 and connected to the circuit connection junction 132 of the main circuit board 122 by welding and soldering so as to electrically connect the motor unit 40 with the main circuit board 122 to ensure stable connection for the motor terminal 41 of the motor unit 40 and to avoid unnecessary contact of the motor terminal 41.

Figure 11C:
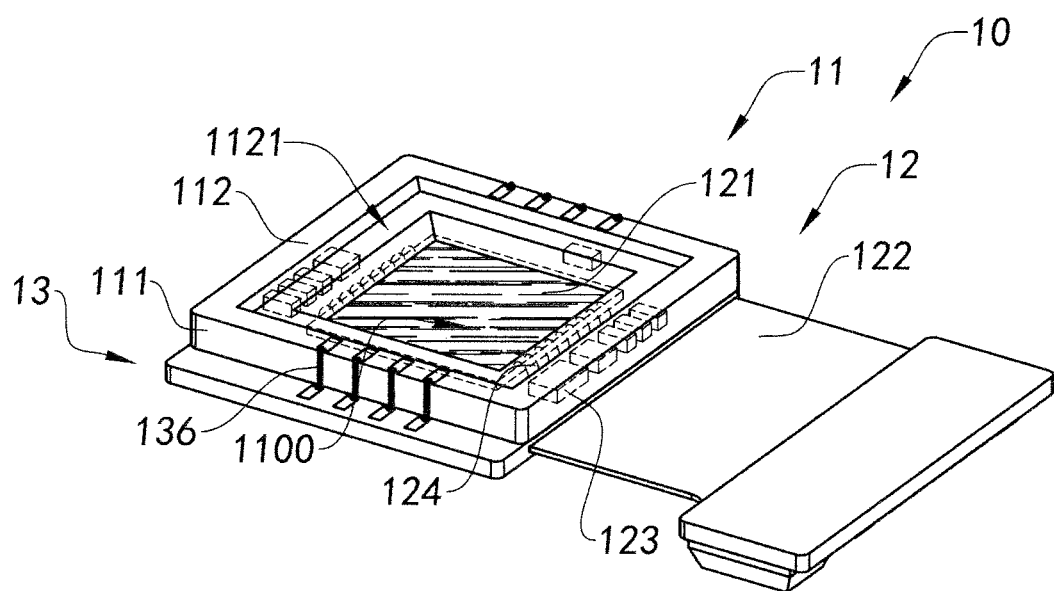
FIG. 11C is perspective view illustrates the motor connecting structure of the photosensitive unit according to the above second preferred embodiment of the present invention.

Referring to FIG. 11C, another alternative mode of the motor connecting structure of the above preferred embodiment of the present invention. The motor connecting structure 13 includes at least one carving line 136. The carving line 136 is adapted to electrically connect the connecting elements, the photosensitive sensor 121, and the motor unit on the main circuit board 122. For example, but not limited to that the carving line 136 can be provided by Laser Direct Structuring (LDS) during the forming of the encapsulation portion 11. For example, in one preferred embodiment of the present invention, the carving line 136 is directly formed on the surface of the encapsulation portion 11 by laser. However, in the conventional way of connection, components like driving motor are connected to the circuit board by independent lead wires, that involves relatively complicated manufacture procedures. In view of the present invention the carving line 136 is provided directly in the molding process that can not only substitute the conventional way like motor soldering, but also provide a more stable electrical circuit connection. More specifically, the formation process of the carving line 136 can be formed by first providing a carving slot in the encapsulation portion 11 and then electroplating carving slot form the electrical circuit.

It is worth mentioning that the electrical connection of the motor unit 40 is described as electrical connecting the motor unit 40 by the lead element 131 according to the above second embodiment of the present invention, but in other embodiments of the present invention, it is possible to apply different motor connecting structures 13 to connect the motor unit 40. For example, the various methods as shown in FIGS. 11A, 11B, and 11C. In other words, the various motor connecting structures as illustrated in FIGS. 11A, 11B, and 11C can be coupled with different photosensitive units respectively to provide different ways to electrically connect the motor unit. Therefore, person skilled in the art should understand that what are shown in the appended drawings shall not limit the scope of the present invention.

Figure 12:
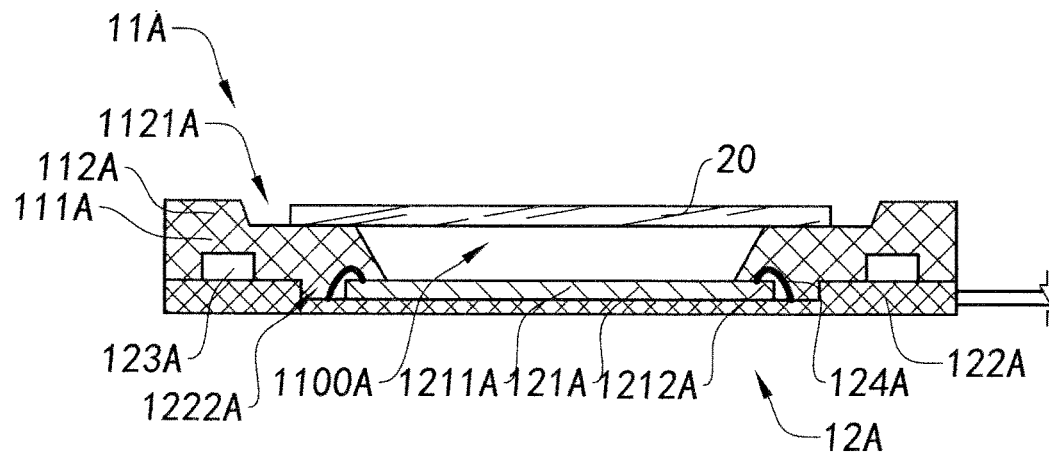
FIG. 12 is a sectional view of a photosensitive unit according to a third preferred embodiment of the present invention.
Figure 13:
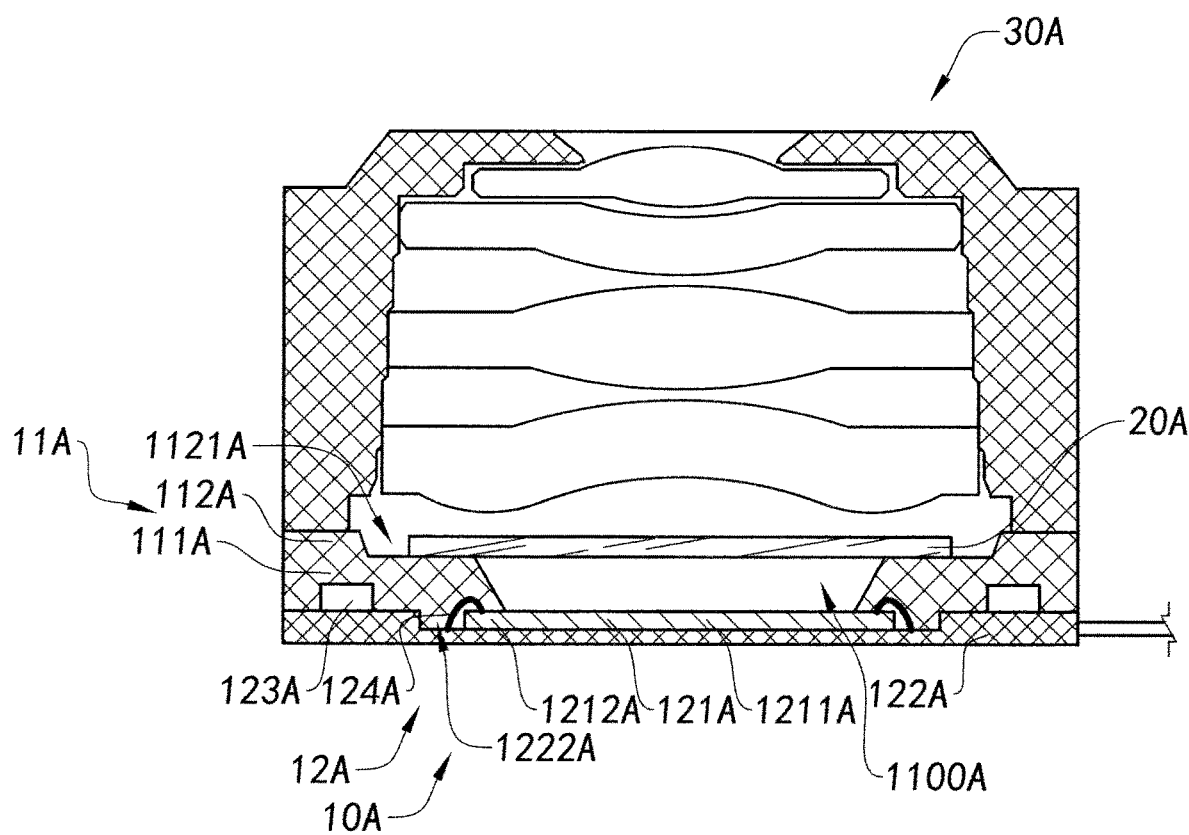
FIG. 13 is a sectional view of the camera module according to the above third preferred embodiment of the present invention.

Referring to FIGS. 12 and 13, a photosensitive unit and a camera module thereof according to a third preferred embodiment of the present invention are illustrated. The photosensitive unit 10A, which is used for assembling and producing the molded camera module, includes an encapsulation portion 11A and a photosensitive portion 12A, wherein the encapsulation portion 11A is molded to connect to the photosensitive portion 12A.

The photosensitive portion 12A includes a main circuit board 122A and a photosensitive sensor 121A, wherein the photosensitive sensor 121A is disposed on the main circuit board 122A. According to the present embodiment of the present invention, the photosensitive sensor 121A is molded to connect to the main circuit board.

According to the third preferred embodiment of the present invention, the photosensitive portion 12A includes a connecting circuit (not shown in the figures) and at least a circuit element 123A. The connecting circuit is preinstalled in the main circuit board 122A. The circuit element 123A is electrically connected to the connecting circuit and the photosensitive sensor 121A, adapted for the photosensitive sensor 121A to perform its photosensing process function. The circuit element 123A is protrudingly deployed on the main circuit board 122A. The circuit element 123A can be, for example but not limited to, resistors, capacitors, diodes, triodes, potentiometers, electric relays, actuators, or etc.

It is worth mentioning that the encapsulation portion 11A encapsulates and wraps up the circuit element 123A therein, so that the circuit element 123A will not be directly exposed in any space, and more specifically, not be exposed in the environment that communicates with the photosensitive sensor 121A. Therefore, during the assembling of the camera module, the circuit element 123A will not contaminate pollutions, such as dusts, or adversely influence the photosensitive sensor 121A. It is different from the conventional camera module that the circuit element 123A, such as resistance-capacitance components, is exposed outside. The enclosure and encapsulation of the photosensitive sensor 121A by molding, sundries and dusts are prevented from staying on the surface of the circuit element 123A that avoids the photosensitive sensor 121A from being contaminated and causes dark spots and other defectives of the camera module.

The encapsulation portion 11A forms a window 1100A to provide a photosensitive path for the photosensitive sensor 121A.

According to the third preferred embodiment of the present invention, the photosensitive portion 12A includes at least one connecting element 124A for electrically connecting the photosensitive sensor 121A with the main circuit board 122A. Further, each of the connecting elements 124A can be embodied as, specifically but not limited to, gold wire, copper wire, aluminum wire, and/or silver wire.

It is worth mentioning that each the connecting element 124A is molded inside the encapsulation portion 11A, so that the connecting element(s) 124A are enclosed, encapsulated and/or wrapped up by the molded encapsulation portion 11A that keep them from direct exposure to the outside. Therefore, during the assembling of the camera module, the connecting element(s) 124A will not suffer any collision or damage, and, at the same time, the influence by the environmental factors, such as temperature, on the connecting element 124A is reduced that results in stabilization of the communication and connection between the photosensitive sensor 121A and the main circuit board 122A. This is completely different from the prior art.

It is worth mentioning that the encapsulation portion 11A encapsulates and wraps up the circuit element 123A and the connecting element 124A, which advantages in protecting the circuit element 123A and the connecting element 124A as well as obtaining a higher performance camera module. However, those skilled in the art should understand that the encapsulation portion 11A shall not be limited in wrapping up the circuit element 123A and/or the connecting element 124A. In other words, in other embodiments of the present invention, the encapsulation portion 11A can be directly molded on main circuit board 122A without protruded circuit element 123A or be molded on various positions, such as the outer sides, the periphery, and etc., of the circuit element 123A.

This embodiment is an alternative mode of the above preferred embodiment that, the main circuit board 122A has an inner groove 1222A and the photosensitive sensor 121A is installed in the inner groove 1222A, so as to reduce the relative height of the photosensitive sensor 121A and the main circuit board 122A. Therefore, when the encapsulation portion 11A covers and wraps up the photosensitive sensor 121A, the height of the encapsulation portion 11A can be reduced that results in reducing the height of the camera module assembled with the photosensitive unit 10A.

In addition, the photosensitive sensor 121A has a photosensitive area 1211A and a non-photosensitive area 1212A, wherein the non-photosensitive area 1212A is positioned to surround the periphery of the photosensitive area 1211A. The photosensitive area 1211A is adapted for processing photosensitization. The connecting element 124A is connected to the non-photosensitive area 1212A.

According to the preferred embodiment of the present invention, the encapsulation portion 11A is extended on the non-photosensitive area 1212A of the photosensitive sensor 121A to overlappedly affix the photosensitive sensor 121A on the main circuit board 122A by molding technology. Such that, for example, by using the process of Molding on Chip (MOC) or other molding technologies, the moldable area of the encapsulation portion 11A can be increased inwardly, so that the structural portion of the outer portions of the encapsulation portion 11A and the main circuit board 122A can be reduced, which further reduces the size in length and width of the photosensitive unit 12A and reduces the size in length and width of the molded camera module assembled thereby.

In the present embodiment of the present invention, the encapsulation portion 11A is protruded to surround the outer sides of the photosensitive area 1211A of the photosensitive sensor 121A. Particularly, the encapsulation portion 11A is connected in an integral and sealed manner to achieve a good sealingness and tightness, so that when the photosensitive unit 10A is used to assemble the camera module, the photosensitive sensor 121A will be sealed inside the camera module to define a sealed inner space.

Furthermore, the encapsulation portion 11A includes a covering section 111A and an optical filter installing section 112A. The optical filter installing section 112A is molded integrally to connect with the covering section 111A. The covering section 111A is molded to attach on the main circuit board 122A for encapsulating and wrapping up the circuit element 123A and the connecting element 124A. The optical filter installing section 112A is arranged for installing an optical filter 20A. In other words, when the photosensitive unit 10A is used to assemble the camera module, the optical filter 20A of the camera module will be mounted at the optical filter installing section 112A, which makes the optical filter 20A be positioned along the photosensitive path of the photosensitive sensor 121A without the need of any additional mounting frame of the optical filter 20A. In other words, the encapsulation portion 11A of the present embodiment has a function as a conventional optical filter frame while the top portion of the optical filter installing section 112A has a good evenness and smoothness by means of the molding technique, that enables the optical filter 20A to be installed evenly, that is superior to conventional camera modules.

In addition, the optical filter installing section 112A has an installing groove 1121A. The installing groove 1121A is communicated with the window 1100A to provide sufficient installation space for the optical filter 20A to install and prevent the optical filter 20A being protruded from the top surface of the optical filter installing section 112A. In other words, the top of the encapsulation portion 11A has the installing groove provided therein for the optical filter 20A to be stably installed at the encapsulation portion 11A without protruding from the top of the encapsulation portion 11A.

It is worth mentioning that the molded inner wall defines the window 1100A and can be provided according to the shape of the object to be installed thereat. For example, it can be in inclined or slope shape, so that while the connecting element 124A is encapsulated and wrapped up by the encapsulation portion 11A, the photosensitive sensor 121A may receive as much light as possible. Person skilled in the art should understand that the shape of the encapsulation portion 11A shall not be a limitation of the present invention.

Referring to FIGS. 12 and 13, the camera module according to a third preferred embodiment of the present invention can be embodied as a fixed focus module. The camera module includes one the photosensitive unit 10A, one the optical filter 20A, and one the camera lens 30A.

The optical filter 20A is installed at the photosensitive unit 10A, while the camera lens 30A is mounted on the photosensitive unit 10A.

More specifically, the optical filter 20A is installed at the installing groove 1111A of the optical filter installing section 111A of the encapsulation portion 11A of the photosensitive unit 10A. The camera lens 30A is mounted on top of the optical filter installing section 111A of the encapsulation portion 11A of the photosensitive unit 10A. In other words, the optical filter 20A is mounted in the IR installing groove 1111A. The camera lens 30A is mounted on top of the encapsulation portion 11A.

In other embodiments of the present invention, the photosensitive unit 10A can also be assembled in an automatic focus camera module. Person skilled in the art should understand that the fixed focus module is only an example for describing the present invention, which shall not limit the present invention.

Figure 14:
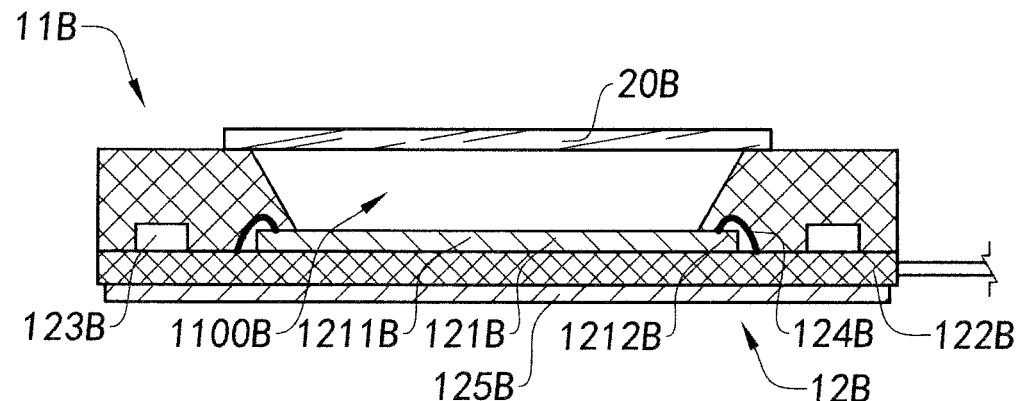
FIG. 14 is a sectional view of a photosensitive unit according to a fourth preferred embodiment of the present invention.
Figure 15:
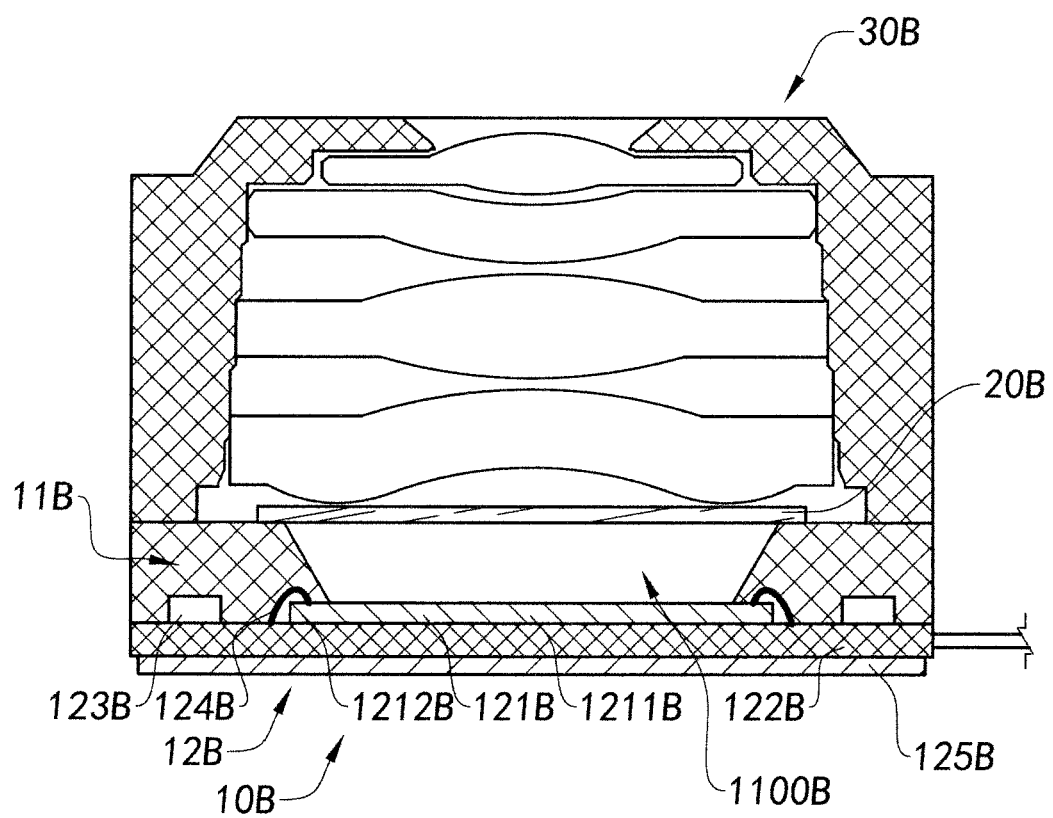
FIG. 15 is a sectional view of the camera module according to the above fourth preferred embodiment of the present invention.

Referring to FIGS. 14 and 15, a photosensitive unit 10B of a camera module according to a fourth preferred embodiment of the present invention is illustrated. The photosensitive unit 10B is used for assembling and producing of camera module, so as to obtain a molded camera module. The photosensitive unit 10B includes an encapsulation portion 11B and a photosensitive portion 12B, wherein the encapsulation portion 11B is molded to connect with the photosensitive portion 12B.

The photosensitive portion 12B includes a main circuit board 122B and a photosensitive sensor 121B, wherein the photosensitive sensor 121B is disposed on the main circuit board 122B. According to the present embodiment of the present invention, the photosensitive sensor 121B is molded to connect to the main circuit board.

According to the present embodiment of the present invention, the photosensitive portion 12B includes a connecting circuit (not shown in the figures) and at least a circuit element 123B. The connecting circuit is preinstalled in the main circuit board 122B. The circuit element 123B is electrically connected to the connecting circuit and the photosensitive sensor 121B so as to enable the photosensitive sensor 121B to conduct the photosensing process. The circuit element 123B is protrudingly deployed on the main circuit board 122B. The circuit element 123B can be, for example but not limited to, resistors, capacitors, diodes, triodes, potentiometers, electric relays, or actuators.

It is worth mentioning that the encapsulation portion 11B encapsulates and wraps up the circuit element 123B therein, so that the circuit element 123B will not be directly exposed in an open space, and more specifically, not be exposed in the environment that communicates with the photosensitive sensor 121B. Therefore, during the assembling of the camera module, the circuit element 123B will not be contaminated by pollutants, such as dusts, or influence the photosensitive sensor 121B, that is different from the arrangement of conventional camera module that its circuit elements, such as resistance-capacitance components, are remained in exposed manner. The use of the molding and encapsulating method prevents sundries and dusts from staying on the surface of the circuit element 123B and avoids the photosensitive sensor 121B from being contaminated that causes dark spots and other defectives of the camera module.

The encapsulation portion 11B forms a window 1100B for providing a photosensitive path for the photosensitive sensor 121B.

According to the present fourth preferred embodiment of the present invention, the photosensitive portion 12B includes at least one connecting element 124B for electrically connecting the photosensitive sensor 121B with the main circuit board 122B. Further, each of the connecting elements 124B can be embodied as, specifically but not limited to, gold wire, copper wire, aluminum wire, and/or silver wire.

It is worth mentioning that each connecting element 124B is molded within the encapsulation portion 11B, so that the encapsulation portion 11B, encloses, encapsulates and/or wraps up each of the connecting element(s) 124B and keep them from direct exposure to the outside. Therefore, during the assembling of the camera module, the connecting element(s) 124B will not suffer any collision or damage, and, at the same time, it reduces the impact due to the environmental factors, such as temperature, on the connecting element 124B and stabilizes the communication and connection between the photosensitive sensor 121B and the main circuit board 122B. This is completely absent in the traditional art.

It is worth mentioning that the encapsulation portion 11B encapsulates and wraps up the circuit element 123B and the connecting element 124B, which advantages in protecting the circuit element 123B and the connecting element 124B as well as obtaining a higher performance camera module. However, those skilled in the art should understand that the encapsulation portion 11B shall not be limited in wrapping up the circuit element 123B and/or the connecting element 124B. In other words, in other embodiments of the present invention, the encapsulation portion 11B can be directly molded on the main circuit board 122B without protruded circuit element 123B or be molded on various positions, such as the outer sides, the periphery, and etc., of the circuit element 123B.

In addition, the photosensitive sensor 121B has a photosensitive area 1211B and a non-photosensitive area 1212B, wherein the non-photosensitive area 1212B is positioned surrounding the periphery of the photosensitive area 1211B. The photosensitive area 1211B is adapted for conducting photosensitization. The connecting element 124B is connected to the non-photosensitive area 1212B.

According to the fourth preferred embodiment of the present invention, the encapsulation portion 11B is extended on the non-photosensitive area 1212B of the photosensitive sensor 121B, so as to overlappedly mount the photosensitive sensor 121B on the main circuit board 122B by means of molding. In this manner, such as the method of Molding on Chip (MOC), the moldable area of the encapsulation portion 11B can be extended inwardly, such that the structural portion outside of the encapsulation portion 11B and the main circuit board 122B can be reduced, that further reduces the size in length and width of the molded photosensitive portion 12B and reduces the size in length and width of the camera module assembled thereby.

In the present fourth embodiment of the present invention, the encapsulation portion 11B is protruded to surround the outside of the photosensitive area 1211B of the photosensitive sensor 121B. Particularly, the encapsulation portion 11B integrally seal its connection, so as to provide a great sealingness and tightness. Therefore, when the photosensitive unit 10B is used to assemble the camera module, the photosensitive sensor 121B will be sealed inside the camera module to forms a sealed inner space.

In particular, the production of the photosensitive unit 10B may utilize a conventional circuit board as the main circuit board 122B. The photosensitive sensor 121B is deployed on the main circuit board 122B and electrically connected by the connecting element 124B. Then, the initially assembled main circuit board 122B and photosensitive sensor 121B are molded by, for example, injection molding machine. By means of the insert molding technique, the circuit board that has been processed by Surface Mount Technology (SMT) will be molded to form the encapsulation portion 11B. Alternatively, the encapsulation portion 11B can be formed by applying the pressing molding technique, which is commonly seen in semiconductor packaging The main circuit board 122B can selectively be, for example but not limited to, a rigid-flex board, a ceramic substrate (without flexible board), or a rigid PCB (without flexible board). The way to form the encapsulation portion 11B can be selected from, for example but not limited to, injection molding technique and pressing molding technique. The material of the encapsulation portion 11B can be, for example but not limited to, nylon, liquid crystal polymer (LCP), or polypropylene (PP) for injection molding technique, or resin for pressing molding technique. Those skilled in the art should understand that the above available manufacture methods and available materials are examples to describe available implementations of the present invention, rather than to limit the scope of the present invention.

Furthermore, the top surface of the encapsulation portion 11B is flat and smooth, and is adapted for mounting an optical filter 20B thereon. In other words, when the photosensitive unit 10B is used in assembling the camera module, the optical filter 20B of the camera module is mounted on the top surface of the encapsulation portion 11B, enabling the optical filter 20B to be arranged along the photosensitive path of the photosensitive sensor 121B without the need of any additional mounting frame for the optical filter 20B. In other words, the encapsulation portion 11B also functions as a conventional independent mounting frame. In addition, due to the advantage of molding technique, the molded top portion of the encapsulation portion 11B can take advantage of the mold to achieve good evenness and smoothness, so that the optical filter 20B can be evenly installed, that is superior to conventional camera module.

The different between the above preferred embodiments and the present fourth embodiment of the present invention, the photosensitive portion 12B of the photosensitive unit 10B further includes a reinforced layer 125B overlappedly attached to the bottom of the main circuit board 122B, so as to reinforce the structural strength of the main circuit board 122B. In other words, the reinforced layer 125B is adhered on a position of the bottom layer of the main circuit board 122B corresponding to the positions of the encapsulation portion 11B and the photosensitive sensor 121B, so that the main circuit board 122B can also stably and reliably support the encapsulation portion 11B and the photosensitive sensor 121B.

Furthermore, the reinforced layer 125B is a metal plate attaching on the bottom layer of the main circuit board 122B to increase the structural strength of the main circuit board 122B as well as to enhance the heat dissipation of the photosensitive unit 10B by effectively dissipating heat generated by the photosensitive sensor 121B.

It is worth mentioning that the main circuit board 122B can be Flex Print Circuit (FPC). By enhancing the rigidity of the FPC with the reinforced layer 125B, the FPC having excellent flexural property can still fulfill the loading and supporting requirement for the photosensitive unit 10B. In other words, more options of different circuit boards can be used as the main circuit board 122B, such as PCB (Printed Circuit Board), FPC (Flexible Printed Circuit), and RF (Rigid Flex). By using the reinforced layer 125B to enhance the structural strength and heat dissipation of the main circuit board 122B, the thickness of the main circuit board 122B can thus be reduced, that enables the height of the photosensitive unit 10B to be further reduced. Hence, the height of the camera module assembled thereby can be reduced too.

It is worth mentioning that, according to the present fourth embodiment of the present invention, the reinforced layer 125 is overlapped on the main circuit board 122B in a plane manner. In other embodiments of the present invention, the reinforced layer 125 can be extended to cover the side walls of the encapsulation portion 11B, so as to not only reinforce the structural strength of the photosensitive unit 10B, but also enhance an anti-electromagnetic ability thereof.

It is worth mentioning that the inner wall of the encapsulation portion 11B can be shaped according to the connection shape thereof. For example, it can be an inclined and slope shape, so that the photosensitive sensor 121B can receive more light while the connecting element 124B is encapsulated and wrapped by the encapsulation portion 11B. Those skilled in the art should understand that specific shape of the encapsulation portion 11B shall not limit the present invention.

Referring to FIGS. 14 and 15, the camera module according to the fourth preferred embodiment of the present invention can be a fixed focus module (FFM), which includes one the photosensitive unit 10B, one the optical filter 20B, and one the camera lens 30B.

The optical filter 20B is installed at the photosensitive unit 10B, while the camera lens 30B is mounted on the photosensitive unit 10B.

More specifically, the optical filter 20B is mounted on top of encapsulation portion 11B of the photosensitive unit 10B. The camera lens 30B is mounted on top of encapsulation portion 11B of the photosensitive unit 10B. Particularly, the specific installation positions of the optical filter 20B and the camera lens 30B in the encapsulation portion 11B can be coordinated and arranged based on practical needs.

It is also worth mentioning that the camera lens 30B is supported on top portion of the encapsulation portion 11B of the photosensitive unit 10B. Therefore, the encapsulation portion 11B can also function as the independent mounting frame of a conventional camera module to provide a supportive and holding site, but it is assembled by technical process different from the conventional COB technology. The mounting frame of a conventional camera module based on the conventional COB technique is adhered on the circuit board by adhesive. However, the encapsulation portion 11B is molded on the main circuit board 122B by means of the molding technique that does not require any adhering and affixing procedures. Contrasting to the process of adhering and affixing, the process of molding has better stability in connection and provides better controllability in technological process. Besides, it does not have to reserve any adhering space between the encapsulation portion 11B and the main circuit board 122B for AA adjustment. Therefore, it saves the adhering space of AA adjustment of conventional camera module, and allows the thickness of the camera module to be further reduced. Meanwhile, the encapsulation portion 11B which encapsulates and wraps the circuit elements 123B and the connecting elements 124B therein provides the function of conventional independent mounting frame, so that the circuit elements 123B and the connecting element 124B can be spatially overlapped. It is different from the conventional camera module that requires to reserve a safety distance around the circuit components. As a result, the height of the encapsulation portion 11B, which functions as the independent mounting frame, can be arranged in a smaller scale, so as to further provide room for reducing the thickness of the camera module. Besides, the encapsulation portion 11B that substitutes the conventional mounting frame avoids any tilt deviation occurred in attaching and assembling the mounting frame as in the conventional camera module and to reduce the accumulated tolerance of in assembling the camera module. In addition, the encapsulation portion 11B encapsulates and wraps up the connecting element 124B and extends to the non-photosensitive area 1212B of the photosensitive sensor 121B, which allows the encapsulation portion 11B to shrink inwardly, so as to further decrease the lateral sizes in length and width of the camera module.

Figure 16:
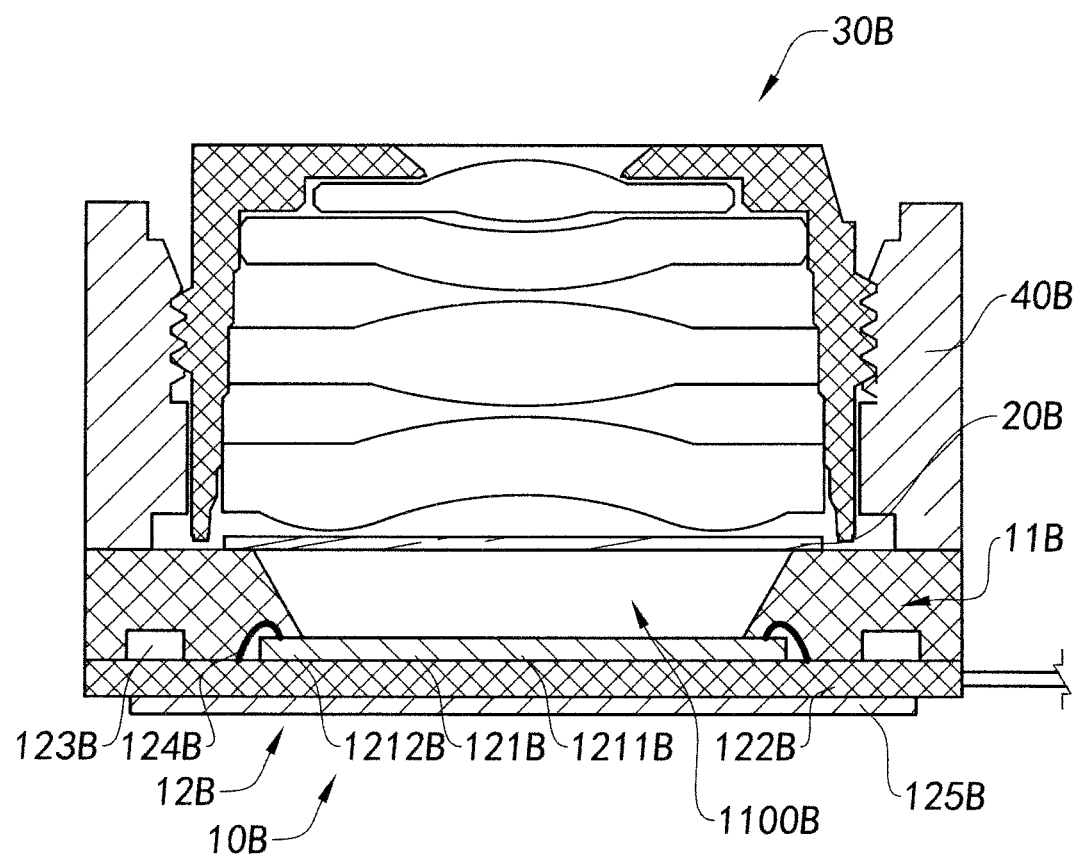
FIG. 16 is sectional view of the camera module according to an alternative of the above fourth preferred embodiment of the present invention.

Referring to FIGS. 14 and 16, an alternative mode of the camera module according to the above fourth preferred embodiment of the present invention is illustrated. The camera module can be an automatic focus camera module. The camera module includes one the photosensitive unit 10B, one the optical filter 20B, a motor unit 40B, and a camera lens 30B.

The optical filter 20B is mounted on the photosensitive unit 10B, while the camera lens 30B is mounted on the motor unit 40B and the motor unit 40B is mounted on the molded circuit unit.

Furthermore, the optical filter 20B is mounted on the top portion of encapsulation portion 11B of the photosensitive unit 10B. The motor unit 40B is mounted on the top portion of the encapsulation portion 11B of the photosensitive unit 10B. Particularly, the specific installation positions of the optical filter 20B and the motor unit 40B at the encapsulation portion 11B can be coordinated and arranged based on practical needs.

Especially, carving line(s) 114B would be provided to electrically connect the motor unit 40B with the main circuit board 122B of the photosensitive portion 12B, so that it does not require to solder a connecting element such as lead wire for connecting the motor unit 40B with the main circuit board 122B of the photosensitive portion 12B, which eliminates the technological process of motor soldering.

Those skilled in the art should understand that the structures and forms of the camera module mentioned above are just examples to describe ways of implementing the camera module, rather than limitations of the present invention.

Referring to FIGS. 17 to 20, a camera module with its photosensitive unit according to a fifth preferred embodiment of the present invention is illustrated. The photosensitive unit 10C is for assembling and producing camera module, so as to achieve the molded camera module of the present invention. The photosensitive unit 10C includes an encapsulation portion 11C and a photosensitive portion 12C, wherein the encapsulation portion 11C is molded to connect with the photosensitive portion 12C.

The photosensitive portion 12C includes a main circuit board 122C and a photosensitive sensor 121C, wherein the photosensitive sensor 121C is disposed on the main circuit board 122C. According to the present fifth embodiment of the present invention, the photosensitive sensor 121C is molded to connect to the main circuit board 122C.

According to the present fifth embodiment of the present invention, the photosensitive portion 12C includes a connecting circuit (not shown in the figures) and at least a circuit element 123C. The connecting circuit is preinstalled in the main circuit board 122C. The circuit element 123C is electrically connected to the connecting circuit and the photosensitive sensor 121C, wherein the photosensitive sensor 121C is arranged to perform the photosensing process thereof. The circuit element 123C is protrudingly deployed on the main circuit board 122C. The circuit element 123C can be, for example but not limited to, resistors, capacitors, diodes, triodes, potentiometers, electric relays, or actuators.

It is worth mentioning that the encapsulation portion 11C encapsulates and wraps up the circuit element 123C therein, so that the circuit element 123C will not be directly exposed in the space outside the main circuit board 122C, and more specifically, not be exposed in the environment that communicates with the photosensitive sensor 121C. Therefore, during the assembling of the camera module, the circuit element 123C will not be contaminated by pollutants, such as dusts, or influence the photosensitive sensor 121C, which is different from the arrangement of conventional camera module that the circuit element(s) 123C, such as resistance-capacitance components, will not be exposed outside. The use of the molding and encapsulation method in the present invention prevents sundries and dusts from staying on the surface of the circuit element(s) 123C and avoids the photosensitive sensor 121C from being contaminated and causing dark spots and other defectives of the camera module.

The encapsulation portion 11C forms a window 1100C providing a photosensitive path for the photosensitive sensor 121C.

According to the present fifth preferred embodiment of the present invention, the photosensitive portion 12C includes at least one connecting element 124C for electrically connecting the photosensitive sensor 121C with the main circuit board 122C. Further, each of the connecting elements 124C can be embodied to be, specifically but not limited to, gold wire, copper wire, aluminum wire, and/or silver wire.

It is worth mentioning that each connecting element 124C is molded within the encapsulation portion 11C, so as to use the encapsulation portion 11C to enclose, capsulate and/or wrap up the connecting element(s) 124C and keep them from direct exposure to the outside. Therefore, during the assembling of the camera module, the connecting element(s) 124C will not suffer any collision or damage, which, at the same time, reduces the impact due to the environmental factors, such as temperature, on the connecting element(s) 124C and stabilizes the communication and connection between the photosensitive sensor 121C and the main circuit board 122C. This is basically not provided in the traditional art.

It is worth mentioning that the encapsulation portion 11C encapsulates and wraps up the circuit element(s) 123C and the connecting element(s) 124C, which advantages in protecting the circuit element(s) 123C and the connecting element(s) 124C as well as achieving a higher performance camera module. However, person skilled in the art should understand that the encapsulation portion 11C shall not be limited in encapsulating and wrapping up the circuit element 123C and/or the connecting element 124C. In other words, in other embodiments of the present invention, the encapsulation portion 11C can be directly molded on the main circuit board 122C without protruded circuit element 123C or be molded on various positions, such as the outer side, periphery, etc., of the circuit element 123C.

In addition, the photosensitive sensor 121C has a photosensitive area 1211C and a non-photosensitive area 1212C, wherein the non-photosensitive area 1212C is positioned surrounding the periphery of the photosensitive area 1211C. The photosensitive area 1211C is adapted for conducting photosensitization. The connecting element 124C is connected to the non-photosensitive area 1212C.

According to the fifth preferred embodiment of the present invention, the encapsulation portion 11C is extended on the non-photosensitive area 1212C of the photosensitive sensor 121C to overlappedly mount the photosensitive sensor 121C on the main circuit board 122C by means of molding. In this manner, such as using the method of Molding on the Chip, the moldable area of the encapsulation portion 11C can be extended inwardly, such that the structural portion of the outer portion of the encapsulation portion 11C and the main circuit board 122C can be reduced, that further reduces the size in length and width of the photosensitive unit and reduces the size in length and width of the camera module assembled thereby.

In the present fifth embodiment of the present invention, the encapsulation portion 11C is protruded to position surrounding the outer portion of the photosensitive area 1211C of the photosensitive sensor 121C. Particularly, the encapsulation portion 11C integrally seals the electrical connection, so as to achieve a good sealingness and tightness. Therefore, when the photosensitive unit 10C is used in assembling of camera module, the photosensitive sensor 121C is sealed inside and forms a sealed interior space.

Specifically, in production of the photosensitive unit 10C, a conventional circuit board can be selected to make the main circuit board 122C. The photosensitive sensor 121C is deployed on the main circuit board 122C and electrically connected by the connecting element 124C. Then, after the main circuit board 122C and the photosensitive sensor 121C are initially assembled, they are processed by Surface Mount Technology (SMT) and molded by means of the insert molding technique, for example, by an injection molding machine, to form the encapsulation portion 11C, or by means of the pressing molding technique, which is commonly used in semiconductor packaging, to form the encapsulation portion 11C. The main circuit board 122C can selectively be, for example but not limited to, rigid-flex board, ceramic substrate (without flexible board), or rigid PCB (without flexible board). The encapsulation portion 11C can be made selectively by, for example but not limited to, injection molding technique, pressing molding technique and etc. The material of the encapsulation portion 11C can be, for example but not limited to, nylon, liquid crystal polymer (LCP), or polypropylene (PP) for injection molding, or resin for pressing molding. Person skilled in the art should understand that the above available manufacture methods and available materials are examples to describe available implementations of the present invention, rather than limitations of the present invention.

The photosensitive unit 10C further includes an optical filter 20C, wherein the optical filter 20C is molded to overlappedly disposed on the photosensitive sensor 121C. The edges of the optical filter 20C are molded by the encapsulation portion 11C so as to affix the optical filter 20C in position. It is worth mentioning that the optical filter 20C covers on the photosensitive sensor 121C and insulates the photosensitive sensor 121C from the external environment to protect the photosensitive sensor 121C from damage and prevent dusts from entering therein.

To produce the photosensitive unit 10C, the photosensitive sensor 121C is firstly adhered on the main circuit board 122C and the connecting element 124C is connected with the photosensitive sensor 121C and the main circuit board 122C. Then, the optical filter 20C is adhered on the photosensitive sensor 121C. Thereafter, the main circuit board, the photosensitive sensor 121C, and the optical filter 20C are molded to form the encapsulation portion 11C. During the molding process, since the optical filter 20C covers on top of the photosensitive sensor 121C, any damage caused by the molding mold to the photosensitive sensor 121C can be prevented. In addition, because the distance between the optical filter 20C and the photosensitive sensor 121C is shortened, the back focal length of the camera module assembled thereby can also be shortened, so that the height of the camera module is reduced too. On the other hand, since there is no need to provide an additional supporting component for the optical filter 20C, the thickness of the camera module can be further reduced.

It is worth mentioning that the inner walls of the encapsulation portion 10C, which define the window 1100C, can be shaped according to the required connection shape. For example, it can be in an inclined and slope shape, so that the window 1100C reduces its size gradually towards its bottom and thus has a larger upper size and a smaller lower size. Therefore, the photosensitive sensor 121C is capable of receiving more light while the connecting element 124C is encapsulated and wrapped up by the photosensitive portion 10C. Person skilled in the art should understand that specific shape of the encapsulation portion 11C shall not limit the scope of the present invention.

Figure 17:
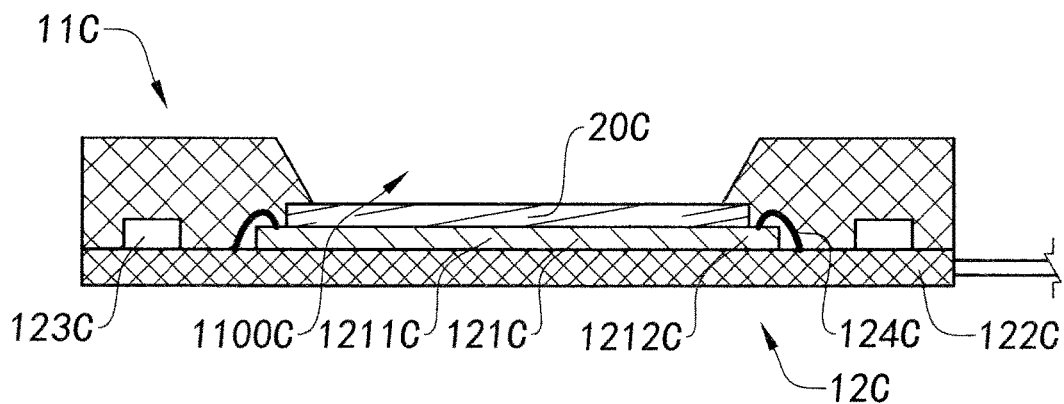
FIG. 17 is a sectional view of a photosensitive unit according to a fifth preferred embodiment of the present invention.
Figure 18:
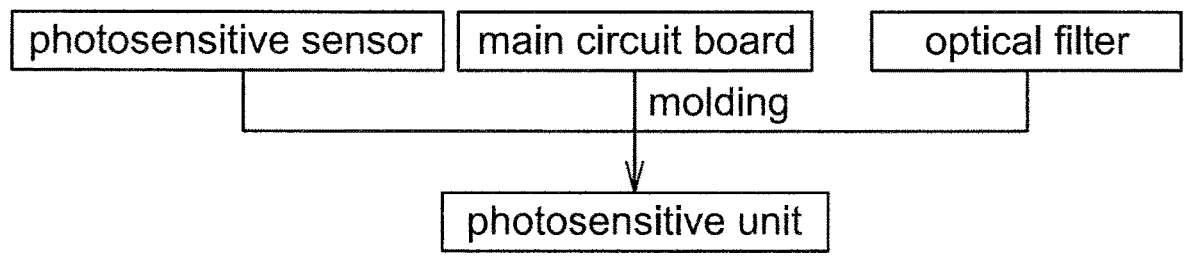
FIG. 18 is a block diagram of the photosensitive unit according to the above fifth preferred embodiment of the present invention.
Figure 19:
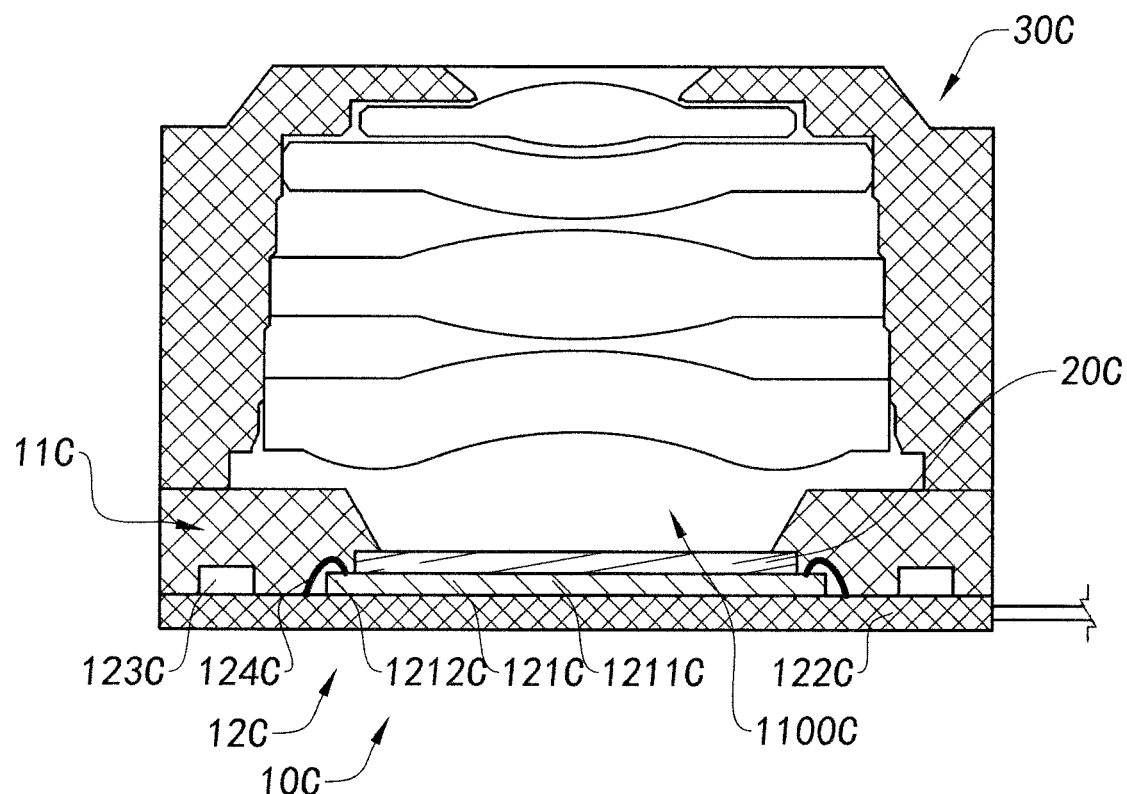
FIG. 19 is a sectional view of the camera module according to the above fifth preferred embodiment of the present invention.

Referring to FIGS. 17 to 19, the camera module according to the fifth preferred embodiment of the present invention can be a fixed focus module, which includes one the photosensitive unit 10C and one the camera lens 30C. The camera lens 30C is mounted on the photosensitive unit 10C for assembling to form the camera module.

Especially, the camera lens 30C can be affixed on top of the encapsulation portion 11C of the photosensitive unit 10C by means of adhering. In addition, taking advantage of the features of the molding production in the molding technique, the top portion of the encapsulation portion 11C can have a better evenness and smoothness that provides an excellent installation condition for the camera lens 30C, so as to achieve a high quality camera module.

It is worth mentioning that the camera lens 30C is supported on top of the encapsulation portion 11C of the photosensitive unit 10C. Therefore, the encapsulation portion 11C itself functions as the independent mounting frame of a conventional camera module to provide supportive and holding site, but it is assembled by different technical process from the conventional COB technology. The independent mounting frame of a camera module based on the conventional COB technique is affixed on the circuit board by means of adhering, but the encapsulation portion 11C of the present invention is affixed on the main circuit board 122C by means of molding that does not require the process of adhering and affixing. Contrasting to the process of adhering and affixing, the process of molding provides better connection stability and technological process controllability. In addition, it does not have to reserve the adhesive space between the encapsulation portion 11C and the main circuit board 122C for AA adjustment. Therefore, it saves the adhesive space of AA adjustment of conventional camera module, and allows the thickness of the camera module to be further reduced. Meanwhile, the encapsulation portion 11C encapsulates and wraps the circuit elements 123C and the connecting elements 124C, that enables the function of the conventional mounting frame, the circuit elements 123C, and the connecting element 124C can spatially overlap without the need to reserve a safety distance around the circuit components as in the conventional camera module. As a result, the height of the encapsulation portion 11C, which functions as the independent mounting frame, can be arranged in a smaller range, so as to further provide room for reducing the thickness of the camera module. Besides, the encapsulation portion 11C substitutes the conventional independent mounting frame to avoid any tilt deviation occurred during the attaching and assembling the mounting frame and to reduce the accumulated tolerance of the assembling of the camera module. In addition, the encapsulation portion 11C encapsulates and wraps up the connecting element 124C and extends to the non-photosensitive area 1212C of the photosensitive sensor 121C, that allows the encapsulation portion 11C to shrink inwardly, so as to further decrease the lateral sizes in length and width of the camera module. Also, the photosensitive unit 10C molds the optical filter 20C therein, so when assembling the camera module, it is not necessary to conduct one more optical filter attachment process. As a result, the assembling technological process of the camera module can be minimized while the efficiency can be enhanced. These are both superior to the traditional art.

Figure 20:
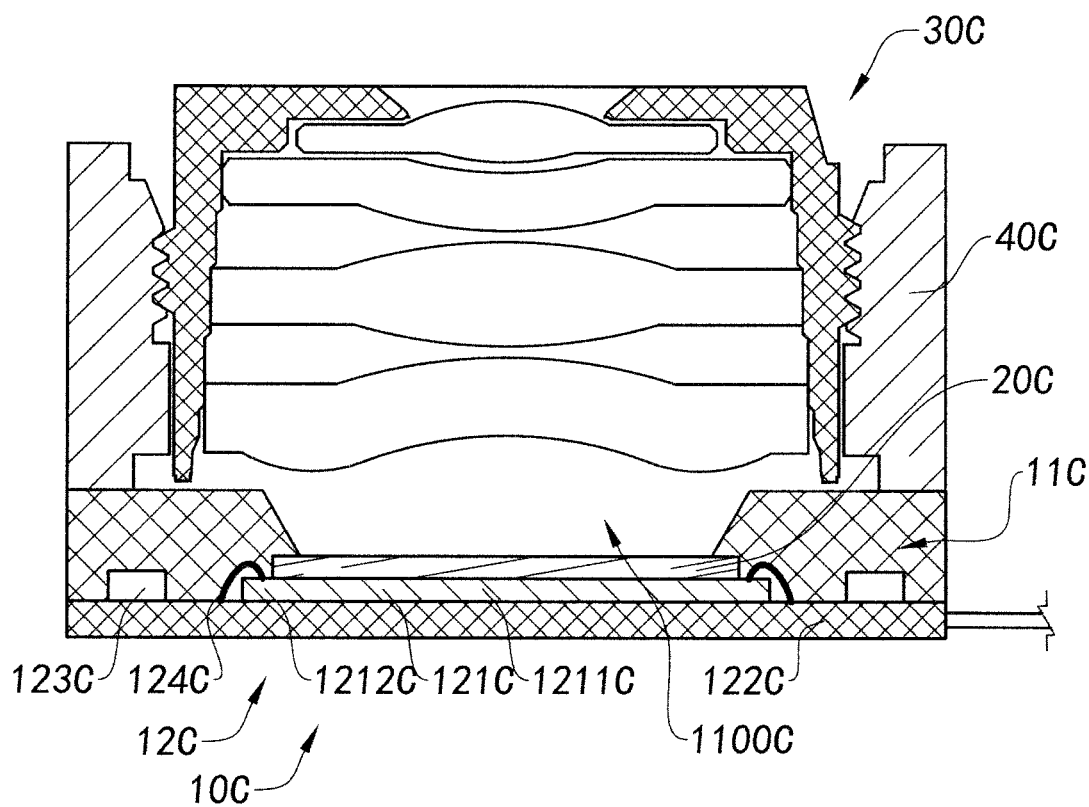
FIG. 20 is a sectional view of the camera module according to an alternative mode of the above fifth preferred embodiment of the present invention.

Referring to FIGS. 17, 18, and 20, an alternative mode of the camera module according to the fifth preferred embodiment of the present invention is illustrated. The camera module can be an Automatic Focus Camera Module (AFCM), which includes one the photosensitive unit 10C, one the motor 40C, and one the camera lens 30C.

The camera lens 30C is installed on the motor unit 40C. The motor unit 40C is installed on the photosensitive unit 10C, so as to allow focal length adjustment of the camera module through the motor unit 40C. The motor unit 40C is mounted on top of the encapsulation portion 11C of the photosensitive unit 10C.

Particularly, one or more carving lines 114C are provided to electrically connect the motor unit 40C and the main circuit board 122C of the photosensitive portion 12C, so that it does not require for soldering connecting element(s) such as lead wire(s) for connecting the motor unit 40C with the main circuit board 122C of the photosensitive portion 12C, that eliminates the technological process in motor soldering.

Those skilled in the art should understand that the structures and forms of the camera module mentioned above are just examples to describe ways of implementing the camera module, rather than limitations of the present invention.

Figure 21:
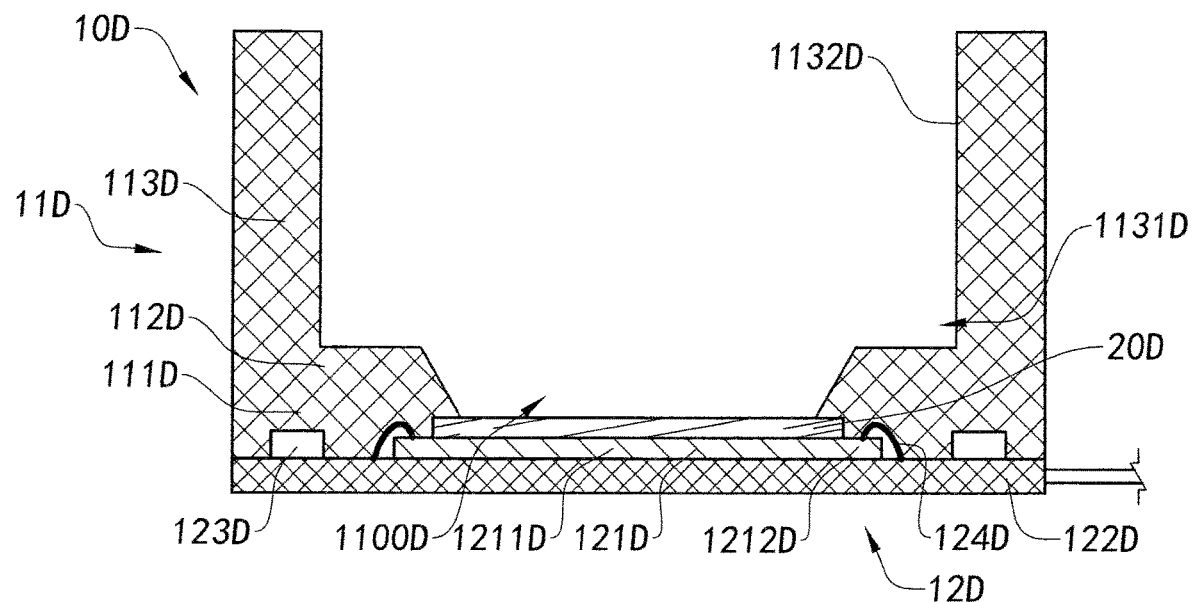
FIG. 21 is a sectional view of a photosensitive unit according to a sixth preferred embodiment of the present invention.
Figure 22:
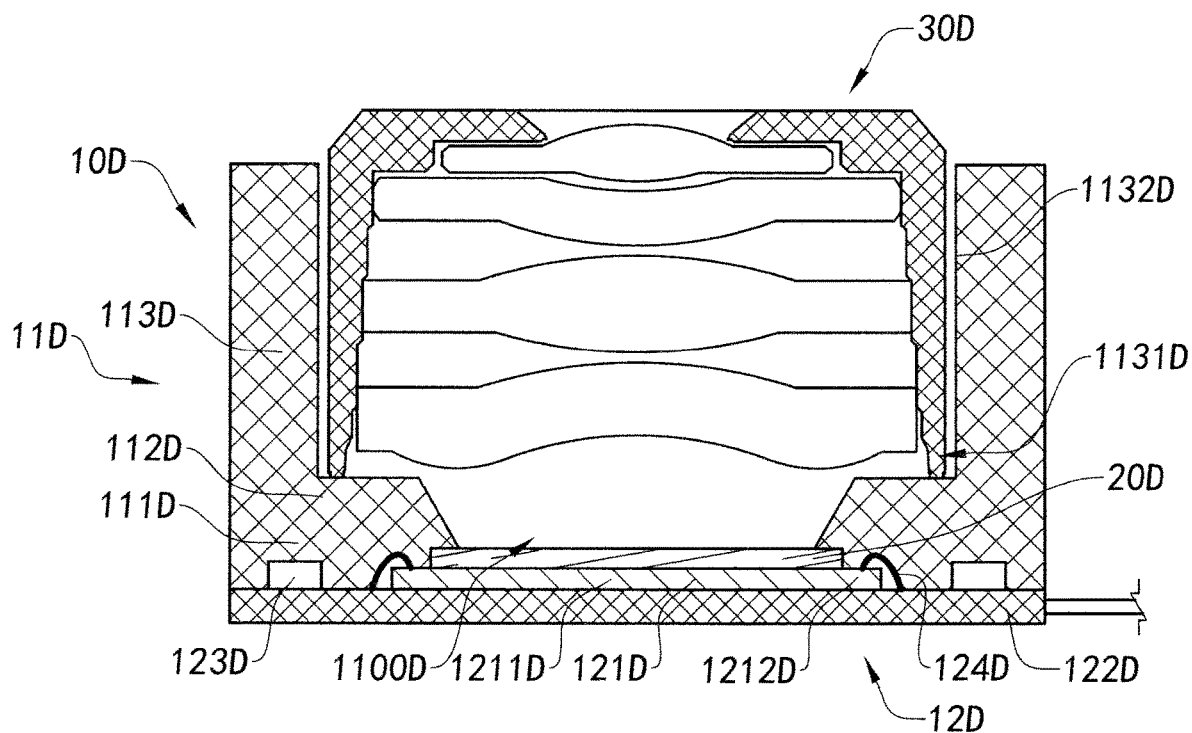
FIG. 22 is a sectional view of the camera module according to an alternative mode of the above sixth preferred embodiment of the present invention.

Referring to FIGS. 21 and 22, the photosensitive unit and camera module according to a sixth preferred embodiment of the present invention are illustrated. The photosensitive unit 10D is adapted for assembling and producing camera module to achieve the molded camera module. The photosensitive unit 10D includes an encapsulation portion 11D and a photosensitive portion 12D, wherein the encapsulation portion 11D is molded to connect to the photosensitive portion 12D.

Especially, the encapsulation portion is molded to couple to the photosensitive portion 12D with the method of MOC.

The photosensitive portion 12D includes a main circuit board 122D and a photosensitive sensor 121D, wherein the photosensitive sensor 121D is disposed on the main circuit board 122D. According to the present sixth embodiment of the present invention, the photosensitive sensor 121D is molded to connect to the main circuit board 122D.

According to the present sixth embodiment of the present invention, the photosensitive portion 12D includes a connecting circuit (not shown in the figures) and at least a circuit element 123D. The connecting circuit is preinstalled in the main circuit board 122D. The circuit element 123D is electrically connected to the connecting circuit and the photosensitive sensor 121D to enables the photosensitive sensor 121D to perform the photosensing process thereof. The circuit element 123D is protrudingly deployed on the main circuit board 122D. The circuit element 123D can be, for example but not limited to, resistors, capacitors, diodes, triodes, potentiometers, electric relays, or actuators. It is worth mentioning that the encapsulation portion 11D encapsulates and wraps up the circuit element 123D therein, so that the circuit element 123D will not be directly exposed in the open space, and more specifically, not be exposed in the environment that communicates with the photosensitive sensor 121D. Therefore, during the assembling of the camera module, the circuit element 123D will not be contaminated by pollutants, such as dusts, or influence the photosensitive sensor 121D, which is different from the arrangement of the conventional camera module that the circuit element 123D, such as resistance-capacitance components, is exposed outside. The use of the molding encapsulating and wrapping method prevents sundries and dusts from staying on the surface of the circuit element 123D and avoids the photosensitive sensor 121D from being contaminated and causing dark spots and other defectives of the camera module.

The encapsulation portion 11D forms a window 1100D to provide a photosensitive path for the photosensitive sensor 121D.

According to the present sixth preferred embodiment of the present invention, the photosensitive portion 12D includes at least one connecting element 124D for electrically connecting the photosensitive sensor 121D with the main circuit board 122D. Further, each of the connecting elements 124D can be embodied as, specifically but not limited to, gold wire, copper wire, aluminum wire, and/or silver wire.

It is worth mentioning that each connecting element 124D is molded to be in the encapsulation portion 11D, so as to utilize the encapsulation portion 11D to enclose, case and/or wrap up each of the connecting element(s) 124D and keep them from direct exposure to the outside. Therefore, during the assembling of the camera module, the connecting element(s) 124D will not suffer any collision or damage, that, at the same time, reduces the impact due to the environmental factors, such as temperature, on the connecting element 124D and stabilizes the communication and connection between the photosensitive sensor 121D and the main circuit board 122D. This is basically failed to be provided in the traditional art.

It is worth mentioning that the encapsulation portion 11D encapsulates and wraps up the circuit element 123D and the connecting element 124D, providing advantages in protecting the circuit element 123D and the connecting element 124D as well as obtaining a higher performance camera module. However, those skilled in the art should understand that the encapsulation portion 11D shall not be limited in encapsulating and wrapping up the circuit elements 123D and/or the connecting element 124D. In other words, in other embodiments of the present invention, the encapsulation portion 11D can be directly molded on the main circuit board 122D without protruded circuit element 123D thereon or be molded on various positions, such as the outer sides, periphery, and etc., of the circuit element 123D.

The photosensitive unit 10D further includes an optical filter 20D, wherein the optical filter 20D is molded to overlappedly disposed above the photosensitive sensor 121D. The edges of the optical filter 20D is molded by the encapsulation portion 11D that holds the optical filter 20D in position. It is worth mentioning that the optical filter 20D covers the photosensitive sensor 121D and insulates the photosensitive sensor 121D from the external environment to protect the photosensitive sensor 121D from damage and prevent dusts from entering therein.

In addition, the photosensitive sensor 121D has a photosensitive area 1211D and a non-photosensitive area 1212D, wherein the non-photosensitive area 1212D is positioned surrounding the periphery of the photosensitive area 1211D. The photosensitive area 1211D is adapted for conducting photosensitization. The connecting element 124D is connected to the non-photosensitive area 1212D.

According to the sixth preferred embodiment of the present invention, the encapsulation portion 11D is extended to the non-photosensitive area 1212D of the photosensitive sensor 121D, so as to overlappedly mount the photosensitive sensor 121D on the main circuit board 122D by means of molding. In this manner, such as by the method of Molding on Chip (MOC), the moldable area of the encapsulation portion 11D can be extended inwardly, such that the structural portion of the outer portion of the encapsulation portion 11D and the main circuit board 122D can be reduced, that further reduces the size in length and width of the molded photosensitive portion 12D and reduces the size in length and width of the camera module assembled thereby.

In the present sixth embodiment of the present invention, the encapsulation portion 11D is protruded to position surrounding the outside of the photosensitive area 1211D of the photosensitive sensor 121D. Particularly, the encapsulation portion 11D integrally encloses all connection of the photosensitive sensor 121D and the circuit elements 123D with the main circuit board 122D, so as to provide a good sealingness and tightness. Therefore, when the photosensitive unit 10D is used in assembling the camera module, the photosensitive sensor 121D has been sealed inside to form a sealed inner space.

Particularly, in producing the photosensitive unit 10D, a conventional circuit board can be used to make the main circuit board 122D. The photosensitive sensor 121D is deployed on the main circuit board 122D and electrically connected by the connecting elements 124D. Then, after the main circuit board 122D and the photosensitive sensor 121D are initially assembled, they are processed by Surface Mount Technology (SMT) and then molded by the insert molding technique, for example by means of an injection molding machine, to form the encapsulation portion 11D, or molded by the pressing molding technique, which is commonly applied in semiconductor packaging, to form the encapsulation portion 11D. The main circuit board 122D can selectively be, for example but not limited to, rigid-flex board, ceramic substrate (without flexible board), or rigid PCB (without flexible board). The formation of the encapsulation portion 11D can be selected by, for example but not limited to, injection molding technique and pressing molding technique. The material of the encapsulation portion 11D can be, for example but not limited to, nylon, liquid crystal polymer (LCP), or polypropylene (PP) for injection molding technique, or resin for pressing molding technique. Person skilled in the art should understand that the above available manufacture methods and available materials are examples to describe available implementations of the present invention, rather than limitations of the present invention.

Furthermore, the encapsulation portion 11D includes a covering section 111D, an optical filter installing section 112D and a camera lens installing section 113D. The optical filter installing section 112D and the camera lens installing section 113D are molded with the covering section 111D in order to form an integral body. The covering section 111D is molded on the main circuit board 122D to wrap up and enclose the circuit element 123D and the connecting element 124D. The optical filter installing section 112D of the encapsulation portion 11D extends to encapsulate and wrap up outer portion of the optical filter 20D to integrally install the optical filter 20D on top of the photosensitive sensor 121D. The camera lens installing section 113D is integrally and extended from the optical filter installing section 112D to form a tubular body for mounting a camera lens 30D therein. In other words, when the photosensitive unit 10D is used in assembling the camera module, the camera lens 30D is mounted within the camera lens installing section 113D of the encapsulation portion 11D, which provides a stable mounting site for the camera lens 30D. The camera lens installing section 113D defines a lens installing grooves 1131D. The lens installing groove 1131D is communicated with the window 1100D and provides adequate installation space for the camera lens 30D. In other words, the encapsulation portion 11D provides an installing groove 1121D in the optical filter installing section 112D and the lens installing groove 1131D in the camera lens installing section 113D. The optical filter 20D is molded in the installing groove 1121D. The camera lens 30D is installed in the lens installing groove 1131D.

The camera lens installing section 113D is integrally extended upwards as shown in FIGS. 21 and 22 to form a step structure therein, so as to provide a supportive mounting site for the camera lens 30D, so that it does not require extra component for the installation of the camera lens 30D. In other words, the encapsulation portion 11D is molded to integrally extend from the main circuit board 122D and form an internal step shape structure to encapsulate and to support the camera lens 30D.

The tubular camera lens installing section 113D has a camera lens inner wall 1132D. The camera lens inner wall 1132D is in close ring shape and adapted for providing an installation room for the camera lens 30D. It is worth mentioning that the surface of the camera lens inner wall 1132D of the camera lens installing section 113D is flat and smooth, which is adapted for installing the camera lens 30D that is thread less to form a fixed focus module. Particularly, the camera lens 30D can be secured in the camera lens installing section 113D by adhering.

It is worth mentioning that the inner wall of the covering section 111D of the encapsulation portion 11D can be shaped according to the shape of the object to be connected. For example, it can be inclined and slope shape, so that the encapsulation portion 11D not only encapsulates and wrap up the connecting elements 124D, but also ensure the photosensitive sensor 121D can receive more light through the window 1100D. Person skilled in the art should understand that specific shape of the encapsulation portion 11D shall not confine the present invention.

Referring to FIG. 22, the camera module according to the sixth preferred embodiment of the present invention can be a fixed focus module. The camera module includes one the photosensitive unit 10D and one the camera lens 30D.

More specifically, the camera lens 30D is installed in the camera lens installing groove 1131D of the camera lens installing section 113D of the encapsulation portion 11D of the photosensitive unit 10D. The optical filter 20D is molded on the photosensitive unit 11D. Therefore, no additional independent optical filter is required and it is unnecessary to further separately install the optical filter when assembling the camera module. Hence, the assembling processes can be reduced and the back focal length of the camera module can be decreased due to the molded optical filter arrangement of the present invention.

It is also worth mentioning that the camera lens 30D is supported in the camera lens installing section 113D of the encapsulation portion 11D of the photosensitive unit 10D. Therefore, the encapsulation portion 11D would be functioned as the mounting frame or lens barrel of the conventional camera module to provide a supportive and holding site, but the present invention is assembled by different technical process from conventional COB technology. The mounting frame of the conventional camera module based on conventional COB technique is affixed on the circuit board by adhesive, but the encapsulation portion 11D of the present invention is affixed on the main circuit board 122D by means of molding technique that does not require the adhering and affixing process. The molding method with respect to the conventional adhering and affixing method has better connection stability and technological process controllability. Besides, it does not have to reserve any adhesive space between the encapsulation portion 11D and the main circuit board 122D for AA adjustment, and thus saves the adhesive space of AA adjustment for conventional camera module, that allows the thickness of the camera module to be further reduced. Also, the encapsulation portion 11D according to the molding arrangement of the present invention has better smoothness and evenness, so that when assembling the camera module, it is unnecessary to conduct AA adjustment. Furthermore, the encapsulation portion 11D, which encapsulates and wraps the circuit elements 123D and the connecting elements 124D therein, allows the function of the conventional mounting frame, the circuit elements 123D and the connecting element 124D being spatially overlapped by molding to fill all the space between the components including the circuit elements 123D and the connecting elements 124D to form a solid body, that is distinctive from the conventional camera module that requires to reserve safety distance around all the circuit components. As a result, the height of the encapsulation portion 11D that can be functioned as the mounting frame can be arranged in a smaller range, so as to further provide room for reducing the thickness of the camera module. Besides, the encapsulation portion 11D eliminates the conventional mounting frame but provides installing site for the camera lens 30D by itself, that avoids any tilt deviation generally occurred in attaching and assembling the conventional mounting frame and reduces the accumulated tolerance during the assembling of the camera module. In addition, the encapsulation portion 11D, which encapsulates and wraps up the connecting element 124D, extends to the non-photosensitive area 1212D of the photosensitive sensor 121D to allow the encapsulation portion 11D to shrink inwardly, so as to further decrease the lateral sizes in length and width of the camera module.

Figure 23:
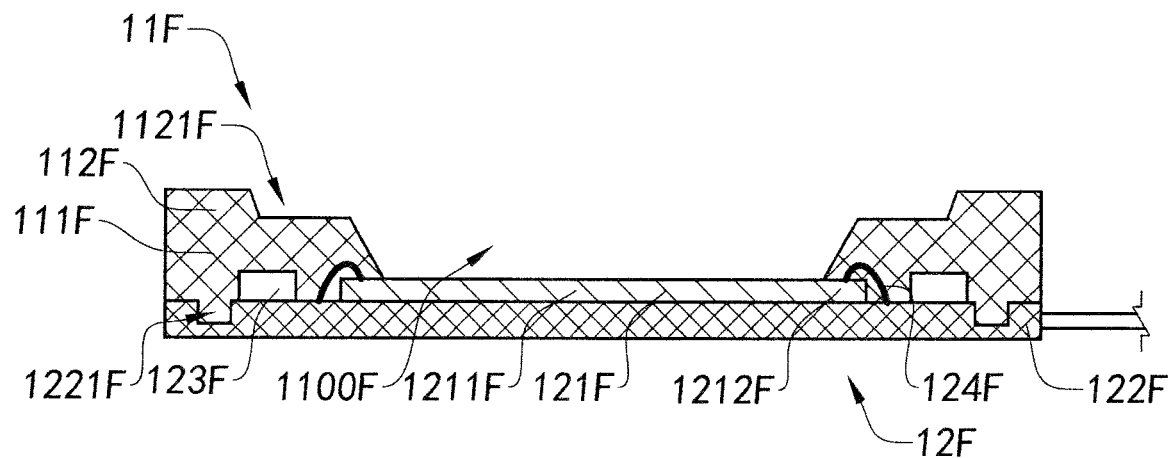
FIG. 23 is a sectional view of a photosensitive unit according to a seventh preferred embodiment of the present invention.
Figure 24:
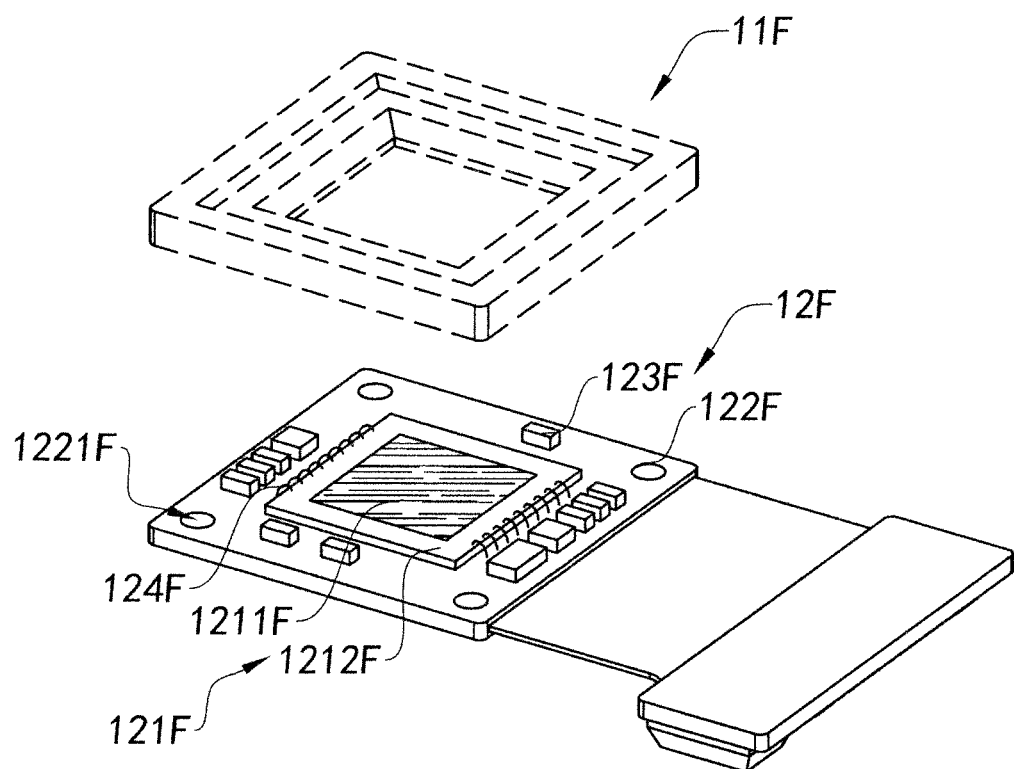
FIG. 24 is an exploded perspective view of a photosensitive unit according to the above seventh preferred embodiment of the present invention.

Referring to FIGS. 23 and 24, a photosensitive unit according to a seventh preferred embodiment of the present invention is illustrated. The photosensitive unit 10F is used for assembling and producing of camera module, so as to achieve a molded camera module. The photosensitive unit 10F includes an encapsulation portion 11F and a photosensitive portion 12F, wherein the encapsulation portion 11F is molded with the photosensitive portion 12F to form an integral body.

The photosensitive portion 12F includes a main circuit board 122F and a photosensitive sensor 121F, wherein the photosensitive sensor 121F is disposed on the main circuit board 122F. According to the present embodiment of the present invention, the photosensitive sensor 121F is molded to connect to the main circuit board 122F.

According to the present seventh embodiment of the present invention, the photosensitive portion 12F includes a connecting circuit (not shown in the figures) and at least a circuit element 123F. The connecting circuit is preinstalled in the main circuit board 122F. The circuit element(s) 123F is electrically connected to the connecting circuit and the photosensitive sensor 121F, so that the photosensitive sensor 121F is capable of processing its photosensing processes. The circuit element 123F is protrudingly deployed on the main circuit board 122F. The circuit element 123F can be, for example but not limited to, resistors, capacitors, diodes, triodes, potentiometers, electric relays, or actuators.

It is worth mentioning that the encapsulation portion 11F encapsulates and wraps up the circuit elements 123F therein, so that the circuit elements 123F will not be directly exposed in the open space, and more specifically, not be exposed in the environment that communicates with the photosensitive sensor 121F. Therefore, during assembling of the camera module, the circuit element 123F will not be contaminated by pollutants, such as dusts, or influence the photosensitive sensor 121F, that is different from the arrangement of the conventional camera module that the circuit elements 123F, such as resistance-capacitance components, are exposed to the open space. The usage of the molding method prevents sundries and dusts from staying on the surface of the circuit element 123F and avoids the photosensitive sensor 121F from being contaminated and causing dark spots and other defectives of the camera module.

The encapsulation portion 11F forms a window 1100F to provide a photosensitive path for the photosensitive sensor 121F.

According to the present preferred embodiment of the present invention, the photosensitive portion 12F includes at least one connecting element 124F for electrically connecting the photosensitive sensor 121F with the main circuit board 122F. Further, each of the connecting elements 124F can be embodied to be, specifically but not limited to, gold wire, copper wire, aluminum wire, and/or silver wire.

It is worth mentioning that each connecting element 124F is molded inside the encapsulation portion 11F, so that the encapsulation portion 11F encloses, encapsulates and/or wraps up each of the connecting elements 124F by filling all spaces between them and keeps them from direct exposure to the outside. Therefore, during the assembling of the camera module, the connecting element(s) 124F will not suffer any collision or damage, that, at the same time, reduces the impact from the environmental factors, such as temperature, on the connecting element 124F and stabilizes the communication and connection between the photosensitive sensor 121F and the main circuit board 122F. This is not being provided in the conventional art.

It is worth mentioning that the encapsulation portion 11F encapsulates and wraps up the circuit element(s) 123F and the connecting element(s) 124F, which advantages in protecting the circuit element(s) 123F and the connecting element(s) 124F as well as obtaining a higher performance camera module. However, those skilled in the art should understand that the encapsulation portion 11F shall not be limited in wrapping up the circuit elements 123F and/or the connecting elements 124F. In other words, in other embodiments of the present invention, the encapsulation portion 11F can be directly molded on the main circuit board 122F that has no circuit element 123F protruded thereon or be molded on various positions, such as the outer side, periphery, etc., of the circuit element 123F.

In addition, the photosensitive sensor 121F has a photosensitive area 1211F and a non-photosensitive area 1212F, wherein the non-photosensitive area 1212F is positioned surrounding the periphery of the photosensitive area 1211F. The photosensitive area 1211F is adapted for conducting photosensitization. The connecting element 124F is connected to the non-photosensitive area 1212F.

According to the seventh preferred embodiment of the present invention, the encapsulation portion 11F is extended to mold on the non-photosensitive area 1212F of the photosensitive sensor 121F, so as to overlappedly install the photosensitive sensor 121F on the main circuit board 122F by means of molding. In this manner, such as by the method of Molding on Chip, the moldable area is extended towards the inside of the encapsulation portion 11F, such that the structural portion outside of the encapsulation portion 11F and the main circuit board 122F can be reduced, that further reduces the size in length and width of the molded photosensitive portion 12F and reduces the size in length and width of the camera module assembled thereby.

In the present seventh embodiment of the present invention, the encapsulation portion 11F is protrudingly positioned surrounding the outer portion of the photosensitive area 1211F of the photosensitive sensor 121F. Particularly, the encapsulation portion 11F integrally encloses the connection of the photosensitive sensor 121F and the main electric board 122F, so as to provide a good sealingness and tightness therefor. Therefore, when the photosensitive unit 10F is used in assembling of the camera module, the photosensitive sensor 121F will be sealed inside to form a sealed inner space.

Specifically, the production of the photosensitive unit 10F may use a conventional circuit board to be the main circuit board 122F. A photosensitive sensor 121F is deployed on the main circuit board 122F and electrically connected by the connecting element(s) 124F. Then, after the initial assembling of the main circuit board 122F and the photosensitive sensor 121F by molding, the main circuit board 122F and the photosensitive sensor 121F connected thereon are processed by Surface Mount Technology (SMT) and then molded, for example by means of the insert molding technique, by an injection molding machine to form the encapsulation portion 11F, or by means of the pressing molding technique, which is commonly used in semiconductor packaging, to form the encapsulation portion 11F. The main circuit board 122F can selectively be, for example but not limited to, rigid-flex board, ceramic substrate (without flexible board), or rigid PCB (without flexible board). The method to form the encapsulation portion 11F can be selected from, for example but not limited to, injection molding technique and pressing molding technique. The material of the encapsulation portion 11F can be, for example but not limited to, nylon, liquid crystal polymer (LCP), or polypropylene (PP) for injection molding technique, or resin for pressing molding technique. Those skilled in the art should understand that the above available manufacture methods and available materials are examples to describe available implementations of the present invention, rather than limitations of the present invention.

Furthermore, the encapsulation portion 11F includes a covering section 111F and an optical filter installing section 112F. The optical filter installing section 112F and the covering section are molded integrally to form an integral body. The covering section 111F is molded to cover and attach on the main circuit board 122F for encapsulating, wrapping up and covering the circuit element(s) 123F and the connecting element(s) 124F. The optical filter installing section 112F is adapted for installing the optical filter 20F. In other words, when the photosensitive unit 10F is used in assembling the camera module, the optical filter 20F of the camera module is mounted at the optical filter installing section 112F, while ensuring the optical filter 20F be deployed along the photosensitive path of the photosensitive sensor 121F that does not require any additional mounting frame for the optical filter 20F. In other words, the encapsulation portion 11F of the present invention itself also functions as a conventional mounting frame. In addition, taking advantage of the molding technique, the top of the optical filter installing section 112F can be molded to have good flatness and evenness, so as to allow the optical filter 20F to be evenly installed thereon. This feature is superior to the conventional camera modules.

Furthermore, the optical filter installing section 112F has an installing groove 1121F provided therein. The installing groove 1121F communicates with the window 1100F to provide adequate installation space for the optical filter 20F, such that the optical filter 20F will not protrude from the top surface of the optical filter installing section 112F. In other words, the top of the encapsulation portion 11F with the installing groove 1121F provided therein is adapted for the optical filter 20F to be installed on the encapsulation portion 11F without protruding out from the top of the encapsulation portion 11F.

It is worth mentioning that the inner wall of the encapsulation portion 11F can be shaped with respect to the object such as the optical filter to be connected. For example, it can be in an inclined or slope shape, so that while the connecting elements 124F are encapsulated and wrapped, the photosensitive sensor 121F can still receive more light through the window 1100F and the installing groove 1121F. Those skilled in the art should understand that specific shape of the encapsulation portion 11F shall not confine the present invention.

The different between this seventh preferred embodiment with the other preferred embodiments of the present invention, one or more reinforced holes 1221F are formed on top of the main circuit board 122F and the bottom of the encapsulation portion 11F is molded to extend into the reinforced holes 1221F, so as to enhance the structural strength of the main circuit board 122F and connection of the main circuit board 122F and the encapsulation portion 11F. In other words, the combination of two different materials of the main circuit board 122F and the encapsulation portion 11F forms a combined composite structure that can enforce the structural strength of the main circuit board 122F as a base body.

The positions of the reinforced holes 1221F can be determined based on practical needs and arranged according to the need of the structural strength of the circuit board, for example a symmetrical arrangement. By reinforcing the structural strength of the main circuit board 122F with such reinforced holes 1221F which are filled with the encapsulation portion 11F, the thickness of the main circuit board 122F and the thickness of the camera module assembled thereof can thus be reduced. Besides, the heat dissipative ability of the photosensitive unit 10F is enhanced as well.

It is worth mentioning that, according to the present seventh preferred embodiment of the present invention, the reinforced holes 1221F are indented slots that avoid the molding material of the encapsulation portion 11F from leaking through the reinforced holes 1221F when molding to make the photosensitive unit 10F.

Similar to the above preferred embodiments, the photosensitive unit 10F can be assembled for a fixed focus module or zoom lens module. Those skilled in the art should understand that the assembling and application ways of the photosensitive unit 10F shall not considered be limitations of the present invention.

Figure 25:
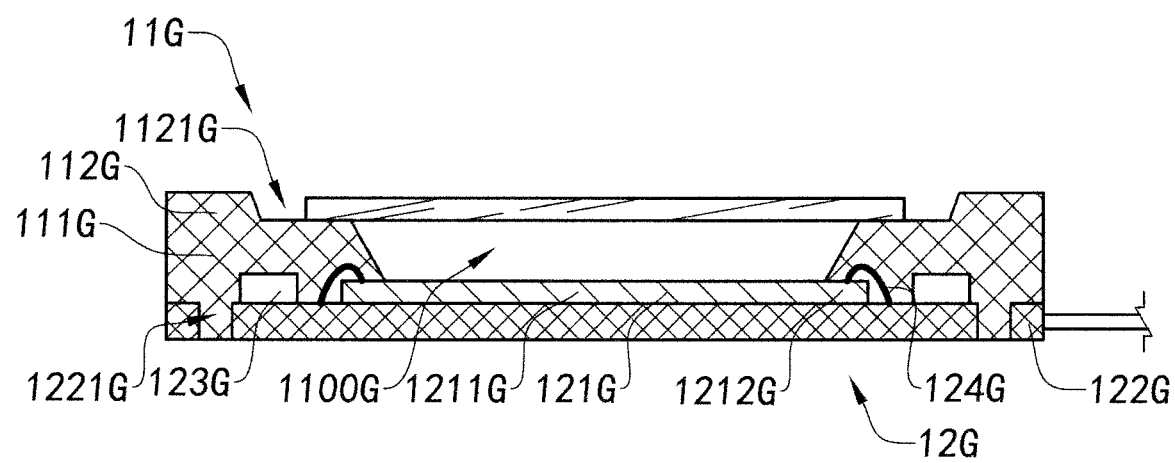
FIG. 25 is a sectional view of a photosensitive unit of the camera module according to an eighth preferred embodiment of the present invention.

Referring to FIG. 25, a photosensitive unit according to a eighth preferred embodiment of the present invention is illustrated. The photosensitive unit 10G is adapted for assembling and producing camera module, so as to obtain the molded camera module. The photosensitive unit 10G includes an encapsulation portion 11G and a photosensitive portion 12G, wherein the encapsulation portion 11G is molded to connect with the photosensitive portion 12G.

The photosensitive portion 12G includes a main circuit board 122G and a photosensitive sensor 121G, wherein the photosensitive sensor 121G is disposed on the main circuit board 122G. According to the present eighth embodiment of the present invention, the photosensitive sensor 121G is molded to connected to the main circuit board.

According to the present eighth embodiment of the present invention, the photosensitive portion 12G includes a connecting circuit (not shown in the figures) and at least a circuit element 123G. The connecting circuit is preinstalled in the main circuit board 122G. The circuit element(s) 123G is electrically connected to the connecting circuit and the photosensitive sensor 121G, wherein the photosensitive sensor 121G is arranged to process its photosensing processes. The circuit element 123G is protrudingly deployed on the main circuit board 122G. The circuit element 123G can be, for example but not limited to, resistors, capacitors, diodes, triodes, potentiometers, electric relays, or actuators.

It is worth mentioning that the encapsulation portion 11G encapsulates and wraps up the circuit element(s) 123G therein, so that the circuit element(s) 123G will not be directly exposed in the open space, and more specifically, not be exposed in the environment that communicates with the photosensitive sensor 121G. Therefore, during assembling the camera module, the circuit element 123G will not contaminated pollutants, such as dusts, or influence the photosensitive sensor 121G, which is different from the arrangement of conventional camera module that its circuit elements 123G, such as resistance-capacitance components, are exposed to outside. The use of the molding method in the present invention prevents sundries and dusts from staying on the surface of the circuit element(s) 123G and avoids the photosensitive sensor 121G from being contaminated and causing dark spots and other defectives of the camera module.

The encapsulation portion 11G forms a window 1100G to provide a photosensitive path for the photosensitive sensor 121G.

According to the present preferred embodiment of the present invention, the photosensitive portion 12G includes at least one connecting element 124G for electrically connecting the photosensitive sensor 121G with the main circuit board 122G. Further, each of the connecting elements 124G can be embodied to be, specifically but not limited to, gold wire, copper wire, aluminum wire, and/or silver wire.

It is worth mentioning that each connecting element 124G is molded inside the encapsulation portion 11G so that the encapsulation portion 11G encloses, encapsulates and/or wraps up the connecting elements 124G and keep them from direct exposure to the outside. Therefore, during assembling the camera module, the connecting element(s) 124G will not suffer any collision or damage, that, at the same time, reduces the impact due to the environmental factors, such as temperature, on the connecting elements 124G and stabilizes the communication and connection between the photosensitive sensor 121G and the main circuit board 122G. This is generally failed to be provided in the conventional art.

It is worth mentioning that the encapsulation portion 11G encapsulates and wraps up the circuit element(s) 123G and the connecting element(s) 124G, that advantages in protecting the circuit element(s) 123G and the connecting element(s) 124G as well as obtaining a better performance camera module. However, those skilled in the art should understand that the encapsulation portion 11G shall not be limited in encapsulating and wrapping up the circuit element(s) 123G and/or the connecting element(s) 124G. In other words, in other embodiments of the present invention, the encapsulation portion 11G can be directly molded on the main circuit board 122G with no protruded circuit element 123G or be molded on various positions, such as the outer side, periphery, etc., of the circuit element 123G.

In addition, the photosensitive sensor 121G has a photosensitive area 1211G and a non-photosensitive area 1212G, wherein the non-photosensitive area 1212G is positioned surrounding the periphery of the photosensitive area 1211G. The photosensitive area 1211G is adapted for conducting photosensitization. The connecting element 124G is connected to the non-photosensitive area 1212G.

According to the eighth preferred embodiment of the present invention, the encapsulation portion 11G is extended to mold on the non-photosensitive area 1212G of the photosensitive sensor 121G, so as to overlappedly mount the photosensitive sensor 121G on the main circuit board 122G by means of molding. In this manner, such as by the method of Molding on Chip, the moldable area of the encapsulation portion 11G can be extended inwardly, such that the outer structural portion of the encapsulation portion 11G and the main circuit board 122G can be reduced, which further reduces the size in length and width of the molded photosensitive portion 12G and reduces the size in length and width of the camera module assembled thereby.

In the present eighth embodiment of the present invention, the encapsulation portion 11G is protrudingly positioned surrounding the outer portion of the photosensitive area 1211G of the photosensitive sensor 121G. Particularly, the encapsulation portion 11G integrally encloses the connection of the photosensitive sensor 121G and the main circuit board 122B, so as to achieve a good sealingness and tightness. Therefore, when the photosensitive unit 10G is used in assembling the camera module, the photosensitive sensor 121G is sealed inside to form a sealed inner space.

Specifically, the production of the photosensitive unit 10G may use a conventional circuit board to make the main circuit board 122G. The photosensitive sensor 121G is deployed on the main circuit board 122G and electrically connected by the connecting element(s) 124G. Then, after the initial assembling of the main circuit board 122G and the photosensitive sensor 121G, they are processed by Surface Mount Technology (SMT) and then molded, for example by means of the insert molding technique by an injection molding machine, to form the encapsulation portion 11G, or by means of the pressing molding technique, which is commonly applied in semiconductor packaging, to form the encapsulation portion 11G. The main circuit board 122G can selectively be, for example but not limited to, rigid-flex board, ceramic substrate (without flexible board), or rigid PCB (without flexible board). The method to form the encapsulation portion 11G can be selected from, for example but not limited to, injection molding technique and pressing molding technique. The material of the encapsulation portion 11G can be, for example but not limited to, nylon, liquid crystal polymer (LCP), or polypropylene (PP) for injection molding technique, or resin for pressing molding technique. Those skilled in the art should understand that the above available manufacture methods and available materials are examples to describe available implementations of the present invention, rather than limitations of the present invention.

Furthermore, the encapsulation portion 11G includes a covering section 111G and an optical filter installing section 112G. The optical filter installing section 112G is molded on top of the covering section 111G integrally. The covering section 111G is molded to attach on the main circuit board 122G for encapsulating, wrapping up and covering the circuit element(s) 123G and the connecting element(s) 124G. The optical filter installing section 112G is arranged for mounting the optical filter 20G therein. In other words, when the photosensitive unit 10G is used in assembling the camera module, the optical filter 20G of the camera module is mounted at the optical filter installing section 112G, which ensures the optical filter 20G to be deployed along the photosensitive path of the photosensitive sensor 121G and does not require any additional mounting frame for the optical filter 20G. In other words, the encapsulation portion 11G of the present invention itself also functions as a conventional mounting frame, while taking advantage of the molding technique, the top of the optical filter installing section 112G has a good flatness and smoothness by molding that allows the optical filter 20G to be evenly installed thereon. This is superior to the conventional camera modules.

In addition, the optical filter installing section 112G has an installing groove 1121G formed therein. The installing groove 1121G communicates to the window 1100G to provide adequate installation space for installing the optical filter 20G, such that the optical filter 20G will not protrude from the top surface of the optical filter installing section 112G. In other words, the top of the encapsulation portion 11G having the installing groove 1121G provided therein, so that the optical filter 20G can be installed in the encapsulation portion 11G without protruding out from the top of the encapsulation portion 11G.

It is worth mentioning that the inner walls of the encapsulation portion 11G, including the inner wall of the window 1100G and the inner wall of the installing groove 1121G, can be shaped with respect to the size and shape of the object including the optical filter 20F to be connected thereto. For example, the inner wall of each of the window 1100G and the installing groove 1121G can be in inclined or slope shape, having a larger upper size and a smaller lower size, so that the photosensitive sensor 121G can receive as much light as possible when the connecting element(s) 124G is encapsulated and wrapped up in encapsulation portion 11G. Those skilled in the art should understand that specific shape of the encapsulation portion 11G shall not limit the scope of the present invention.

The different of this eighth preferred embodiment with the other preferred embodiments, the main circuit board 122G has one or more reinforced holes 1221G and the encapsulation portion 11G is molded to extend into the reinforced holes 1221G, so as to enhance the structural strength of the main circuit board 122G. In other words, the combination of two different materials forms a combined composite structure that reinforces the structural strength of the main circuit board 122G, as a base.

The positions of the reinforced holes 1221G can be determined according to the practical needs and provided according to the need of the structural strength of the main circuit board 122G. For example, the reinforced holes 1221G can be constructed in a symmetric manner. The arrangement of the reinforced holes 1221G enables the encapsulation portion 11G filling therein to reinforce the structural strength of the main circuit board 122G, which allows the thickness of the main circuit board 122G and the thickness of the camera module assembled thereof being reduced and enhances the heat dissipation ability of the photosensitive unit 10G as well.

It is worth mentioning that, according to the present eighth preferred embodiment of the present invention, the reinforced holes 1221G are through holes penetrating through the main circuit board 122G to communicate both sides of the main circuit board 122G. Therefore, during the production of the photosensitive unit 10G, the molding material of the encapsulation portion 11G can be fully bonded with the main circuit board 122G to form a more solid structure of combined composite material. Besides, the through hole type reinforced hole of this eighth preferred embodiment would be more easy to make than the indention type reinforced hole in the above seventh preferred embodiment.

Similar to the above preferred embodiments, the photosensitive unit 10G can be assembled for a fixed focus module or zoom lens module. Those skilled in the art should understand that the assembling and application ways of the photosensitive unit 10G shall not be limitations of the present invention.

Figure 26:
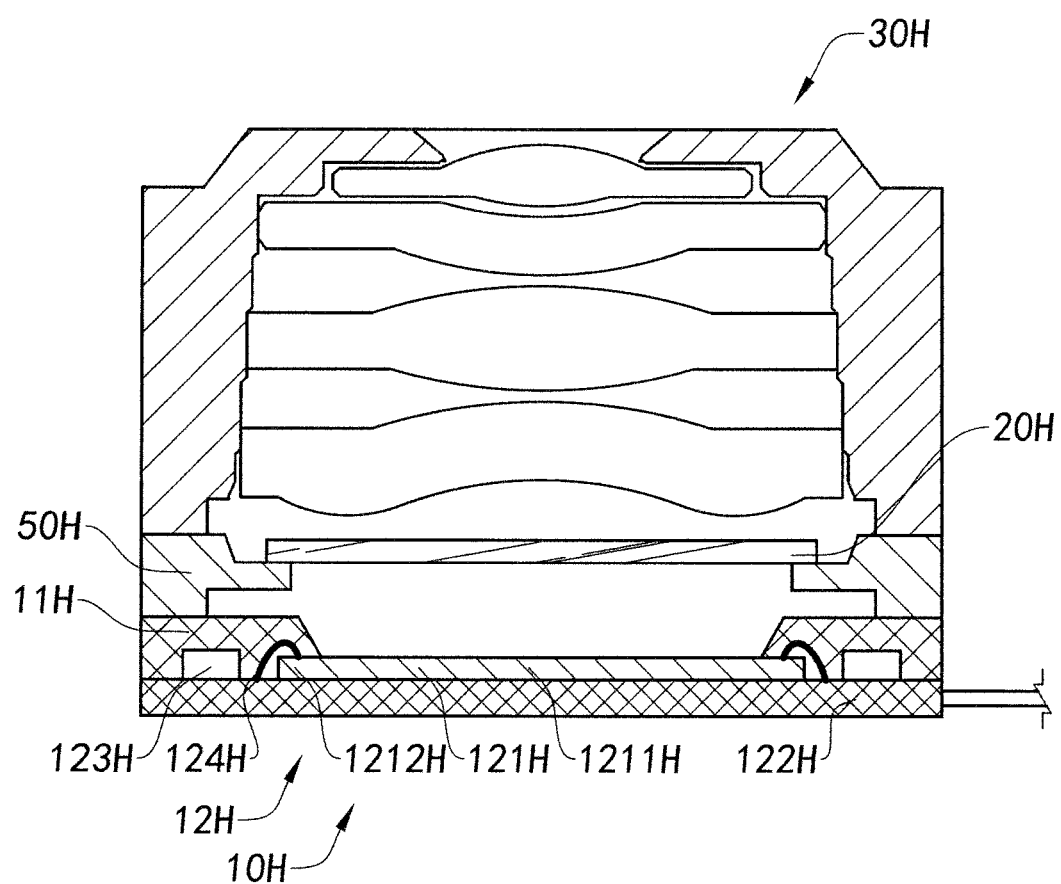
FIG. 26 is a sectional view of the camera module according to a ninth preferred embodiment of the present invention.

Referring to FIG. 26, the camera module according to a ninth preferred embodiment of the present invention is illustrated. The camera module can be a fixed focus module (FFM). The camera module includes a photosensitive unit 10H, a frame 50H, an optical filter 20H, and a camera lens 30H.

The frame 50H is mounted on the photosensitive unit 10H, wherein the optical filter 20H is mounted on the frame 50H and the camera lens 30H is mounted on the frame 50H.

The photosensitive unit 10H includes an encapsulation portion 11H and a photosensitive portion 12H, wherein the encapsulation portion 11H is molded to connect to the photosensitive portion 12H.

The photosensitive portion 12H includes a main circuit board 122H and a photosensitive sensor 121H, wherein the photosensitive sensor 121H is disposed on the main circuit board 122H. According to the present ninth embodiment of the present invention, the photosensitive sensor 121H is molded to connect to the main circuit board 122H.

According to the present ninth embodiment of the present invention, the photosensitive portion 12H includes a connecting circuit (not shown in the figures) and at least a circuit element 123H. The connecting circuit is preinstalled in the main circuit board 122H. The circuit element 123H is electrically connected to the connecting circuit and the photosensitive sensor 121H, wherein the photosensitive sensor 121H would process its photosensing processes. The circuit element 123H is protrudingly deployed on the main circuit board 122H. The circuit element 123H can be, for example but not limited to, resistors, capacitors, diodes, triodes, potentiometers, electric relays, or actuators.

It is worth mentioning that the encapsulation portion 11H encapsulates and wraps up the circuit element(s) 123H therein, so that the circuit element(s) 123H will not be directly exposed in the open space, and more specifically, not be exposed in the environment that communicates with the photosensitive sensor 121H. Therefore, during assembling the camera module, the circuit element(s) 123H will not be contaminated by pollutants, such as dusts, or influence the photosensitive sensor 121H, that is different from the arrangement of conventional camera module that the circuit element(s) 123H, such as resistance-capacitance components, are exposed to the outside. The use of the molding method prevents sundries and dusts from staying on the surface of the circuit element 123H and avoids the photosensitive sensor 121H from being contaminated and causing dark spots and other defectives of the camera module.

The encapsulation portion 11H forms a window 1100H to provide a photosensitive path for the photosensitive sensor 121H.

According to the present ninth preferred embodiment of the present invention, the photosensitive portion 12H includes at least one connecting element 124H for electrically connecting the photosensitive sensor 121H with the main circuit board 122H. Further, each of the connecting elements 124H can be embodied to b e, specifically but not limited to, gold wire, copper wire, aluminum wire, and/or silver wire.

It is worth mentioning that each connecting element 124H is molded inside the encapsulation portion 11H, wherein encapsulation portion 11H encloses, encapsulates and/or wraps up the connecting element(s) 124H and keep them from direct exposure to the outside. Therefore, during assembling the camera module, the connecting element(s) 124H will not suffer any collision or damage, that, at the same time, reduces the impact due to the environmental factors, such as temperature, on the connecting element(s) 124H and stabilizes the communication and connection between the photosensitive sensor 121H and the main circuit board 122H. This is being not provided in the conventional art.

It is worth mentioning that the encapsulation portion 11H encapsulates and wraps up the circuit element(s) 123H and the connecting element(s) 124H, which advantages in protecting the circuit element(s) 123H and the connecting element(s) 124H as well as achieving a higher performance camera module. However, those skilled in the art should understand that the encapsulation portion 11H shall not be limited in encapsulating and wrapping up the circuit element(s) 123H and/or the connecting element(s) 124H. In other words, in other embodiments of the present invention, the encapsulation portion 11H can be directly molded on the main circuit board 122H without protruded circuit element(s) 123H or be molded on various positions, such as the outer side, periphery, and etc., of the circuit element 123H.

In addition, the photosensitive sensor 121H has a photosensitive area 1211H and a non-photosensitive area 1212H, wherein the non-photosensitive area 1212H is positioned surrounding the periphery of the photosensitive area 1211H. The photosensitive area 1211H is adapted for conducting photosensitization. The connecting element 124H is connected to the non-photosensitive area 1212H.

According to the preferred embodiment of the present invention, the encapsulation portion 11H is extended to the non-photosensitive area 1212H of the photosensitive sensor 121H, so as to overlappedly mount the photosensitive sensor 121H on the main circuit board 122H by means of molding. In this manner, such as by the method of Molding on Chip (MOC), the moldable area of the encapsulation portion 11H can be extended inwardly, such that the outer structural portion of the encapsulation portion 11H and the main circuit board 122H can be reduced that further reduces the size in length and width of the molded photosensitive portion 12H and reduces the size in length and width of the camera module assembled thereby.

In the present ninth embodiment of the present invention, the encapsulation portion 11H is protrudingly positioned surrounding the outer portion of the photosensitive area 1211H of the photosensitive sensor 121H. Particularly, the encapsulation portion 11H integrally the connection of the photosensitive sensor 121H and the main circuit board 122H, so as to provide a good sealingness and tightness. Therefore, when the photosensitive unit 10H is used in assembling the camera module, the photosensitive sensor 121H will be sealed to form a sealed inner space.

Specifically, the production of the photosensitive unit 10H may use a conventional circuit board to be the main circuit board 122H. The photosensitive sensor 121H is deployed on the main circuit board 122H and electrically connected by the connecting element 124H. Then, after the initial assembling the main circuit board 122H and the photosensitive sensor 121H, they are processed by Surface Mount Technology (SMT) and molded, for example, by means of the insert molding technique by an injection molding machine, to form the molded encapsulation portion 11H, or by means of the pressing molding technique, which is commonly used in semiconductor packaging, to form the molded encapsulation portion 11H. The main circuit board 122H can selectively be, for example but not limited to, rigid-flex board, ceramic substrate (without flexible board), or rigid PCB (without flexible board). The method to form the encapsulation portion 11H can be selected from, for example but not limited to, injection molding technique and pressing molding technique. The material of the encapsulation portion 11H can be, for example but not limited to, nylon, liquid crystal polymer (LCP), or polypropylene (PP) for injection molding technique, or resin for pressing molding technique. Those skilled in the art should understand that the above available manufacture methods and available materials are examples to describe available implementations of the present invention, rather than limitations of the present invention.

The encapsulation portion 11H provides an installation site for the frame 50H based on the advantage of the molding technology. The encapsulation portion 11H can be molded to achieve good flatness and evenness, so as to allow the frame 50H to be evenly and levelly installed.

It is worth mentioning that the inner wall of the encapsulation portion 11H, defining the window 1100H, can be shaped according to the need of the object, such as optical filter 20H, to be installed. For example, the inner wall can be in an inclined and slope shape, so that by the time the connecting element(s) 124H is wrapped up by the encapsulation portion 11H, the photosensitive sensor 121H can receive as much light as possible. Those skilled in the art should understand that specific shape of the encapsulation portion 11H shall not limit the scope of the present invention.

In other embodiments of the present invention, the molded circuit unit can also be assembled into an automatic focus camera module, so as to change the focal length of the camera module. Therefore, person skilled in the art should understand that the type of the camera module shall not limit the scope of the present invention.

Figure 27:
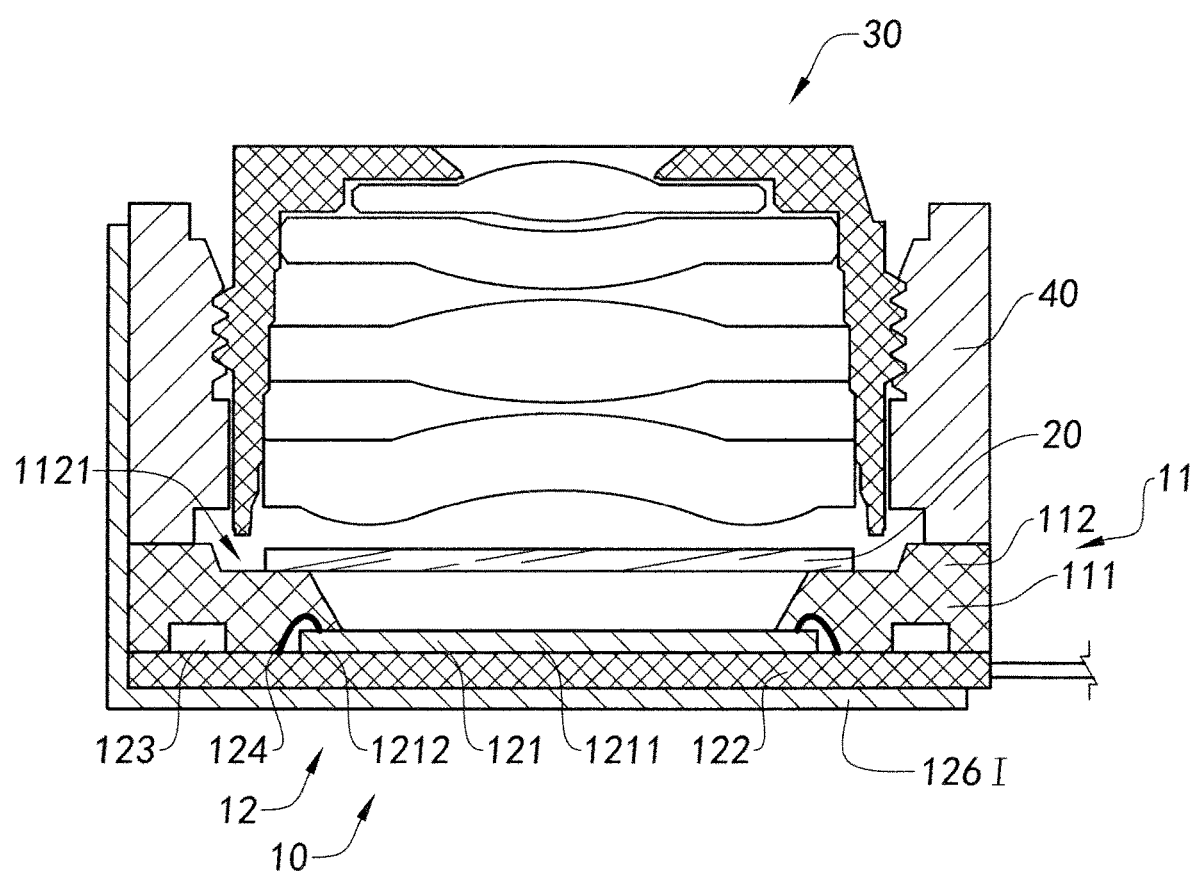
FIG. 27 is a sectional view of the camera module according to a tenth preferred embodiment of the present invention.

Referring to FIG. 27, the photosensitive unit and camera module according to a tenth preferred embodiment of the present invention are illustrated. The different of this tenth preferred embodiment with respect to the other preferred embodiments, the photosensitive unit 10 includes a shielding layer 1261 that covers the main circuit board 122 and the encapsulation portion 11, so as to not only reinforce the structural strength of the main circuit board 122, but also enhance an electromagnetic immunity ability of the photosensitive unit 10.

Furthermore, the shielding layer 1261 is a metal layer that can be made in form of plate structure or net structure.

Figure 28A:
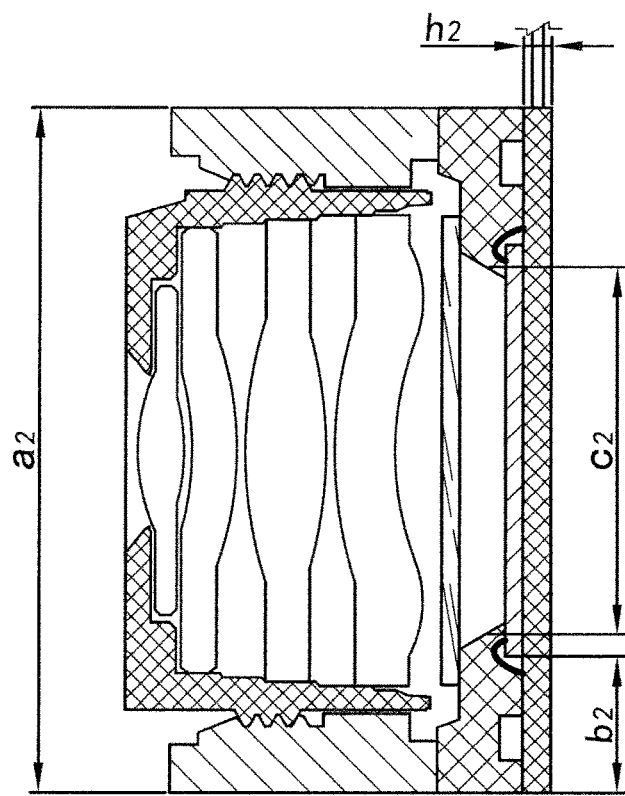
FIGS. 28A and 28B are beneficial effect comparison diagrams of the camera module according to the above preferred embodiments of the present invention.
Figure 28A:
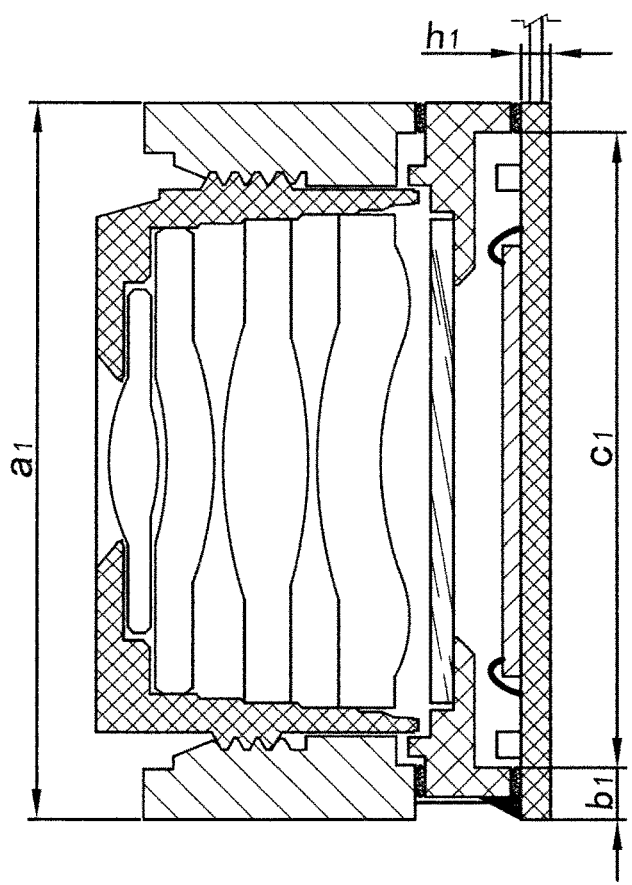
Figure 28B:
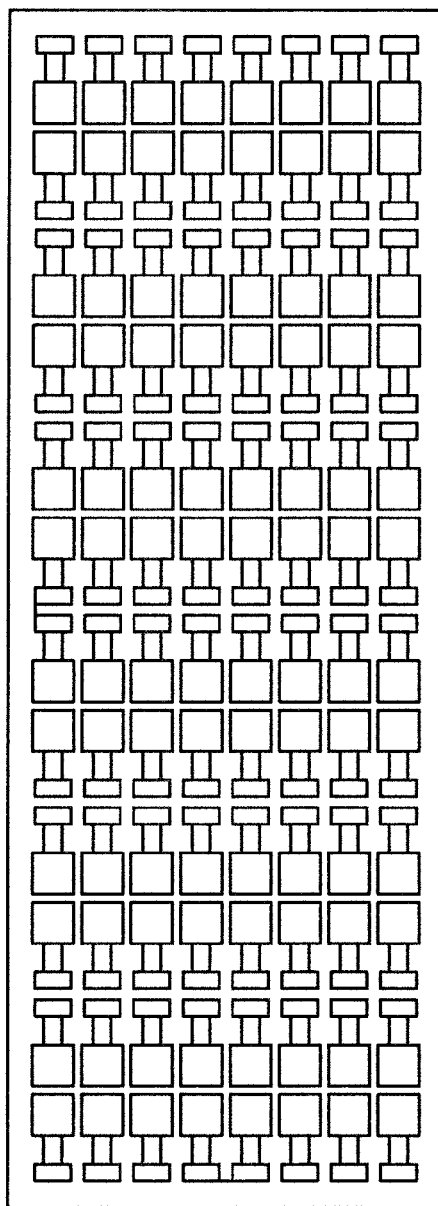
Figure 28B:
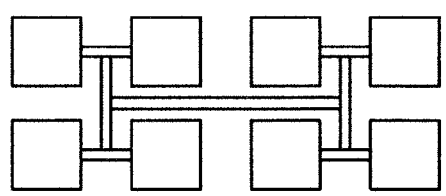
Figure 29:
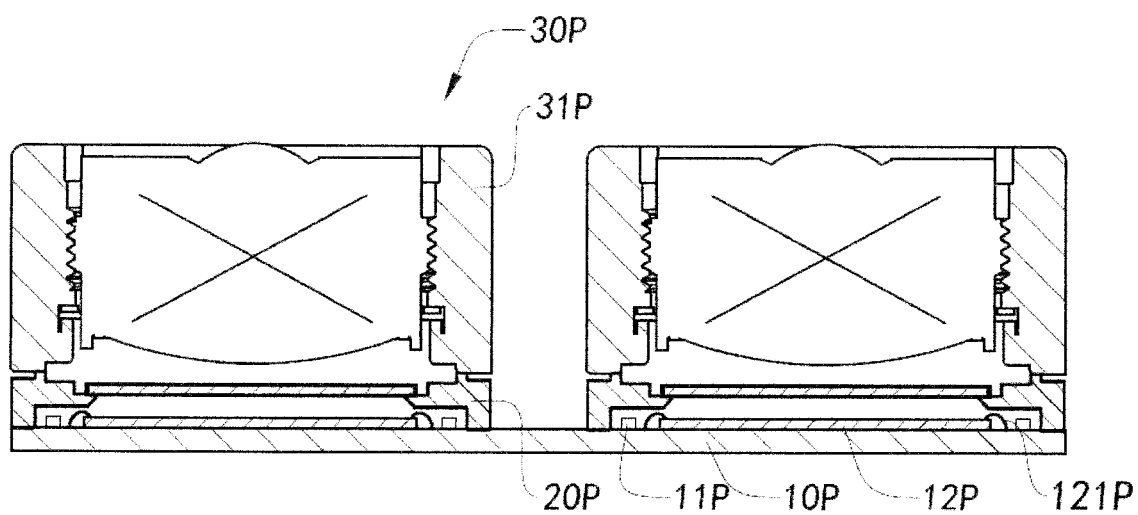
FIG. 29 is a sectional view of a conventional twin-lens camera module.

FIGS. 28A and 28B illustrate schematic comparison views of the camera module according to the above preferred embodiment of the present invention and a conventional camera module. In FIG. 28A, the conventional camera module is illustrated in the left view, while the camera module of the present invention is illustrated in the right view. In FIG. 28B, the left view refers the manufacturing of the conventional circuit board, and the right view refers the manufacturing of the photosensitive unit of the present invention.

In view of above, it is apparent that the photosensitive unit and camera module of the present invention have the following advantages:

1. The size in length and width of the camera module can be reduced, wherein the encapsulation portion and the circuit elements, such as resistance-capacitances, can be spatially overlapped. However, the mounting frame of the conventional camera module must be installed at the outer side of the capacitors and reserve a predetermined safety distance therebetween. The present invention can utilize the space of the capacitors to fill molding material around the capacitors directly.

2. The module tilt can be prevented. The encapsulation portion would substitute conventional plastic frame and decrease accumulated tolerance/deviance.

3. The molding formation enhances structural strength of the circuit board that, under the same structural strength, the circuit board can be made thinner to reduce the height of the camera module because the encapsulation portion can also provide support and increase structural strength.

4. In view of the altitude space, a safety space for assembling must be reserved between capacitors and the base in the conventional camera module. However, the molding structure of the camera module of the present invention does not require to reserve any safety space for assembling that can reduce the height of the camera module. A safety gap must also be reserved between the top of the capacitors and the frame in the conventional camera module in order to prevent interferences, but the present invention can directly fill molding material around the capacitors.

5. The resistance-capacitance components can be encapsulated and wrapped by molding, so as to avoid dark spots and defectives of the camera module caused by solder resist or dust in the resistance-capacitance area, and to increase the product yield rate.

6. The present invention is suitable for highly efficient mass production. Photosensitive unit of the present invention is more suitable for mass imposition process. According to the molding formation of the photosensitive unit of the present invention, the photosensitive unit is more suitable for imposition process. In other words, only at most 8 conventional circuit boards can be produced in one process, but more photosensitive units, as many as 80 to 90 pieces, can be molded to produce in each molding process.

Figure 30A:
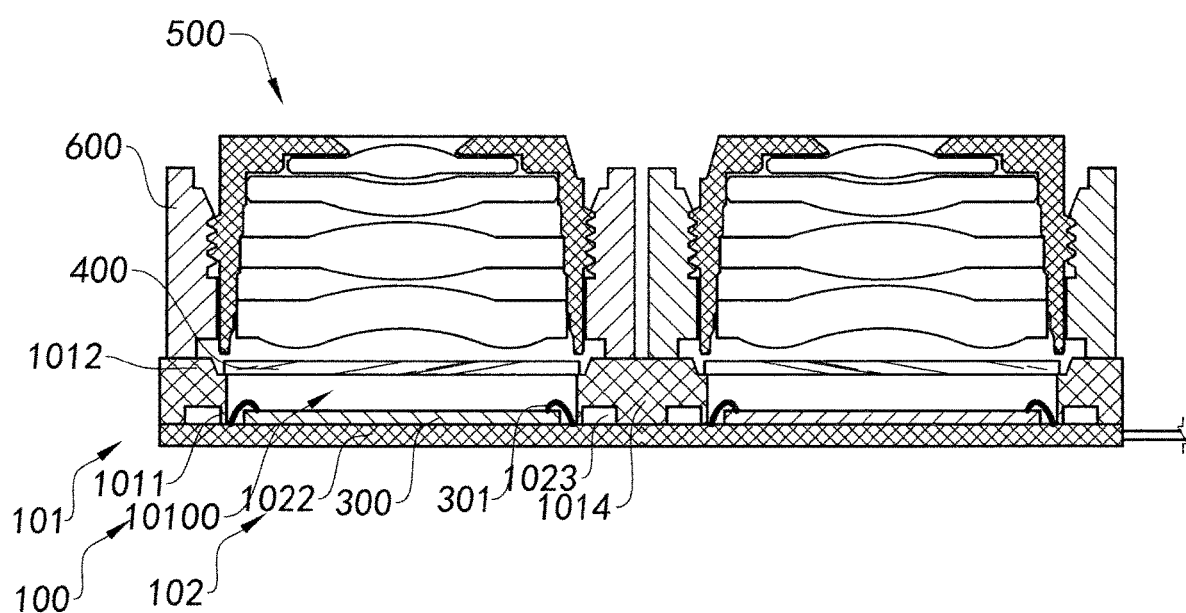
FIG. 30A is a sectional view of an array camera module with circuit unit according to an eleventh preferred embodiment of the present invention.
Figure 31:
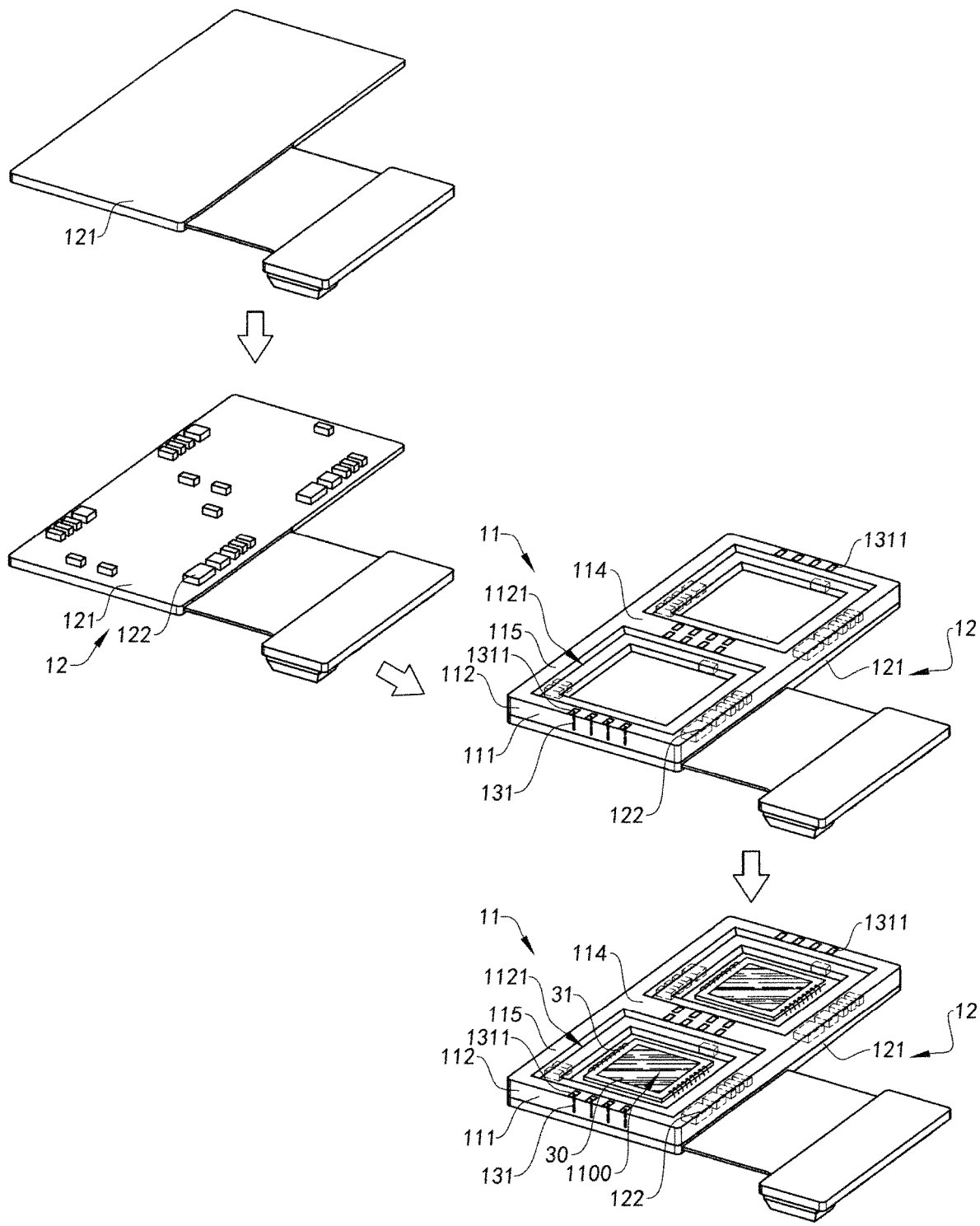
FIG. 31 is a manufacturing process diagram of a circuit unit according to the above eleventh preferred embodiment of the present invention.
Figure 32:
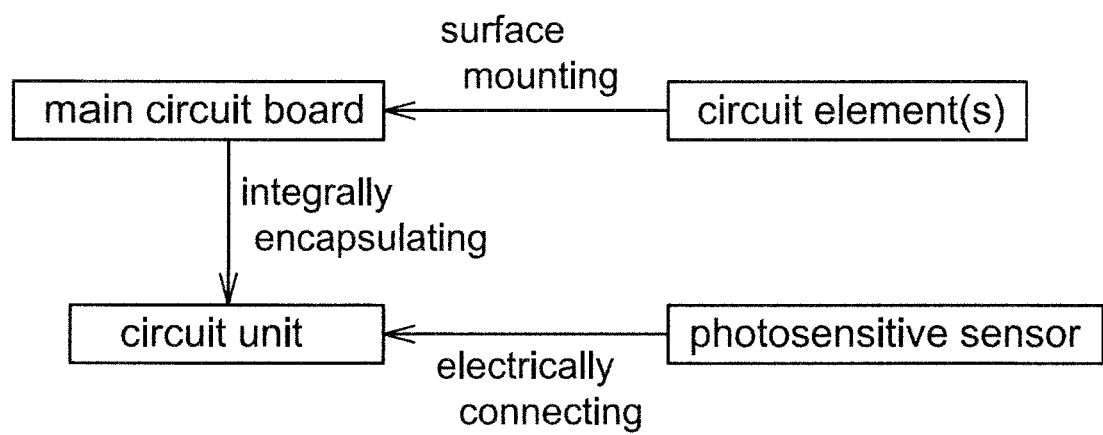
FIG. 32 is a block diagram of the circuit unit according to the above eleventh preferred embodiment of the present invention.

Referring to FIGS. 30A, 31, and 32, an array camera module and its circuit unit according to an eleventh preferred embodiment of the present invention are illustrated. The array camera module can be utilized in various electronic devices to help the users to capture images of objects or people with the array camera module. For example, the array camera module can be used to shoot image information, such as images or videos of objects or people. Preferably, the array camera module can be utilized in a mobile electronic device, for example but not limited to, smart phone, tablet PCs, and etc.

Referring to FIGS. 30A, 31, and 32, the array camera module of the present invention in the following description is embodied as a dual lens array camera module, which is an example to illustrate disclosures and advantages of an eleventh preferred embodiment of the present invention. The array camera module includes a circuit unit 100, two camera lens 500 and two photosensitive sensors 300.

It is worth mentioning that, in order to better disclose the present invention, in the present embodiment, only the array camera module with two camera lenses 500 is used as an example for the description. Nevertheless, in other embodiments of the present invention, the quantity of the camera lens 500 and photosensitive sensor 300 can be more, which, for example three or more. Person skilled in the art should understand that the lens quantity shall not be a limitation of the array camera module of the present invention.

Furthermore, the photosensitive sensors 300 are both mounted on the circuit unit 100 and the two camera lenses 500 are also mounted on the circuit unit 100, wherein the two camera lenses 500 are arranged at the corresponding positions along the photosensitive paths of the two photosensitive sensor 300 respectively. The circuit unit 100 can be coupled to the electronic device. Those skilled in the art should understand that one the camera lens 500 and one the photosensitive sensor 300 are coordinated with each other for capturing images. Specifically, the light reflected from the shooting target, such as an object or person passes through the camera lens 500 and is received by the photosensitive sensor 300 for photoelectric conversion. In other words, the photosensitive sensor 300 is able to convert light signal into electrical signal and the electrical signal is able to be transmitted to the electronic device through the circuit unit 100, such that the electronic device can generate image corresponding to the shooting target accordingly.

The circuit unit 100 includes an integral conjoined encapsulation portion 101 and a circuit board portion 102, wherein the conjoined encapsulation portion 101 is integrally encapsulated to connect to the circuit board portion 12, such as being molded to connect to the photosensitive portion 12. More specifically, the conjoined encapsulation portion 101 is moldingly connected to the circuit board portion 102 by means of the Molding On Board (MOB) technique.

The circuit board portion 102 includes a main circuit board 1022. The conjoined encapsulation portion 101 has two windows 10100 provided therein, wherein the conjoined encapsulation portion 101 is positioned surrounding the outer sides of the two photosensitive sensors 300 while the two windows 10100 provide two light paths for the two camera lenses 500 corresponding to the two photosensitive sensors 300 respectively. The two photosensitive sensors 300 are mounted on the main circuit board 1022 at the positions with respect to the two windows 10100 respectively.

Figure 33A:
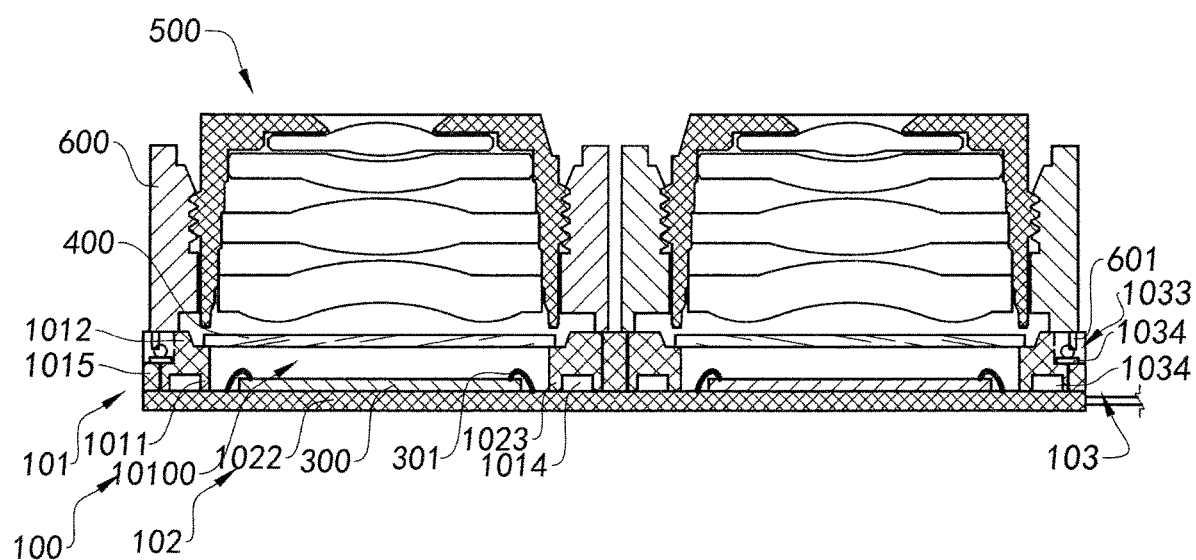
FIGS. 33A, 33B, and 33C illustrate different alternative modes of the motor connecting structure of the molded circuit unit according to the above eleventh preferred embodiment of the present invention.
Figure 33B:
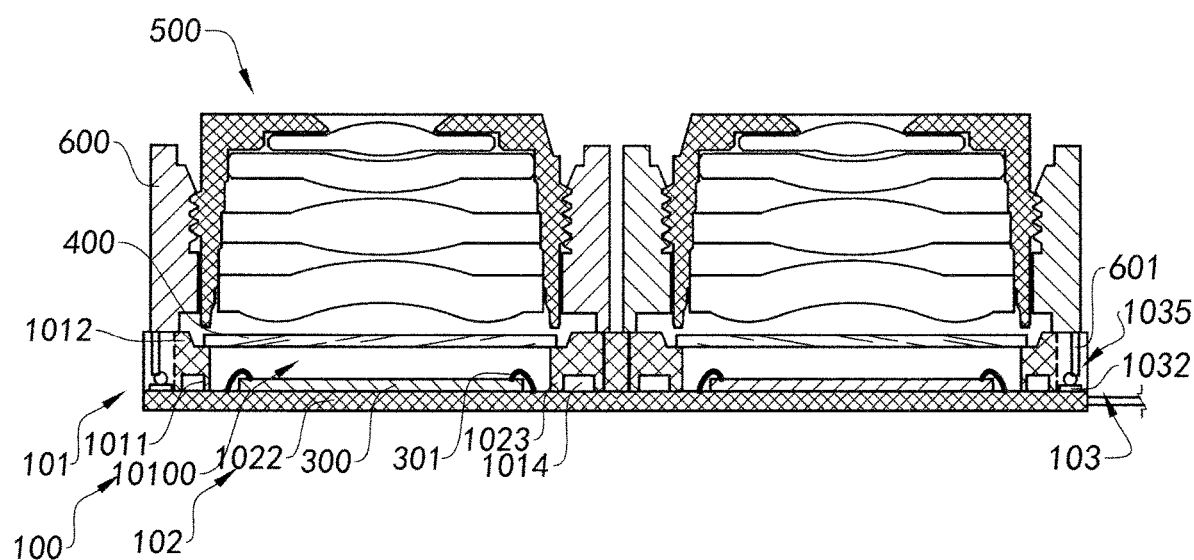
Figure 33C:
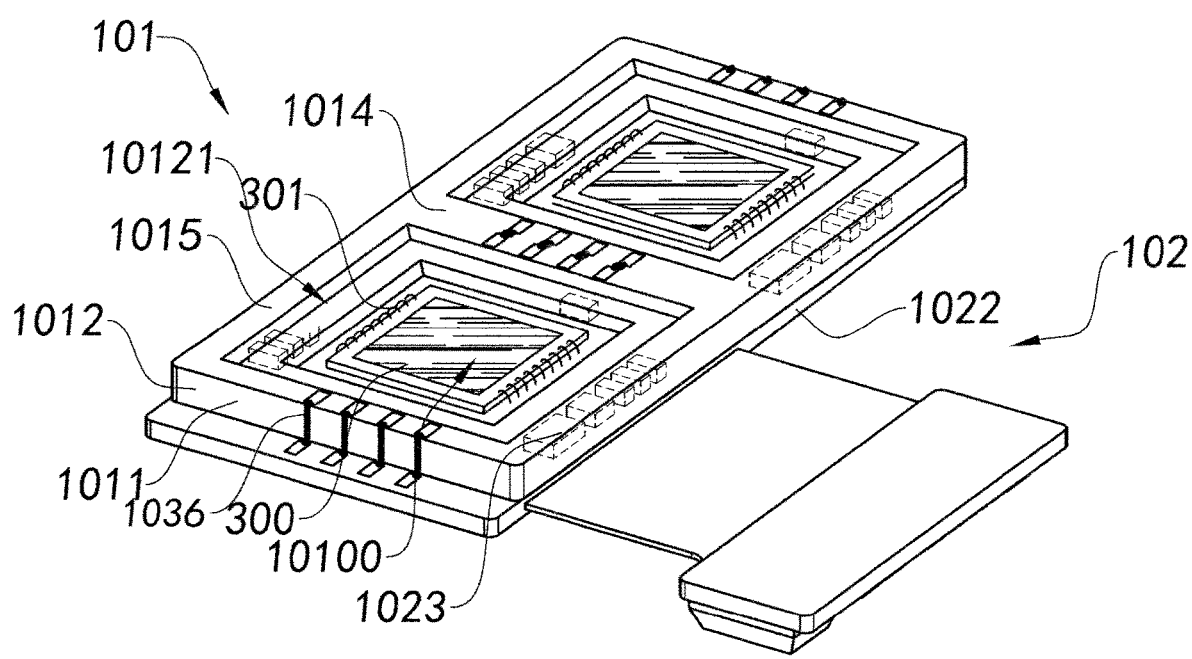

The conjoined encapsulation portion 101 includes at least a connecting unit 1014 and two outer surrounding units 1015, as shown in FIG. 33C, wherein the connecting unit 1014 is molded to connected between the two outer surrounding bodies 1015 integrally, that separates the two outer surrounding units 1015 into two neighboring portions each having one of the two windows 10100. The two photosensitive sensors 300 are respectively positioned at two sides of the connecting unit 1014, so as to be adapted for assembling the array camera module. It is worth mentioning that the connecting unit 1014 is a common portion for the two camera lenses 500, so that as the camera lenses 500 are installed, each of the camera lenses 500 occupies the corresponding portion of the connecting unit 1014.

The circuit board portion 102 includes a connecting circuit (not shown in the figures) and at least a circuit element 1023. The connecting circuit is preinstalled in the main circuit board 1022. The circuit element(s) 1023 is electrically connected to the connecting circuit and the photosensitive sensor 300, wherein the photosensitive sensors 300 are arranged to process their photosensing processes. The circuit elements 1023 can be, for example but not limited to, resistors, capacitors, diodes, triodes, potentiometers, electric relays, actuators, and etc.

In the present embodiment of the present invention, each circuit element 1023 is arranged corresponding to each photosensitive sensor 300 to coordinate with the functioning of the respective photosensitive sensor 300.

It is worth mentioning that the conjoined encapsulation portion 101 can encapsulates and wraps up the circuit elements 1023 therein, so that the circuit elements 1023 will not be directly exposed in the open space. More specifically, the circuit elements 1023 will not be exposed in the environment that communicates with the photosensitive sensor 300. It is different to the circuit elements 1023, such as resistance-capacitance components, of the conventional camera module that are exposed to the outside. Therefore, the present invention is able to prevent sundries and dusts from staying on the circuit elements 1023 and contaminating the photosensitive sensor 300. In the present embodiment, the circuit element(s) 1023 is protruded on the main circuit board 1022 as an example for the description, whereas in other embodiments of the invention, the circuit element 1023 could be embedded in the main circuit board 1022 without protruding from the main circuit board 1022. Person skilled in the art should understand that the structure, type, and mounting position of the circuit element 121 shall not be limitations of the present invention. Besides, when there are circuit element(s) 1023 provided between two photosensitive sensors 300, the connecting unit 1014 also encapsulates and wraps up these circuit element(s) 1023, such that there is no need to provide extra installation space like what is usually provided for the two lens holders in a conventional array camera module. Therefore, the size of the array camera module of the present invention can be made smaller.

It is worth mentioning that the conjoined encapsulation portion 101 which encloses, encapsulates and/or wraps up the circuit elements 1023 advantages in protecting the circuit elements 1023 and the corresponding array camera module. However, those skilled in the art should understand that the conjoined encapsulation portion 101 shall not be limited in encapsulating and wrapping up the circuit element 1023. In other words, in other embodiments of the present invention, the conjoined encapsulation portion 101 can be directly molded on a circuit board without protruding circuit element 1023 or be molded on various positions, such as the outer side, periphery, and etc., of the circuit element 1023.

It is worth mentioning that, in the preferred embodiment of the present invention, the conjoined encapsulation portion 101 is protrudingly positioned surrounding the outer sides of the photosensitive sensors 300. Particularly, the conjoined encapsulation portion 101 integrally encloses the connections of the photosensitive sensors 300 and the main circuit board 1022 to provide a good sealingness and tightness. Therefore, when the camera lenses 500 are installed on the conjoined encapsulation portion 101, each of the photosensitive sensors 300 is respectively sealed therein to form a corresponding sealed inner space.

Referring to FIGS. 31 and 32, in particular, a conventional circuit board can also be used to be the main circuit board 1022 and to be molded when producing the circuit unit 100. For instance, in the preferred embodiment, a circuit board processed with Surface Mount Technology (SMT) can be integrally molded, for example by means of the insert molding technique by injection molding machine to form the conjoined encapsulation portion 101 integrally, or by means of the pressing molding technology, that is commonly used in semiconductor packaging, to form the conjoined encapsulation portion 101. Further, each photosensitive sensor 300 is attached on the main circuit board 1022 and each photosensitive sensor 300 is electrically connected to the main circuit board 1022 with connecting element(s), for instance, such as gold wire. The main circuit board 1022 can selectively be, for example but not limited to, rigid-flex board, ceramic substrate (without flexible board), or rigid PCB (without flexible board). The method to form the conjoined encapsulation portion 11 can be selected from, for example but not limited to, injection molding technique and pressing molding technique. The material of the conjoined encapsulation portion 11 can be, for example but not limited to, nylon, liquid crystal polymer (LCP), or polypropylene (PP) for injection molding technique, or epoxy resin for pressing molding technique. Those skilled in the art should understand that the above available manufacture methods and available materials are examples to describe available implementations of the present invention, rather than limitations of the present invention.

In other embodiments of the present invention, the manufacturing of the circuit unit 100 may alternatively be as follows. Firstly, the circuit board 1022 is processed with Surface Mount Technology (SMT). Then the photosensitive sensors 300 are respectively attached on the main circuit board 1022 and electrically connected with the main circuit board 1022 with, for example, gold wire bonding. Thereafter, the main circuit board 1022 is integrally encapsulated by, for example, molding packaging, to form the conjoined encapsulation portion 101 by means of insert molding technology, or by pressing molding technology that is commonly used in semiconductor packaging. Those skilled in the art should understand that specific processing order for the circuit unit 100 shall not limit the scope of the present invention. It is also worth mentioning that both the camera lens 500 are supported on the conjoined encapsulation portion 101 of the circuit unit 100. Therefore, the conjoined encapsulation portion 101 would function as the mounting frame of the conventional camera module to provide a supportive and holding site for the camera lenses 500, but it is assembled by a different technical process from conventional COB technology. Independent frame of a conventional camera module made based on the conventional COB technique is affixed on the circuit board by adhering process, but the conjoined encapsulation portion 101 is affixed on the main circuit board 1022 by means of the process of Molding On Board (MOB) that does not require any adhering process. The molding process of the present invention with respect to the adhering process of the conventional camera module provides better connection stability and technological process controllability. In addition, it does not have to reserve adhering space between the conjoined encapsulation portion 101 and the main circuit board 1022 for AA adjustment, so that the adhering space for AA adjustment of the conventional camera module is saved, which allows the thickness of the array camera module to be further reduced. Besides, by wrapping up the circuit element 1023 with the conjoined encapsulation portion 101, the traditional frame function thereof can be spatially overlapped with the circuit elements 1023. It is different to the conventional camera module that requires to reserve safety distance around the circuit components. As a result, the height of the conjoined encapsulation portion 101, which can function as a frame, can be arranged in a smaller range, so as to further provide room for reducing the thickness of the camera module. Besides, the conjoined encapsulation portion 101 substitutes the conventional frame to avoid the tilt deviation occurred in attaching and assembling the frame and to reduce the accumulated tolerance of the array camera module during assembling.

Furthermore, the conjoined encapsulation portion 101 includes a covering section 1011 and an optical filter installing section 1012. The optical filter installing section 1012 is molded to attach to the covering section 1011 integrally. The covering section 1011 is molded to attach on the main circuit board 1022 for wrapping up and covering the circuit element(s) 1023. The optical filter installing section 1012 is adapted for installing two optical filters 400. The optical filter 400 can be embodied as, but not limited to, an Infrared Cut Filter (IRCF).

In other words, when the circuit board unit is utilized for assembling the array camera module, each optical filter 400 of the array camera module is mounted at the respective optical filter installing section 1012 that ensures each of the optical filters 400 be respectively arranged along the photosensitive path of the corresponding photosensitive sensor 300 and does not require any additional mounting frame for the optical filter 400. In other words, the conjoined encapsulation portion 101 of the present invention also functions as a conventional frame and that, based on the advantage of the molding technique, the top of the optical filter installing section 1012 can be molded to have good flatness and evenness, so as to allow the optical filters 400 to be evenly installed. This feature is also superior to the conventional multi-lens camera modules.

In addition, the optical filter installing section 1012 has two installing grooves 10121 provided therein. The installing grooves 10121 are communicated to the windows 10100 respectively to provide adequate installation spaces for the optical filters 400 to be installed therein respectively, such that the optical filters 400 will not protrude from the top surfaces of the optical filter installing sections 1012. In other words, the top of the conjoined encapsulation portion 101 has the two installing grooves 10121 for the optical filters 400 to respectively be stably installed in the conjoined encapsulation portion 101 without protruding out from the top of the conjoined encapsulation portion 101.

It is worth mentioning that in the present embodiment of the present invention, the installing grooves 10121 are used for the installation of the optical filters 400, whereas in other embodiments of the present invention, the installing grooves 10121 can also be used for the installations of other elements, such as the camera lens or motor units of the array camera module. Those skilled in the art should understand that the use of the installing groove 1211 shall not be a limitation of the present invention.

According to the present embodiment of the present invention, each of the photosensitive sensors 300 is connected to the main circuit board 1022 by electrically connecting to at least a connecting element 301. The connecting elements 301 can be embodied to be, for example but not limited to, gold wires, copper wires, aluminum wires, and/or silver wires. Especially, the connecting elements 301 of the photosensitive sensors 300 can be connected with the main circuit board 1022 with traditional COB method, for example but not limited to, soldering and welding. That is the connection between the photosensitive sensors 300 and the main circuit board 1022 can also use current well-developed connecting technology to lower the improvement cost and to take advantage of conventional technique and equipment, avoiding the waste of resources. Certainly, those skilled in the art should be able to understand that the connection between the photosensitive sensors 300 and the main circuit board 1022 can also utilize any other connecting methods that is able to achieve the object of the present invention, which means that the present invention shall not be limited thereby.

It is worth mentioning that in the present embodiment of the present invention, the photosensitive sensors 300 are mounted on the upper surface of the main circuit board 1022 and the conjoined encapsulation portion 101 is positioned surrounding the outer sides of the photosensitive sensors 300. When manufacturing the circuit unit 100, there are various possible processing orders to be selected. For example, but not limited to that, in a preferred embodiment, the two photosensitive sensors 300 can firstly be installed on the main circuit board 1022. Then, the conjoined encapsulation portion 101 is molded to form on the main circuit board 1022 surrounding the outer sides of the photosensitive sensors 300, wherein the circuit elements 1023 protruded from the main circuit board 1022 are enclosed, encapsulated and/or wrapped up in the conjoined encapsulation portion 101. In an alternative mode of the preferred embodiment of the present invention, the conjoined encapsulation portion 101 can firstly be molded to form on the main circuit board 1022 to cover and enclose, encapsulate, and/or wrap up the circuit elements 1023 therein. Then, the photosensitive sensors 300 are installed on the main circuit board 1022 and positioned in the inner sides of the conjoined encapsulation portion 101.

In this embodiment of the present invention, an array camera module having two camera lenses 500 is utilized as an example to illustrate a way to implement the array camera module. In which, taking advantage of the molding technique, a consistent installation environment is provided for the two optical filters 400 and the two camera lenses 500, so that the array camera module can achieve a better optical performance. In other embodiments of the present invention, the array camera module can also comprise more than two camera modules and, correspondingly and respectively, the circuit unit 100 forms more than two windows 10100. Therefore, those skilled in the art should understand that the quantity of the camera lens 500 shall not be a limitation of the present invention.

Figure 34:
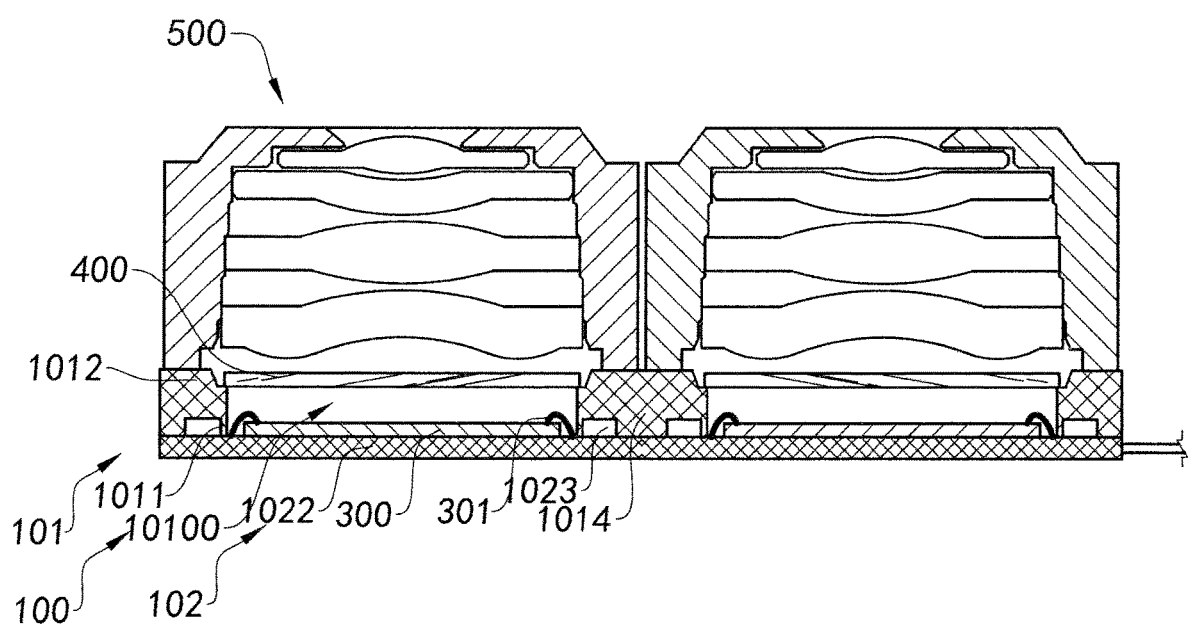
FIG. 34 is a sectional view of an array camera module according to the above eleventh preferred embodiment of the present invention.

Referring to FIG. 34, in a preferred embodiment of the present invention, each camera lens 500 comprises an optical lens. Each optical lens can be directly mounted to the conjoined encapsulation portion 101 of the circuit unit 100. In other words, in this embodiment, the camera lens 500 can be a fixed focus lens unit, which means that the focal length of the camera lens 500 cannot be freely adjusted. Hence, person skilled in the art should understand that the camera lens 500 disclosed in the present invention can be directly mounted to the conjoined encapsulation portion 101, which also includes the camera lens 500 being engaged with the conjoined encapsulation portion 101 through a shell. In another preferred embodiment of the present invention, referring to FIG. 30A, the array camera module comprises two or more motor units 600, wherein the motor units 600 are mounted on the conjoined encapsulation portion 101. Each of the camera lenses 500 is connected to and driven by the respective motor unit 600, such that each of the motor units 600 can drive the respective camera lens 500 to move along the photosensitive path of the respective photosensitive sensor 300 for adjusting the focal length of the respective camera lens 500. In other words, in this embodiment, the camera lens 500 is a zoom lens unit, which means the focal length of the camera lens 500 can be adjusted. For example, when the user is taking picture with the array camera module with two camera lenses 500, he or she can adjust the result of the photography by adjusting focal length(s) of the camera lens(es) 500.

It is worth mentioning that, according to this preferred embodiment of the present invention, the conjoined encapsulation portion 101 can be used to support the installation of each of the optical filters 400, the camera lenses 500, or the motors units 600. The conjoined encapsulation portion has the functions of a conventional frame. Taking advantage of the molding technology, the flatness, smoothness, evenness, and consistency of the conjoined encapsulation portion can also be controlled by the mold, that provides a flat, smooth, even and consistent installation environment for each of the optical filters 400, the camera lenses 500, and the motor units 600 of the array camera module. Therefore, it is more likely to ensure the consistency of the optical axises of the camera lenses, which is not likely to be achieved by the conventional array camera modules.

It is also worth mentioning that the conjoined encapsulation portion 101, which is integrally and conjoinedly molded to form on the main circuit board 1022, reinforces the structural strength of the main circuit board, so that with respect to the array camera module made with the conventional COB process, the main circuit board 1022 of the array camera module of the present invention can achieve a thinner thickness while satisfying the strength requirements for the camera lenses and motors unit. On the other hand, the conjoined encapsulation portion 101 can reduce the distance between the camera lenses 500, so as to reduce the lateral size in length and width of the array camera module.

Furthermore, according to the present preferred embodiment of the present invention, the molded photosensitive unit 10 includes two motor connecting structures 103 for connecting with two motor units 600 of the array camera module. Each of the motor units 600 has at least one motor terminal 601. The motor connecting structure 103 includes at least one connecting element such as connecting element 1031, wherein the connecting elements 1031 are used to connect the motor units 600 and the main circuit board 1022. Each of the connecting elements 1031 is electrically connected to the main circuit board 1022. Further, each of the connecting elements 1031 is electrically connected to the connecting circuit of the main circuit board 1022. The connecting elements 1031 are deployed in the conjoined encapsulation portion 101 and extended to the top of the conjoined encapsulation portion 101. Each of the connecting elements 1031 has a motor coupling end 10311 exposed on top of the conjoined encapsulation portion 101 for being electrically connected to the motor terminal 601 of the respective motor unit 600. It is worth mentioning that the connecting element 1031 can be deployed by embedding during the molding formation of the conjoined encapsulation portion 101. In the conventional way of connection, component like driving motor is connected to the circuit board through independent lead wires, which involve relatively complicated manufacture technique. However, the molding method of the present invention that embeds the connecting elements 1031 in the molding process can not only substitute the conventional technological process, such as motor soldering, but also make the circuit connection being more stable. Particularly, in a preferred embodiment of the present invention, each of the connecting elements 1031 is a conductor being embedded inside of the conjoined encapsulation portion 101. In another embodiment, each of the connecting elements 1031 can be embedded in the surface portion of the conjoined encapsulation portion 101. The motor terminal 601 can be connected to the respective motor coupling end 10311 with anisotropic conductive film or by welding and soldering.

It is worth mentioning that the embedding positions of the connecting elements 1031 and the revealing positions of the motor coupling ends 10311 of the connecting elements 1031 on the conjoined encapsulation portion 101 may be disposed based on the practical needs. For instance, in a preferred embodiment of the present invention, the motor coupling ends 10311 of the connecting elements 1031 can be deployed on the periphery of the conjoined encapsulation portion 101 which are the top surface of the conjoined encapsulation portion 101 and the top surface of the optical filter installing section 1012. However, in another embodiment of the present invention, the motor coupling ends 10311 can be deployed on the inner portion of the conjoined encapsulation portion 101 which is the bottom sides of the installing grooves 10121 of the conjoined encapsulation portion 101. Therefore, there may be various installation sites provided for the motor units 600. In other words, when the motor units 600 have to be installed on top of the conjoined encapsulation portion, the motor coupling ends 10311 are provided on the top surface of the outer portion of the conjoined encapsulation portion. When the motor units 600 have to be installed in the installing grooves 10121 respectively, the motor coupling ends 10311 are provided on the inner portion of the conjoined encapsulation portion 101, which is the bottoms of the installing grooves 10121.

In other words, to produce the circuit unit 100, the photosensitive sensors 300 are firstly adhered to the main circuit board 1022. Then, the conjoined encapsulation portion 101 is molded to form on the main circuit board 1022 by means of the MOB technology. At the same time, the connecting elements 1031 can be embedded in the conjoined encapsulation portion 101 during the molding process and electrically connected to the main circuit board 1022. The motor coupling ends 10311 of the connecting elements 1031 are revealed on the top of the conjoined encapsulation portion for connecting with the motor terminals 601 of the motor unit 600 respectively. For example, when the molded photosensitive unit 10 is to be installed on the array camera module, each motor terminal 41 of the motor unit 600 is connected to the motor coupling end 10311 of the respective connecting element 1031 by welding and soldering so as to electrically connect the motor unit 600 with the main circuit board 1022. An independent lead wire is required to be deployed to connect the motor unit 600 and the main circuit board 1022 to allow the length of the motor terminal 601 of the motor unit 600 to be shortened.

Referring to FIG. 33A, an equivalent embodiment of the motor connecting structure of the above preferred embodiment of the present invention is illustrated. Each of the motor connecting structures 103 includes a terminal slot 1033. The terminal slot 1033 is for accommodating the motor terminal 601 of the respective motor unit 600 of the array camera module. The terminal slot 1033 is deployed on top of the conjoined encapsulation portion 101. Each of the motor connecting structure 103 includes at least one connecting element such as lead wire 1034, wherein the connecting elements 1034 are arranged to connect the motor units 600 and the main circuit board 1022. Each of connecting elements 1034 is deployed in the conjoined encapsulation portion 101 and upwardly extended to the bottom wall of the terminal slot 1033 of the conjoined encapsulation portion 101. Each of the connecting elements 1034 includes a motor coupling end 10341 exposed on the bottom wall of the terminal slot 1033 of the conjoined encapsulation portion 101 for being electrically connected to the motor terminal 601 of the respective motor unit 600. Particularly, in an implementation, the motor coupling end 10341 can be embodied to be a pad. The connecting element 1034 can be embodied as a conductor to be embedded inside the conjoined encapsulation portion 101.

In other words, when producing the circuit unit 100, the photosensitive sensors 300 are firstly adhered on the main circuit board 122, and then the conjoined encapsulation portion 101 is molded on the main circuit board 122, for example, by the MOB technology, with the photosensitive sensors 300 remain exposed to outside through windows formed in the conjoined capsulation portion 101. At the same time, the terminal slot 1033 with predetermined length is preset and the connecting element 1034 is arranged by being embedded during the molding, which electrically connects the connecting element 1034 with the main circuit board 122 and reveals the motor coupling end 10341 of the connecting element 1034 on the bottom wall of the terminal slot 1033 of the conjoined encapsulation portion 101 for connecting with the motor terminal 41 of the motor unit 600.

For example, when the molded photosensitive unit 10 is installed on the camera module, each motor terminal 601 of the motor unit 600 is inserted into the terminal slot 1033 and connected to the motor coupling end 10341 of the connecting element 1034 by welding and soldering so as to electrically connect the motor unit 600 with the main circuit board 122. An independent wire is required to be deployed to connect the motor unit 600 and the main circuit board 122 to ensure stable connection for the motor terminal 601 of the motor unit 600 and to keep unnecessary contact from the motor terminal 601. Particularly, the connecting element 1034 can be embodied as a conductor to be embedded inside of the conjoined encapsulation portion 101.

Referring to FIG. 33B, another equivalent embodiment of the motor connecting structure of the above preferred embodiment of the present invention is illustrated, wherein each of the motor connecting structures 103 includes a terminal slot 1035. The terminal slot 1035 is for accommodating the motor terminal 601 of the motor unit 600 of the array camera module. The terminal slot 1035 is deployed on the conjoined encapsulation portion 101. The motor connecting structure 103 includes at least one circuit junction 1032, wherein the circuit junction 1032 is preformed on the main circuit board 122 and electrically connected to the connecting circuit in the main circuit board 122. Furthermore, each of the terminal slots 1035 is extended from the top of the conjoined encapsulation portion 101 to the main circuit board 122 to present the circuit junction 1032. In a preferred embodiment, the motor terminal 601 is adapted to insert into the terminal slot 1035 and can be connected with the circuit junction 1032 by soldering and welding.

In other words, when producing the molded photosensitive unit 10, each circuit junction 1032 is preformed on the main circuit board 122. Then, the photosensitive sensors 121 are attached thereon. Then, the conjoined encapsulation portion 101 is molded on the main circuit board 122 by means of MOB technology. At the same time, the terminal slot 1035 with predetermined length is preset and the circuit junction 1032 is revealed through the terminal slot 1035 for connecting with the motor terminal 601 of the respective motor unit 600. For example, when the molded photosensitive unit 10 is to be assembled on the camera module, each motor terminal 601 of the motor unit 600 is inserted into the respective terminal slot 1035 and connected to the respective circuit junction 1032 of the main circuit board 122 by welding and soldering so as to electrically connect the respective motor unit 600 with the main circuit board 122 and to ensure stable connection for the motor terminal 601 of the respective motor unit 600 and to keep unnecessary contact from the motor terminal 601.

Referring to FIG. 33C, another equivalent embodiment of the motor connecting structure liner the above preferred embodiment of the present invention is illustrated. The motor connecting structure 103 includes at least a carving line 1036. The carving line 1036 is adapted to electrically connect the connecting elements, the photosensitive sensors 300, and the motor units on the main circuit board 122. For example, but not limited to that the carving line 1036 can be formed by means of Laser Direct Structuring (LDS) during the forming of the conjoined encapsulation portion 101. In the conventional way of connection, components like driving motor are connected to the circuit board through independent lead wires, which involve relatively complicated manufacture technique. However, the method of the present invention that arranges the carving line(s) 1036 in the molding process can not only substitute the conventional technological processes, like motor soldering, but also make the circuit connection being more stable. More specifically, forming process of the carving line(s) 1036 can be carving on the conjoined encapsulation portion 101 and then laying the circuit by electroplating in the carved grooves.

It is worth mentioning that in the eleventh embodiment and its illustrating figures, the motor connecting structure 103 with the connecting elements 1031 is embodied to illustrate that the circuit unit can be electrically connected to the motor unit 600. However, in other embodiments of the present invention, the circuit unit 100 can also be connected to other motor connecting structure 103, for example but not limited to, the terminal slot 1033 and the connecting element 1034, the terminal slot 1035 and the circuit junction 1032, the carving line 1036, and etc., so as to connect to the motor unit 600. Those skilled in the art should understand that the connection way with the motor connecting structure 103 shall not be a limitation of the present invention.

Figure 30B:
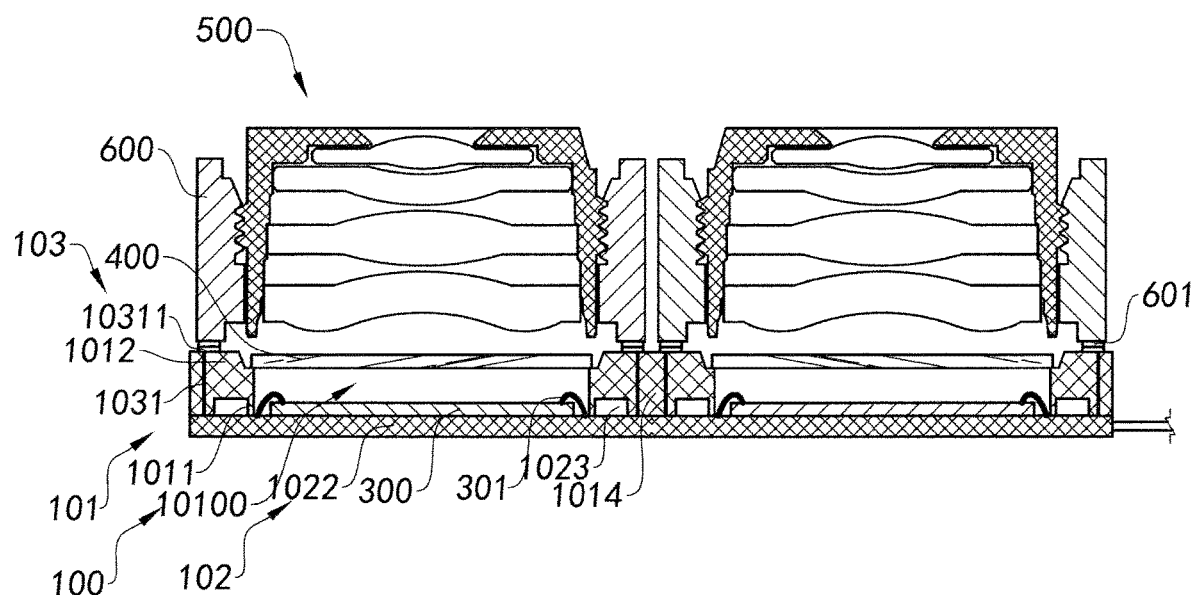
FIG. 30B is a sectional view of the array camera module according to an alternative mode of the above eleventh preferred embodiment of the present invention.

In the eleventh embodiment of the present invention, how the motor units 600 of the array camera module are connected with the conjoined encapsulation portion 101 is described as an example to use the motor connecting structure 103 for the connection, which includes, for example, using the connecting element 1031 for the connection. However, in other embodiments of the present invention, the connecting method for the motor units 600 may also combine with the connecting methods referred in FIGS. 35A, 35B, and 35C, such as utilizing the terminal slot 1033 and the lead wire 1034, the terminal slot 1035 and the circuit junction 1032, and etc. In another embodiments of the present invention, referring to FIG. 30B, the motor units 600 may be connected with the circuit unit 100 with a traditional way, such as welding and soldering. Those skilled in the art should understand that specific way of connecting the motor 600 and the circuit unit 100 shall not limit the scope of the present invention.

Figure 35:
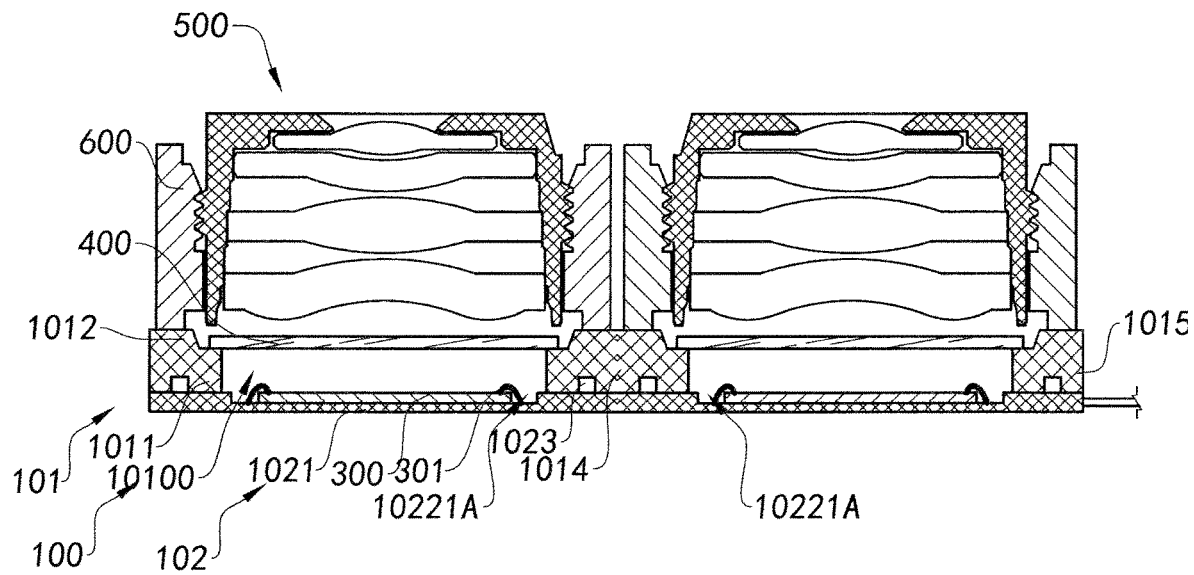
FIG. 35 is a sectional view of an array camera module with circuit unit according to a twelfth preferred embodiment of the present invention.

Referring to FIG. 35, the array camera module and its circuit unit 100 according to a twelfth preferred embodiment of the present invention are illustrated. The different between this twelfth preferred embodiments with the above preferred embodiments is that the circuit unit 100 comprises a main circuit board 1022A. The main circuit board 1022A has two inner grooves 10221A provided therein. The photosensitive sensors 300 are arranged to be connected in the two inner grooves 10221A respectively. The different of the circuit unit 100 between this twelfth preferred embodiment with the above embodiments is that, the photosensitive sensors 300 are completely installed and accommodated in the inner grooves 10221A respectively, such that, preferably, the photosensitive sensors 300 will not significantly protrude from the top surface of the main circuit board 1022A. Accordingly, the relative height of the photosensitive sensor 300 with respect to the conjoined encapsulation portion 101 is lowered, so as to reduce the height limit of the photosensitive sensors 300 relative to the conjoined encapsulation portion 101 and provide potential room for further reduction of the height thereof.

In addition, the photosensitive sensors 300 are connected to the main circuit board 1022 by electrically connecting with the connecting elements 301. The connecting element (lead wire) can be embodied to be, for example but not limited to, gold wire, copper wire, aluminum wire, and/or silver wire. In other words, the photosensitive sensors 300 and the connecting elements 301 are all respectively positioned inside of the inner grooves 10221A of the main circuit board 1022A. According to the preferred embodiment, when producing the circuit unit 100, the inner grooves 10221A have to be formed in the main circuit board 1022A first. In other words, the inner grooves 10221A can also be opened in a conventional circuit board to be adapted for accommodating and installing the photosensitive sensors 300.

Figure 36:
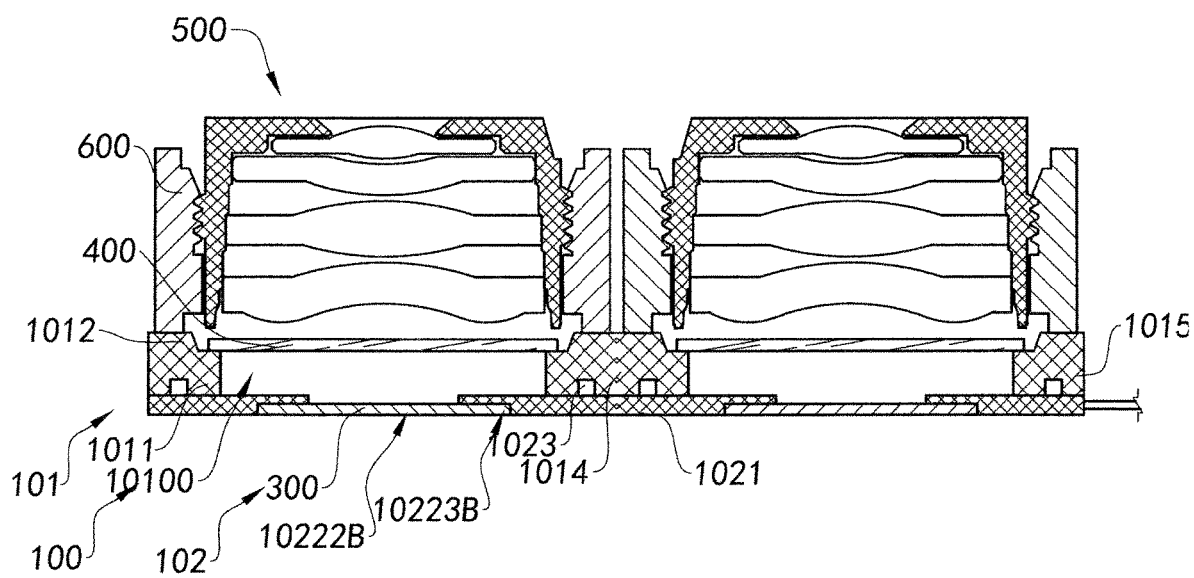
FIG. 36 is a sectional view of an array camera module with circuit unit according to a thirteenth preferred embodiment of the present invention.

Referring to FIG. 36, the array camera module and its circuit units according to a thirteenth preferred embodiment of the present invention are illustrated.

The different between this thirteenth preferred embodiment and the above preferred embodiments include that the circuit unit 100 comprises a main circuit board 1022B, which has two passages 10222B penetrated therethrough, wherein the two photosensitive sensors 300 are installed at the lower portions of the two passages 10222B respectively. Each of the passages 10222B extended between the top side and the bottom side of the main circuit board 1022B, so that when the photosensitive sensors 300 having their photosensitive areas facing upwards are installed at the main circuit board 1022B from the bottom side of the main circuit board 1022B, the photosensitive areas of the photosensitive sensors 300 are adapted to receive the light entered from the camera lenses 500 through the passages 10222B respectively.

Further, the main circuit board has two outer grooves 10223B, provided in the bottom side thereof, communicating with the passages 10222B respectively, so as to provide the photosensitive sensors 300 two installation sites therefor. Especially, when the photosensitive sensors 300 are mounted in the outer grooves 10223B respectively, the outer surfaces of the photosensitive sensors 300 and the surface of the main circuit board 1022B are evenly on the same plane, so as to ensure an evenness and smoothness top surface of the circuit unit 100.

In the present thirteenth embodiment of the present invention, the passages 10222B are each in step shape so as to adapt for the installation of the photosensitive sensors 300 respectively, so as to provide a stable installation site for each of the photosensitive sensor 300 and to have the photosensitive area thereof to be revealed to an internal space.

It is worth mentioning that the present embodiment of the present invention provides a Flip Chip (FC) style that is different from conventional chip installation methods. That is, the photosensitive sensors 300 are mounted on the main circuit board 1022B from the back side of the main circuit board 1022B, which differs from what was illustrated in the above embodiments that the photosensitive sensor 300 is installed on the front side of the main circuit board 1022B, which means that the photosensitive sensor 300 is installed from the top of the main circuit board 1022B while its photosensitive area facing upwards. Such structure and installation style allows the photosensitive sensors 300 and the conjoined encapsulation portion 101 to be relatively independent, wherein the installation of the photosensitive sensor 300 will not be affected by the conjoined encapsulation portion 101 and the influence by the mold forming of the conjoined encapsulation portion 101 on the photosensitive sensor 300 will be reduced as well. Moreover, the photosensitive sensors 300 are embedded in the outer side of the main circuit board 1022B without protruding from the inner side of the main circuit board 1022B, such that more space is saved in the inner space of the inner side of the main circuit board 1022B. Therefore, the height of the conjoined encapsulation portion 101 will not be restricted by the height of the photosensitive sensors 300, so as to allow the conjoined encapsulation portion 101 to achieve a thinner thickness.

It is worth mentioning that in other embodiments of the present invention, each of the optical filters 400 is installed at a recess provided at the respective surrounding unit 1015 of the conjoined encapsulation portion 101 and positioned above the respective passage 10222B. In other words, the optical filters 400 do not have to be installed in the conjoined encapsulation portion 101. Therefore, the back focal length of the array camera module can be decreased and the height of the array camera module can be reduced as well. Particularly, the optical filters 400 can each be embodied as an Infrared-Cut Filter (IRCF).

Figure 37:
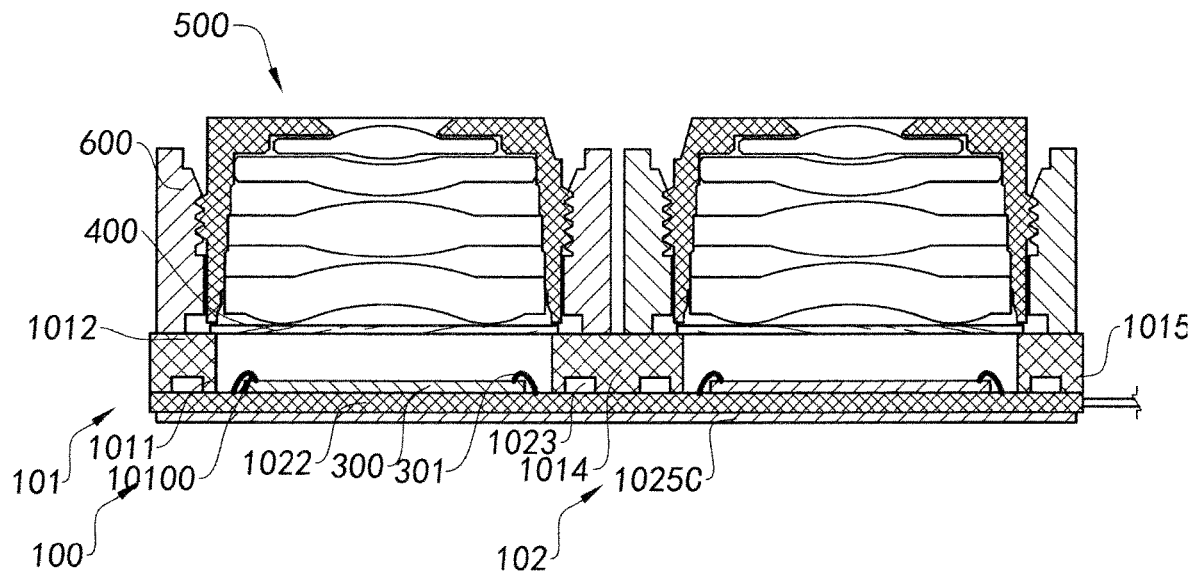
FIG. 37 is a sectional view of an array camera module with circuit unit according to a fourteenth preferred embodiment of the present invention.

Referring to FIG. 37, the array camera module and its circuit unit 100 according to a fourteenth preferred embodiment of the present invention are illustrated.

The circuit unit 100 further comprises a reinforced layer 1025C overlappedly attached to the bottom of the main circuit board 1022, so as to reinforce the structural strength of the main circuit board 1022. In other words, the reinforced layer 1025C is adhered on the bottom portion of the main circuit board 1022 to overlap with the bottom area where the conjoined encapsulation portion 101 and the photosensitive sensor are located, so that the main circuit board 1022 can stably and reliably support the conjoined encapsulation portion 101 and the photosensitive sensor 300.

Furthermore, the reinforced layer 1025C is a metal plate attaching on the bottom of the main circuit board 1022 to increase the structural strength of the main circuit board 1022 as well as to enhance the heat dissipation of the molded photosensitive unit by effectively dissipating heat generated by the photosensitive sensors 300.

It is worth mentioning that the main circuit board 1022 can be a Flex Print Circuit (FPC). By enhancing the rigidity of the FPC with the reinforced layer 1025C, the FPC that has excellent flexural property can still qualify for the load bearing requirement for the molded photosensitive unit. In other words, there are more available options for the main circuit board 1022, such as PCB (Printed Circuit Board), FPC (Flexible Printed Circuit), and RG (Rigid Flex). By using the reinforced layer 1025B to enhance the structural strength and heat dissipation of the main circuit board 1022, the thickness of the main circuit board 1022 can also be reduced, which helps to further reduce the height of the molded photosensitive unit as well. Hence, the height of the camera module assembled thereby can be reduced.

Figure 38:
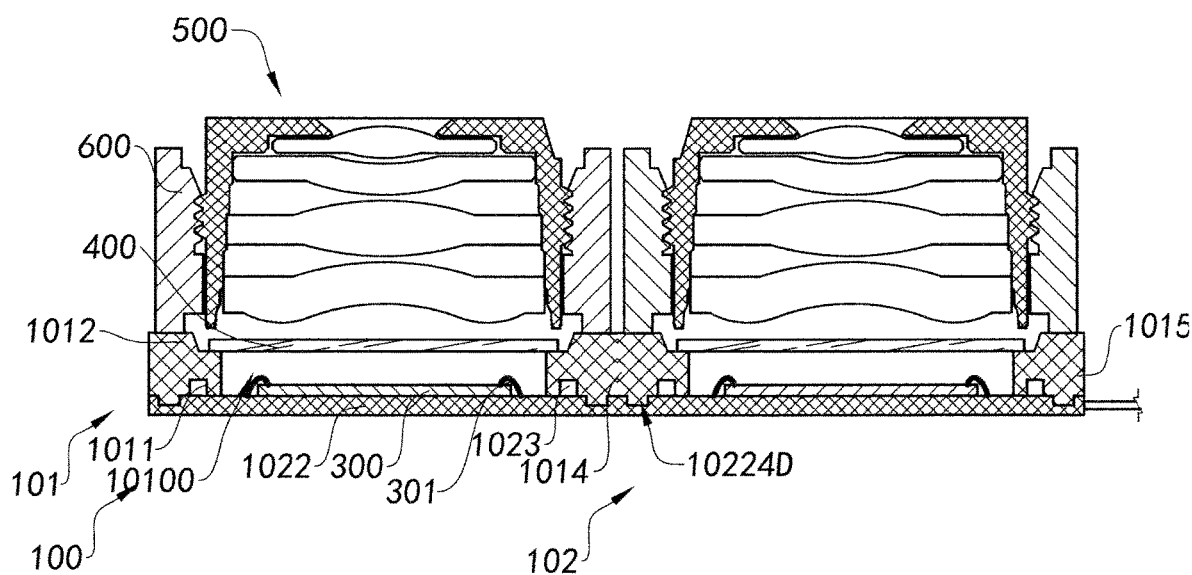
FIG. 38 is a sectional view of an array camera module with circuit unit according to a fifteenth preferred embodiment of the present invention.

Referring to FIG. 38, the array camera module with its circuit unit 100 according to a fifteenth preferred embodiment of the present invention is illustrated.

The different between this fifteenth preferred embodiment and the above preferred embodiments is that, the main circuit board 1022D has at least one reinforced hole 10224D indented therein and the conjoined encapsulation portion 101 is extended into the reinforced hole(s) 10224D, so as to enhance the structural strength of the main circuit board 1022D.

The positions of the reinforced holes 10224D can be determined based on practical needs. Also, based on the need of the structural strength of the circuit board, the reinforced holes 10224D can be, for example, arranged in a symmetrical construction. The arrangement of the reinforced holes 10224D makes the structural strength of the main circuit board 1022D being stronger, which allows the thickness of the main circuit board 1022D and the thickness of the camera module assembled thereof to be reduced. Besides, heat dissipation performance of the molded photosensitive unit is enhanced as well.

It is worth mentioning that the reinforced holes 10224D are each in indented groove form, so that when manufacturing the molded photosensitive unit, the molding material of the conjoined encapsulation portion 101 will not leak off from the reinforced holes 10224D.

Figure 39:
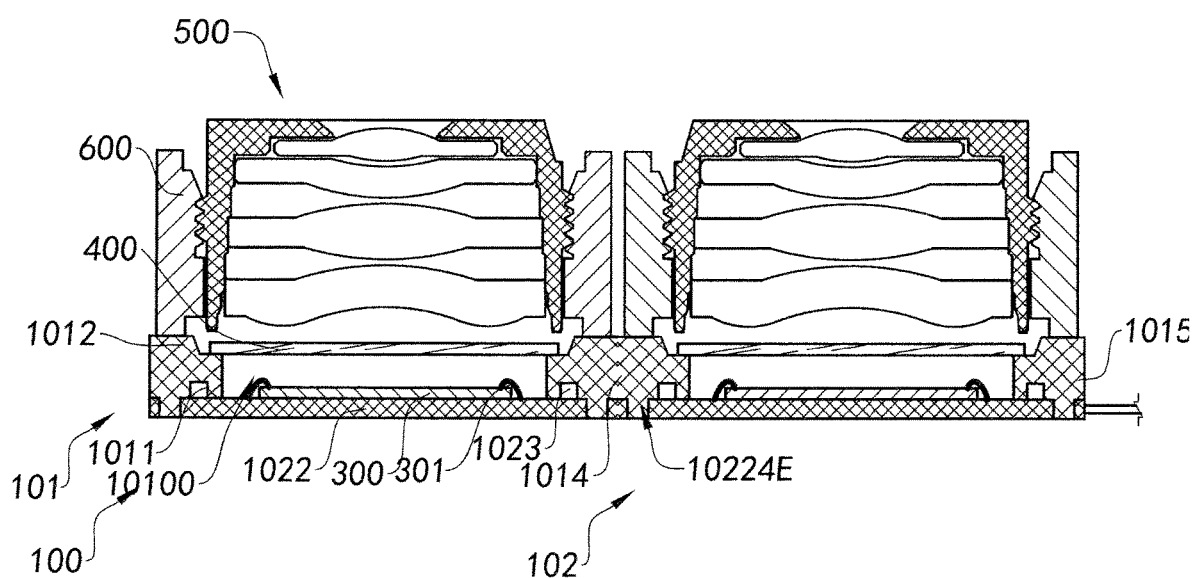
FIG. 39 is a sectional view of an array camera module with circuit unit according to a sixteenth preferred embodiment of the present invention.

Referring to FIG. 39, the array camera module with its circuit unit 100 according to a sixteenth preferred embodiment of the present invention is illustrated.

The different between this sixteenth preferred embodiment and the above preferred embodiments is that, the main circuit board 1022E has at least one reinforced hole 10224E formed therethrough and the conjoined encapsulation portion 101 is extended to fill in the reinforced hole 10224E, so as to enhance the structural strength of the main circuit board 1022E.

The positions of the reinforced holes 10224E can be determined based on practical needs. Also, based on the need of the structural strength of the circuit board, the reinforced holes 10224E can be, for example, arranged in a symmetrical construction. The arrangement of the reinforced holes 10224E make the structural strength of the main circuit board 1022E being stronger, which allows the thickness of the main circuit board 1022E and the thickness of the camera module assembled thereof to be reduced. Besides, heat dissipation performance of the molded photosensitive unit is enhanced as well.

It is worth mentioning that each of the reinforced holes 10224E is a through hole, which, in other words, penetrates through the main circuit board 1022E, so as to communicate the top side and the bottom side of the main circuit board 1022E. Therefore, during the production of the molded photosensitive unit, the molding material of the conjoined encapsulation portion 101 can fully fill and be bonded with the main circuit board 1022E to form a more solid structure of combined composite material. Besides, in comparison with the groove shaped reinforced hole 10224D of the above fifteenth preferred embodiment, the through hole form reinforced hole 10224E of this sixteenth preferred embodiment is easier to be made and processed.

Figure 40:
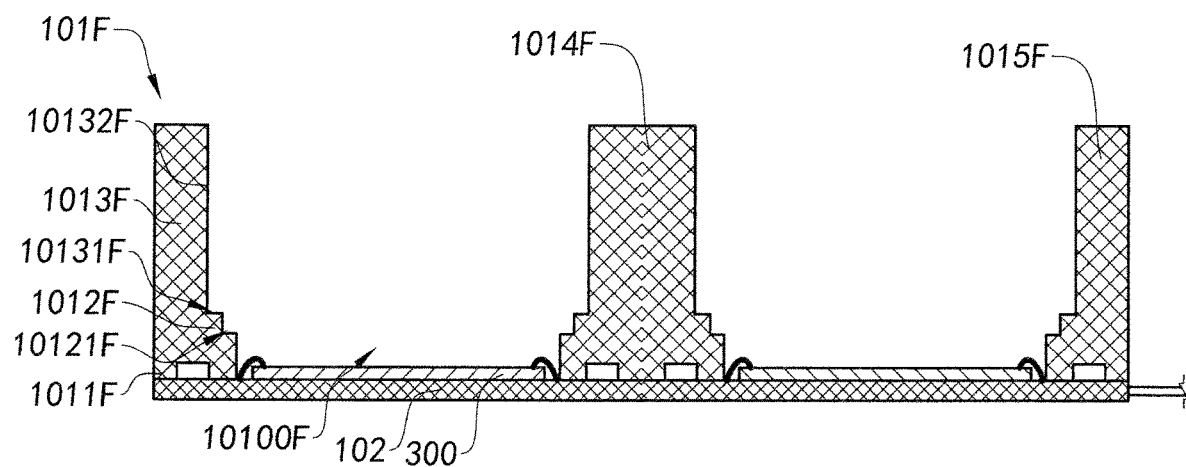
FIG. 40 is a sectional view of a circuit unit according to a seventeenth preferred embodiment of the present invention.
Figure 41:
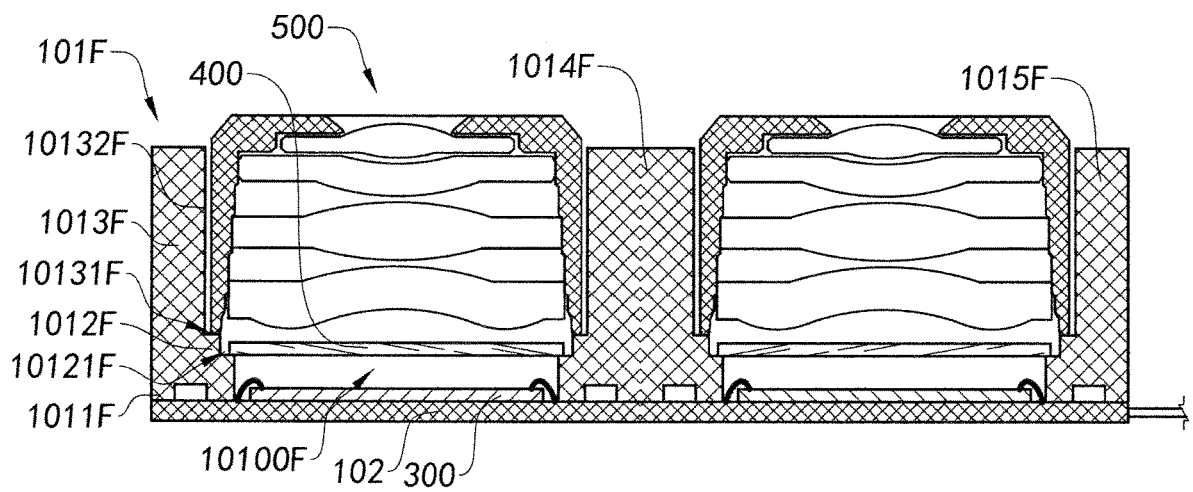
FIG. 41 is a sectional view of the array camera module according to the above seventeenth preferred embodiment of the present invention.

Referring to FIGS. 40 and 41, the array camera module with its circuit unit according to a seventeenth preferred embodiment of the present invention is illustrated.

The different between this seventeenth preferred embodiment with the above preferred embodiments is that, the conjoined encapsulation portion 101F comprises a covering section 1011F, an optical filter installing section 1012F, and a camera lens installing section 1013F. The optical filter installing section 1012F and the camera lens installing section 1013F are molded integrally and upwardly to extend from the covering section 1011F orderly. The covering section 1011F is molded to attach on the main circuit board 1022 for encapsulating, wrapping up and covering the circuit elements 1023 and the connecting elements 301. The optical filter installing section 1012F is integrally extended upwardly from the covering section 1011F for mounting the optical filters 400. In other words, when the molded photosensitive unit is utilized for assembling the array camera module, the optical filters 400 of the array camera module are mounted at the optical filter installing sections 1012F, while the optical filters 400 are deployed along the photosensitive paths of the photosensitive sensors 300 respectively without the need of any additional mounting frame for installation of the optical filters 400. In other words, the conjoined encapsulation portion 101F according to the preferred embodiment also functions as the conventional mounting frame. Taking advantage of the molding technique, the top portion of the optical filter installing section 1012F can be molded to have good flatness, smoothness and evenness, so as to allow the optical filters 400 to be evenly installed, wherein such feature is superior to the conventional camera modules. The camera lens installing section 1013F is molded to extend upwardly from the optical filter installing section 1012F for mounting the camera lenses 500 therein. In other words, when the molded photosensitive unit is utilized in assembling the array camera module, the camera lenses 500 are mounted at the inner side of the camera lens installing section 11F3 of the conjoined encapsulation portion 101F, which provides a stable mounting position for the camera lenses 500.

Furthermore, the optical filter installing section 1012F has two installing grooves 10121F formed therein. The installing grooves 10121F are aligned and communicated with the two corresponding windows 10100F respectively to provide adequate installation spaces for the two optical filters 400 respectively, such that the optical filters 400 can be stably mounted. The camera lens installing section 1013F has two lens installing grooves 10131F formed therein. The two lens installing grooves 10131F are aligned and communicated with the two corresponding installing grooves 10121F and the two corresponding windows 10100F, so as to respectively provide adequate installation spaces for the two camera lenses 500 respectively.

In other words, the optical filter installing section 1012F and the camera lens installing section 1013F are integrally extended upwardly to form a step structure internally, which respectively provide supporting and affixing positions to the optical filters 400 and the camera lenses 500, without the need of any extra parts for the installation of the optical filters 400 and the camera lenses 500.

The camera lens installing section 1013F has two camera lens inner walls 10132F defining the two lens installing grooves 10131F respectively. Each of the camera lens inner wall 10132F is in round shape, which is adapted for providing installation chamber for the respective camera lens 500. It is worth mentioning that the surface of each camera lens inner wall 10132F of the camera lens installing section 10132F is preferred to be smooth, which is adapted for installing the threadless camera lens 500 to form a fixed focus module. Particularly, the camera lens 500 can be secured in the camera lens installing section 1013F by adhering.

Figure 42:
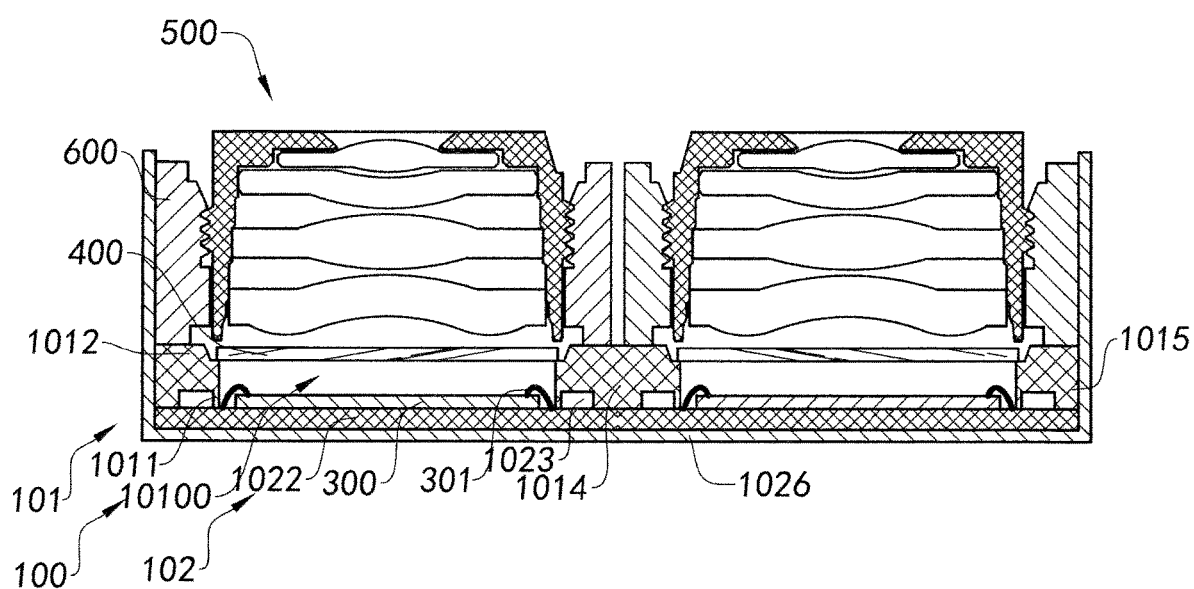
FIG. 42 is a sectional view of an array camera module with circuit unit according to an eighteenth preferred embodiment of the present invention.

Referring to FIG. 42, an array camera module with its circuit unit according to an eighteenth preferred embodiment of the present invention is illustrated. The different between this eighteenth preferred embodiment and the above preferred embodiments is that, the circuit unit 100 includes a shielding layer 1026 arranged to cover the main circuit board 1022 and the conjoined encapsulation portion 101, so as to not only reinforce the structural strength of the main circuit board 1022, but also enhance the electromagnetic immunity ability of the circuit unit 100.

Figure 43:
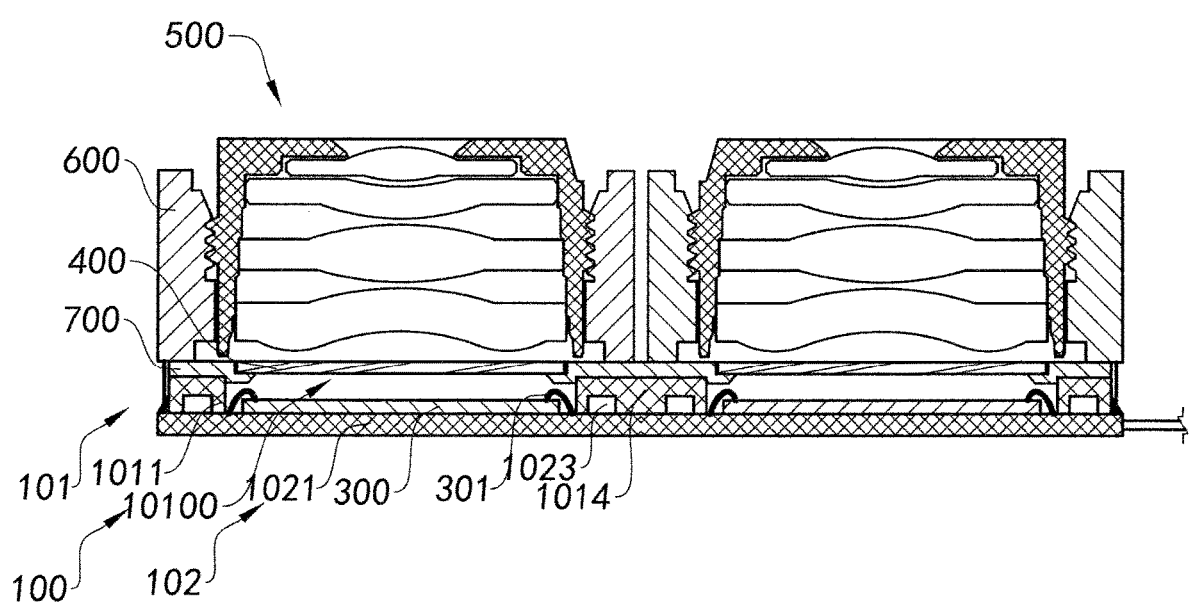
FIG. 43 is a sectional view of the array camera module with circuit unit according to a nineteenth preferred embodiment of the present invention.
Figure 44:
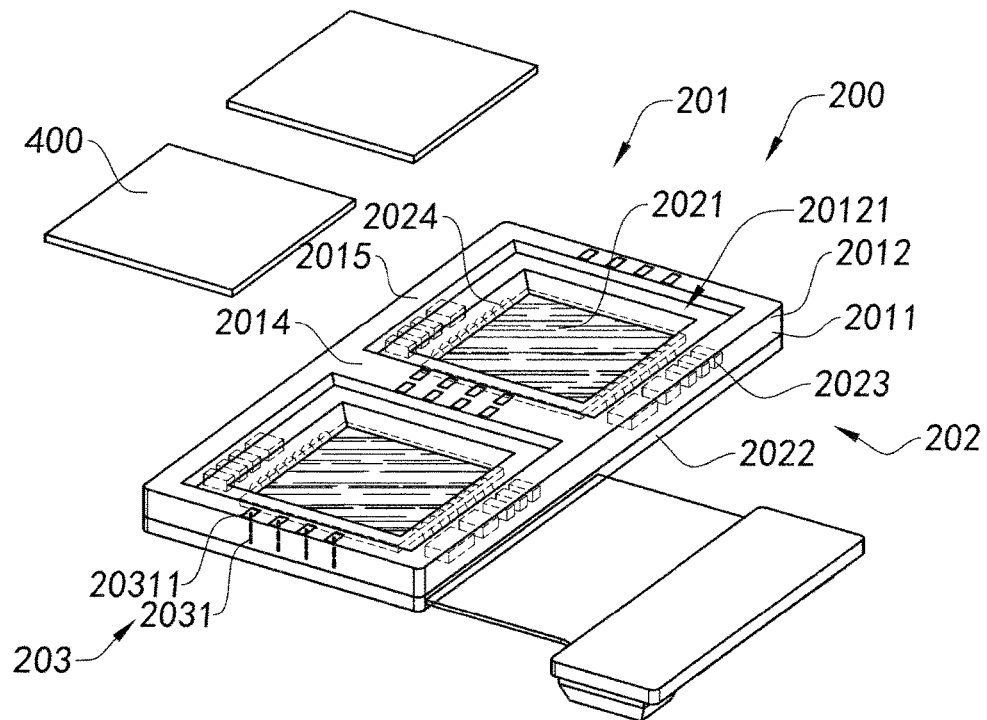
FIG. 44 is an exploded perspective view of a photosensitive unit according to a 20th preferred embodiment of the present invention.
Figure 45:
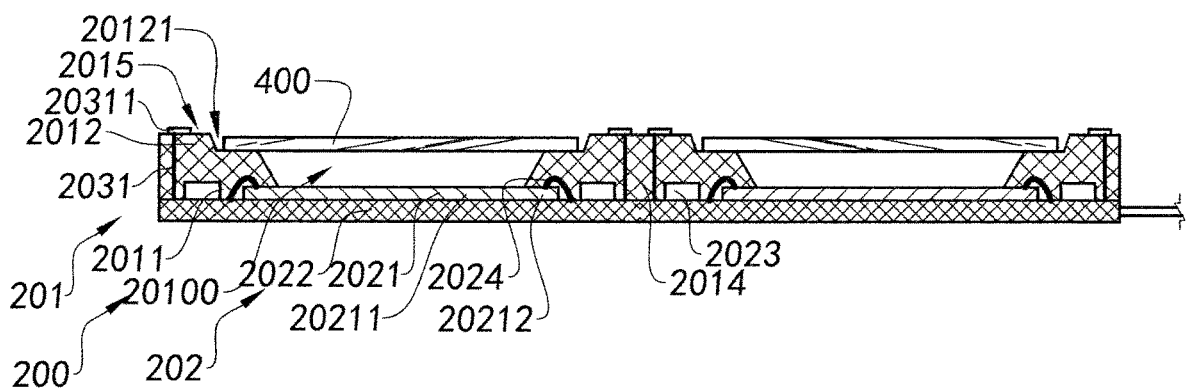
FIG. 45 is a sectional view of a photosensitive unit according to the above 20th preferred embodiment of the present invention.
Figure 46:
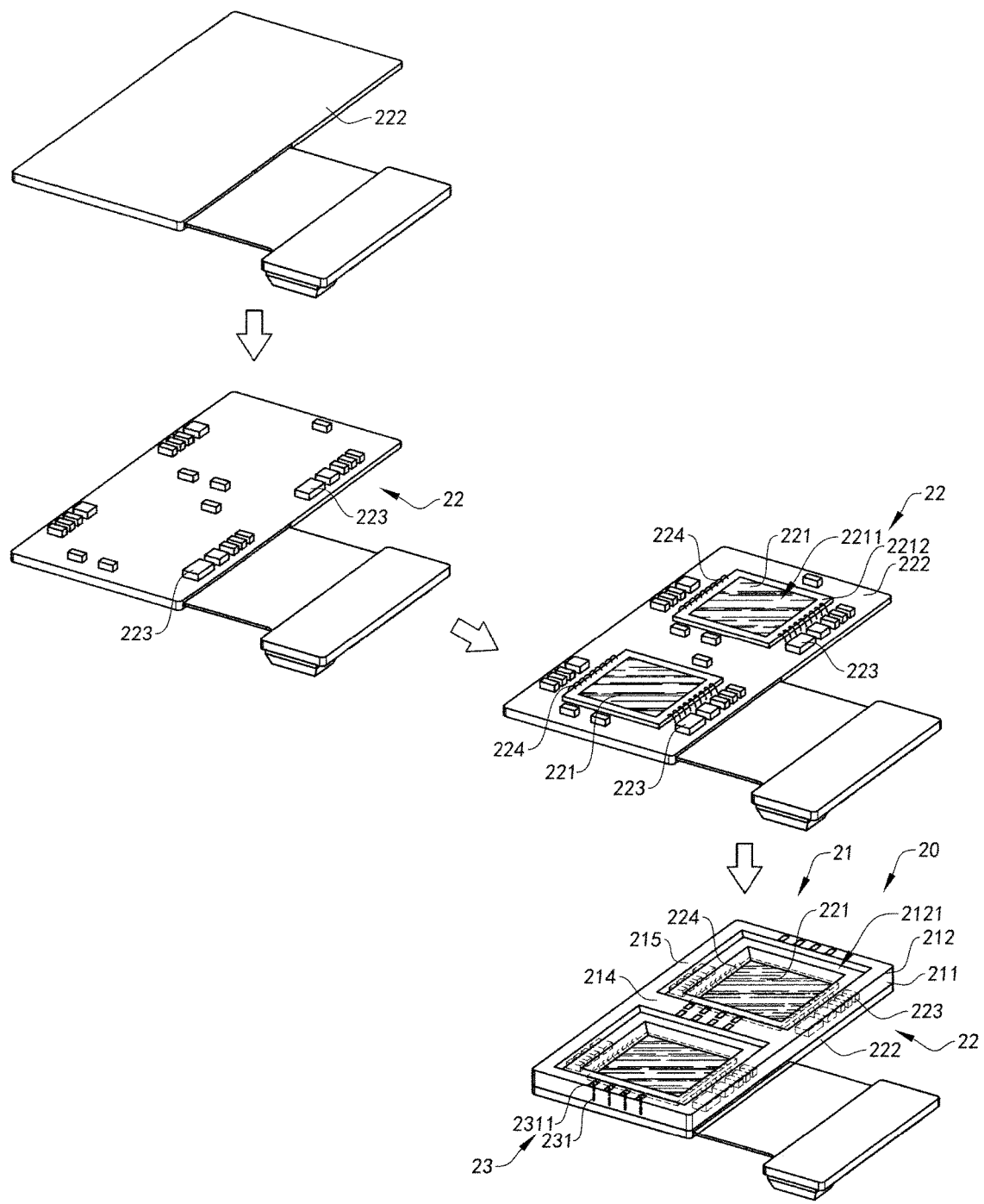
FIG. 46 is a manufacturing process diagram illustrating the photosensitive unit according to the above 20th preferred embodiment of the present invention.
Figure 47:
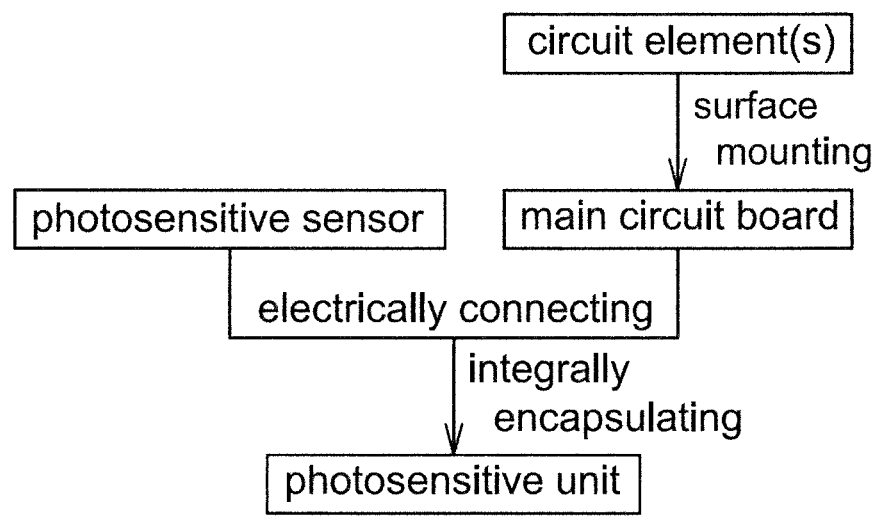
FIG. 47 is a block diagram illustrating the photosensitive unit according to the above 20th preferred embodiment of the present invention.

Referring to FIG. 43, the array camera module with its circuit unit according to a nineteenth preferred embodiment of the present invention is illustrated. The different between this nineteenth preferred embodiment with the above embodiments is that, the camera module includes at least a frame 70 arranged for installing the optical filters 400, the camera lenses 500, or the motor units 600. According to the present nineteenth embodiment of the present invention, the frame 700 is mounted on the conjoined encapsulation portion 101. Two optical filters 400 are mounted on the frame 700. The motor units 600 are also mounted on the frame 700. Specific shape and structure of the frame 700 can be arranged based on the needs, wherein, for example, the frame 700 can be constructed as a platform, having two frame windows provided therein, adapted to install the optical filters thereon while enabling light passing through the frame windows to reach the photosensitive sensors 300 respectively. The frame 700 can be a conjoined frame, which, in other words, can have a plurality of the optical filters 400 installed thereon. It can also be a single frame, which can have only one optical filter 400 installed thereon. In the present nineteenth embodiment of the present invention, the frame 70 is preferably a conjoined frame overlappedly attached on the encapsulation portion 1014 by for example adhering, as shown in FIG. 43. Those skilled in the art should understand that specific shape of the frame 700 shall not confine the present invention.

Referring to FIGS. 44 to 48A, the array camera module with its photosensitive unit according to a twentieth preferred embodiment of the present invention is illustrated. The photosensitive unit 200 is adapted for assembling and producing the array camera module. The photosensitive unit 200 includes a conjoined encapsulation portion 201 and a photosensitive portion 202.

The conjoined encapsulation portion 201 is integrally encapsulated to connect to the photosensitive portion 202, such as being molded to connect to the photosensitive portion 202.

The photosensitive portion 202 includes a main circuit board 2022 and two photosensitive sensors 2021, wherein the photosensitive sensors 2021 are respectively disposed on the main circuit board 2022. According to the present twentieth embodiment of the present invention, the photosensitive sensors 2021 are molded to connect to the main circuit board 2022. More specifically, the conjoined encapsulation portion 201 is moldingly coupled to the photosensitive portion 202 by means of, for example, the method of Molding on Chip (MOC).

The conjoined encapsulation portion 201 forms two windows 20100, wherein the conjoined encapsulation portion 201 is positioned surrounding the outer sides of the two photosensitive sensors 2021 respectively and provides light paths for the two camera lenses 500 and the two photosensitive sensors 2021 respectively through the windows 20100. The photosensitive sensors 2021 are disposed at the position aligned corresponding to the two windows 20100 respectively on the main circuit board 2022.

Figure 48A:
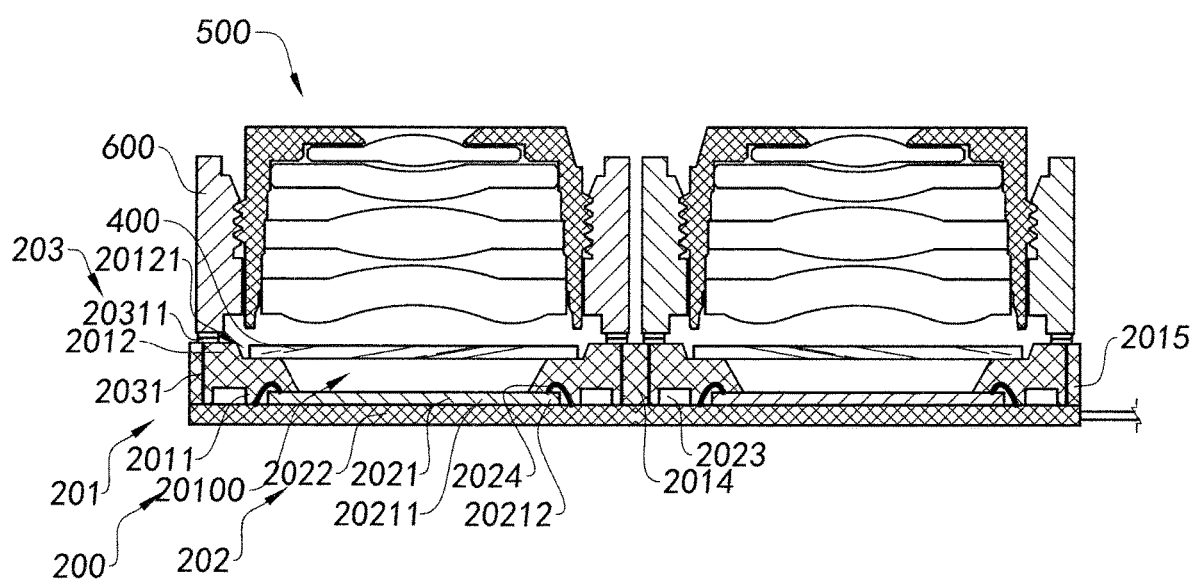
FIGS. 48A and 48B are sectional views illustrate the alternative modes of the camera module according to the above 20th preferred embodiment of the present invention.
Figure 48B:
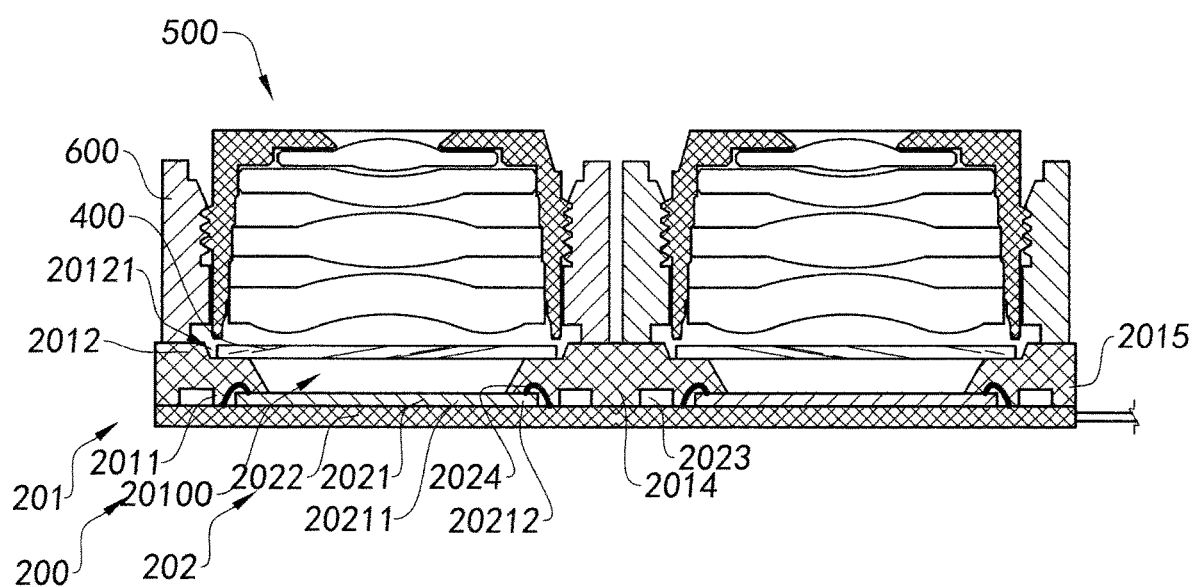

The conjoined encapsulation portion 201 includes a connecting unit 2014 and two ring shaped outer surrounding units 2015. The connecting unit 2014 is molded to connect between the two outer surrounding units 2015 integrally to form an integral body. The connecting unit 2014 also separates the two ring shaped outer surrounding units 2015 into two neighboring portions, wherein two windows 20100 are defined in the two surrounding units 2015 respectively. Two photosensitive sensors 2021 are respectively positioned at two sides of the connecting unit 2014, that is aligned with the windows 20100 of the two surrounding units 2015 respectively, so as to be adapted for assembling the array camera module. It is worth mentioning that the connecting unit 2014 is a common segment for the two camera lenses 500, which means that as the camera lenses 500 are installed, each of the camera lenses 500 occupies and is supported by a corresponding portion of the connecting unit 2014, as shown in FIG. 48A.

According to the present twentieth embodiment of the present invention, the photosensitive portion 202 includes a connecting circuit (not shown in the figures) and at least two circuit elements 2023. The connecting circuit is preinstalled in the main circuit board 2022. The circuit elements 2023 are electrically connected to the connecting circuit and the photosensitive sensors 2021 respectively, so that the two photosensitive sensors 2021 would process their photosensing processes accordingly. The circuit elements 2023 are protrudingly deployed on the main circuit board 2022. The circuit elements 2023 can be, for example but not limited to, resistors, capacitors, diodes, triodes, potentiometers, electric relays, or actuators.

It is worth mentioning that the conjoined encapsulation portion 201 is molded to encapsulate and wrap up the circuit elements 2023 therein, so that the circuit elements 2023 will not be directly exposed in the open space, and more specifically, not be exposed in the environment that communicates with the photosensitive sensors 2021. Therefore, during the assembling of the array camera module, the circuit elements 2023 will not be contaminated by pollutants, such as dusts, or influence the photosensitive sensor 2021, which is different from the arrangement of the conventional camera module that the circuit elements 2023, such as resistance-capacitance components, are exposed to the outside. The use of the molding method in the present invention prevents sundries and dusts from staying on the surface of the circuit elements 2023 and avoids the photosensitive sensors 2021 from being contaminated and causing dark spots and other defectives of the array camera module.

It is worth mentioning that the present twentieth embodiment the circuit elements 2023 protruded on the main circuit board 2022 is used as an example for the description, whereas in other embodiments of the invention, the circuit elements 2023 can be embedded in the main circuit board 2022 without protruding from the main circuit board 2022. Person skilled in the art should understand that the structures, types, and mounting positions of the circuit element 2023 shall not limit the scope of the present invention.

According to the present twentieth preferred embodiment of the present invention, the photosensitive portion 202 includes a plurality of connecting elements 2024 for respectively electrically connecting the photosensitive sensors 2021 with the main circuit board 2022. Further, each of the connecting elements (lead wires) 2024 can be embodied to be, specifically but not limited to, gold wire, copper wire, aluminum wire, and/or silver wire.

It is worth mentioning that the connecting elements 2024 are preferred to be molded inside the conjoined encapsulation portion 201, so that the conjoined encapsulation portion 201 substantially enclose, encapsulate and/or wrap up the connecting elements 2024 and keep them from direct exposure to the outside. Therefore, during assembling the array camera module, the connecting elements 2024 will not suffer any collision or damage, which, at the same time, reduces the impact due to the environmental factors, such as temperature, on the connecting elements 2024 and stabilizes the communication and connection between the photosensitive sensors 2021 and the main circuit board 2022. This is not being provide in the traditional art.

From the bottom of each of the windows 20100 of the conjoined encapsulation portion 201, the size of the window 20100 is gradually enlarged to the top thereof to form a slope shape in order to adapt to the shape of the connecting elements 2024 and to facilitate the mold unloading and releasing in the molding process.

It is worth mentioning that the conjoined encapsulation portion 201 which substantially enclose, encapsulate and/or wrap up the circuit elements 2023 and the connecting elements 2024 advantages in protecting the circuit elements 2023 and the connecting elements 2024 as well as in achieving a higher performance array camera module. However, person skilled in the art should understand that the conjoined encapsulation portion 201 shall not be limited in wrapping up the circuit elements 2023 and/or the connecting elements 2024. In other words, in other embodiments of the present invention, the conjoined encapsulation portion 201 can be directly molded on the main circuit board 2022 without protruded circuit elements 2023 or be molded on various positions, such as the outer side, periphery, etc., of the circuit elements.

In addition, the photosensitive sensor 2021 has a photosensitive area 20211 and a non-photosensitive area 20212, wherein the non-photosensitive area 20212 is positioned surrounding the periphery of the photosensitive area 20211. The photosensitive area 20211 is adapted for conducting photosensitization. The connecting element 2024 is connected to the non-photosensitive area 20212.

According to the twentieth preferred embodiment of the present invention, the conjoined encapsulation portion 201 is extended on the non-photosensitive areas 20212 of the two photosensitive sensors 2021, so as to overlappedly mount the photosensitive sensors 2021 on the main circuit board 2022 side by side by molding. In this manner, such as by means of the method of Molding On Chip (MOC), the moldable area of the conjoined encapsulation portion 201 can be extended inwardly, such that the structural portion of the outer portion of the conjoined encapsulation portion 201 and the main circuit board 2022 can be reduced, which further reduces the size in length and width of the molded photosensitive portion 202 and reduces the size in length and width of the array camera module assembled thereby.

In the present twentieth embodiment of the present invention, the conjoined encapsulation portion 201 is protrudingly positioned surrounding the outside of the photosensitive areas 20211 of the two photosensitive sensors 2021. Particularly, the conjoined encapsulation portion 201 integrally encapsulates and encloses the connection of photosensitive sensors 2021 and the main circuit board 2022, so as to provide a good sealingness and tightness. Therefore, when the photosensitive unit 200 is used in assembling the array camera module, photosensitive sensors 2021 will each be respectively sealed inside to form a sealed inner space.

Specifically, a conventional circuit board may be used to produce the main circuit board 2022 of the photosensitive unit 200. Two photosensitive sensors 2021 are installed on the main circuit board 2022 and electrically connected with the connecting elements 2024. Then, after the initial assembling of the main circuit board 2022 and the photosensitive sensor 2021, they are processed by Surface Mount Technology (SMT) and molded, for example by means of the insert molding technique by an injection molding machine, to form the conjoined encapsulation portion 201, or by means of the pressing molding technique, which is commonly used in semiconductor packaging, to form the conjoined encapsulation portion 201. The main circuit board 2022 can selectively be, for example but not limited to, rigid-flex board, ceramic substrate (without flexible board), or rigid PCB (without flexible board). The method to form the conjoined encapsulation portion 201 can be selected from, for example but not limited to, injection molding technique and pressing molding technique. The material of the conjoined encapsulation portion 201 can be, for example but not limited to, nylon, liquid crystal polymer (LCP), or polypropylene (PP) for injection molding technique, or resin for pressing molding technique. Those skilled in the art should understand that the above available manufacture methods and available materials are examples to describe available implementations of the present invention, rather than limitations of the present invention.

Furthermore, the conjoined encapsulation portion 201 includes a covering section 2011 and an optical filter installing section 2012. The optical filter installing section 2012 is molded to connect with the covering section 2011 integrally to form an integral body. The covering section 2011 is molded to connect on the main circuit board 2022 for encapsulating, wrapping up and covering the circuit elements 2023 and the connecting elements 2024. The optical filter installing section 2012 is adapted for mounting the optical filters 400. In other words, when the photosensitive unit 200 is utilized for assembling the array camera module, the optical filters 400 of the array camera module are mounted at the optical filter installing section 2012 and deployed along the photosensitive paths of the photosensitive sensors 2021 respectively without the need of any additional mounting frame for installation of the optical filters 400. In other words, the conjoined encapsulation portion 201 itself can function as a conventional frame. Taking advantage of the molding technique, the top of the optical filter installing section 2012 can be molded to have good flatness, smoothness and evenness, so as to allow the optical filters 400 to be evenly installed, wherein this feature is superior to the conventional camera modules.

In addition, the optical filter installing section 2012 has two installing grooves 20121 provided therein. The installing grooves 20121 are respectively communicated to the two windows 20100 respectively so as to provide adequate installation space for the two optical filters 400 installed therein, such that the optical filters 400 will not protrude on the top surface of the optical filter installing section 2012. In other words, the conjoined encapsulation portion 201 has two installing grooves 2121 indented therein for respectively installing the optical filters 400 on the conjoined encapsulation portion 201 without protruding out from the top of the conjoined encapsulation portion 201. Particularly, each of the optical filters 400 can be an Infrared-Cut Filter (IRCF).

It is worth mentioning that, in the present twentieth embodiment of the present invention, the installing grooves 20121 can be used for the installation of the optical filters 20, whereas in other embodiments of the present invention, each of the installing grooves 20121 can be used for the installation of other element, such as the camera lens or motor unit of the array camera module. Those skilled in the art should understand that the use and/or shape of the installing groove 20121 shall not be a limitation of the present invention.

It is worth mentioning that the inner walls of the windows 20100 of the conjoined encapsulation portion 201 can be shaped according to the shape of the object such as the optical filter to be connected thereto. For example, it can be in an inclined or slope shape, so that the time the connecting element 2024 is wrapped, the photosensitive sensor 2021 can receive more light while the connecting elements 2024 are encapsulated and wrapped up by the encapsulation portion 201. Those skilled in the art should understand that specific shape of the conjoined encapsulation portion 201 shall not limit the scope the present invention.

Furthermore, according to the present twentieth preferred embodiment of the present invention, the photosensitive unit 200 includes two motor connecting structures 203 for respectively connecting to two motor units 600 of the array camera module. Each of the motor units 600 has at least one motor terminal 601. Each of the motor connecting structure 203 includes at least one connecting element such as lead wire 2031, wherein each of the connecting elements 2031 is connected to the motor unit 600 and the main circuit board 2022. Each of the connecting elements 2031 is electrically connected to the main circuit board 2022. Further, each of the connecting elements 2031 is electrically connected to the connecting circuit of the main circuit board 2022. The connecting element 2031 is deployed in the conjoined encapsulation portion 201 and extended to the top of the conjoined encapsulation portion 201. Each of the connecting elements 2031 includes a motor coupling end 20311 exposed on the top portion of the conjoined encapsulation portion 201 for being electrically connected to the motor terminal 601 of the respective motor unit 600. It is worth mentioning that the connecting elements 2031 can be deployed by embedding during the molding formation of the conjoined encapsulation portion 201. In the conventional way of connection, components like driving motors are connected to the circuit board through independent lead wires, which involve relatively complicated manufacture technique. However, according to the molding method of the present invention, the connecting elements 2031 are embedded in the molding process which not only can substitute the conventional technological processes, like motor soldering, but also make the circuit connection more stable. Particularly, in the twentieth preferred embodiment of the present invention, each of the connecting elements 2031 is embodied as a conductor embedded inside the conjoined encapsulation portion 201. For example, the motor terminal 601 can be connected to the motor coupling end 20311 with anisotropic conductive film or by welding and soldering.

It is worth mentioning that the embedding positions of the connecting elements 2031 and the revealing positions of the motor coupling ends 20311 of the connecting elements 2031 on the conjoined encapsulation portion 201 may be disposed based on the user's needs. For instance, in one preferred embodiment of the present invention, the motor coupling ends 20311 of the connecting elements 2031 can be deployed on the periphery of the conjoined encapsulation portion 201 which are the top surface of the conjoined encapsulation portion 201 and the top surface of the optical filter installing section 2012. However, in another embodiments of the present invention, the motor coupling ends 20311 can be deployed on the inner sides of the conjoined encapsulation portion 201 which are the bottom sides of the installing grooves 20121 of the conjoined encapsulation portion 201. Therefore, there may be various installation sites provided for the motor units 600. In other words, when the motor units 600 have to be installed on the top of the conjoined encapsulation portion 201, the motor coupling ends 20311 will be provided on the top surface of the outer side of the conjoined encapsulation portion 201. When the motor units 600 have to be installed in the installing grooves 20121 respectively, the motor coupling ends 20311 are provided on the inner sides of the conjoined encapsulation portion 201, which are the bottoms of the installing grooves 20121.

In other words, when producing the photosensitive unit 200, the photosensitive sensors 221 are firstly adhered on the main circuit board 2022 and then the conjoined encapsulation portion 201 is molded on the main circuit board 2022 and the photosensitive sensor 2021 by means of the MOC technology. At the same time, the connecting elements 2031 can be embedded in the conjoined encapsulation portion 201 during the molding, which electrically connects the connecting elements 2031 with the main circuit board 2022 and reveals the motor coupling ends 20311 of the connecting elements 2031 on the top of the conjoined encapsulation portion for connecting with the motor terminals 601 of the motor units 600 respectively. For example, when the photosensitive unit 200 is to be installed on the array camera module, motor terminals 601 of the motor units 600 are connected to the motor coupling ends 20311 of the connecting elements 2031 by welding and soldering so as to electrically connect the motor units 600 with the main circuit board 2022. An independent connecting element such as lead wire is required to be deployed to connect the motor unit 600 and the main circuit board 2022 to allow the length of the motor terminal 601 of the motor unit 600 to be shortened.

Referring to FIGS. 44 to 48A, the array camera module according to the twentieth preferred embodiment of the present invention is illustrated, which can be embodied as an Automatic Focus Camera Module (AFCM), which includes one the photosensitive unit 200, two the optical filters 400, two the motor units 600, and two the camera lenses 500.

The optical filters 400 are mounted in the photosensitive unit 200, while the camera lenses 500 are mounted in the motor units 600 respectively. The motor units 600 are mounted on the photosensitive unit 200.

Furthermore, the optical filters 400 are mounted at the installing grooves 20121 of the optical filter installing section 2012 of the conjoined encapsulation portion 201 of the photosensitive unit 200. The motor units 600 are mounted on the top of the optical filter installing section of the conjoined encapsulation portion 21 of the photosensitive unit 200.

Furthermore, the motor terminals 601 of the motor units 600 are electrically connected with the motor coupling ends 20311 of the motor connecting structures 203 respectively, so as to electrically connect to the main circuit board 2022 through the motor connecting structures 203.

Those skilled in the art should understand that the structures and forms of the camera module mentioned above array are just examples to describe ways of implementing the array camera module, rather than limitations of the present invention.

Figure 49A:
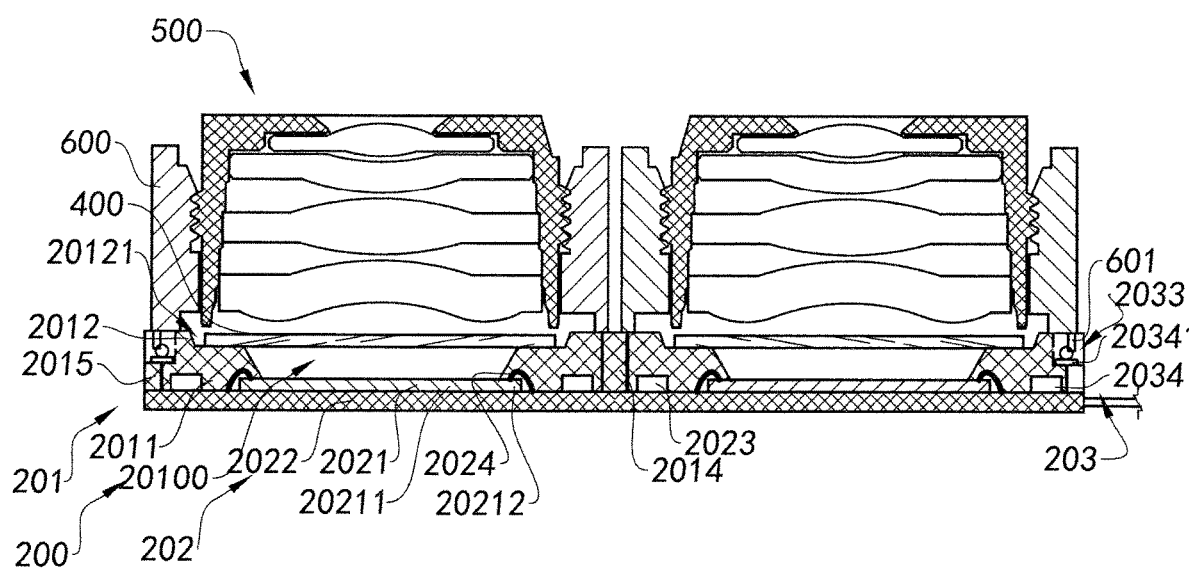
FIGS. 49A, 49B, and 49C illustrate different alternative embodiments of the motor connecting structure of the photosensitive unit according to the above 20th preferred embodiment of the present invention.

Referring to FIG. 49A, an alternative mode of the motor connecting structure of the above twentieth preferred embodiment of the present invention is illustrated. Each of the motor connecting structures 203 includes a terminal slot 2033. The terminal slot 2033 is for accommodating the motor terminal 601 of the respective motor unit 600 of the array camera module. The terminal slot 2033 is deployed on the top of the conjoined encapsulation portion 201. The motor connecting structure 203 includes at least one connecting element such as lead wire 2034, wherein the connecting elements 2034 are connected to the motor units 600 and the main circuit board 2022. The connecting elements 2034 are deployed in the conjoined encapsulation portion 201 and upwardly extended to the bottom walls of the terminal slots 2033 of the conjoined encapsulation portion 201. Each of the connecting elements 2034 includes a motor coupling end 20341 exposed on the bottom wall of the respective terminal slot 2033 of the conjoined encapsulation portion 201 for being electrically connected to the motor terminal 601 of the respective motor unit 600. Particularly, in an implementation, the motor coupling ends 20341 can each be embodied to be a pad. The connecting elements 2034 can each be embodied as a conductor to be embedded inside of the conjoined encapsulation portion 201.

In other words, in producing the photosensitive unit 200, the photosensitive sensors 221 are firstly adhered on the main circuit board 2022. Then, the conjoined encapsulation portion 201 is molded on the main circuit board 2022 and the photosensitive sensors 2021 by means of the MOC technology, wherein, at the same time, the terminal slots 2033 with predetermined length are preset and the connecting elements 2034 are arranged to be embedded therein during the molding, wherein the connecting elements 2034 are electrically connected with the main circuit board 2022 and reveal the motor coupling ends 20341 of the connecting elements 2034 on the bottom walls of the terminal slots 2033 of the conjoined encapsulation portion 201 for connecting with the motor terminals 601 of the motor units 600 respectively. For example, when the photosensitive unit 200 is to be installed on the array camera module, the motor terminals 601 of the motor units 600 are inserted into the terminal slots 2033 and connected to the motor coupling ends 20341 of the connecting elements 2034 respectively by welding and soldering so as to electrically connect the motor units 600 with the main circuit board 2022. An independent connecting element such as lead wire is required to be deployed to connect each of the motor units 600 and the main circuit board 2022 to ensure stable connection for the motor terminal 601 of the motor unit 600 and to keep unnecessary contact from the motor terminal 601. Particularly, the connecting elements 2034 can each be embodied as a conductor to be embedded inside of the conjoined encapsulation portion 201.

Figure 49B:
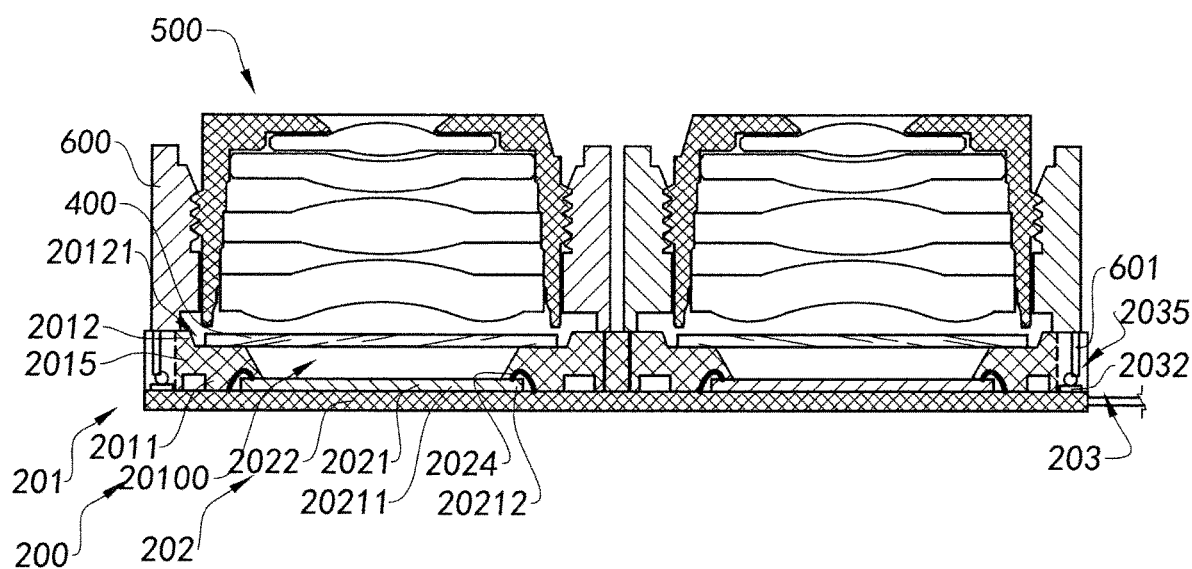

Referring to FIG. 49B, another alternative mode of the motor connecting structure of the above twentieth preferred embodiment of the present invention is illustrated. Each of the motor connecting structures 203 includes a terminal slot 2035. The terminal slots 2035 are adapted for accommodating the motor terminals 601 of the motor units 600 of the array camera module. The terminal slots 2035 are deployed on the conjoined encapsulation portion 201. Each of the motor connecting structures 203 includes at least one circuit junction 2032, wherein the circuit junction 2032 is preset on the main circuit board 2022 and electrically connected to the connecting circuit in the main circuit board 222. Furthermore, each of the terminal slots 2035 is extended from the top of the conjoined encapsulation portion 201 to the main circuit board 2022 to show the circuit junction 2032. In one preferred embodiment, the motor terminals 601 are adapted to insert into the terminal slots 2035 and can be solderingly and weldingly connected the circuit junctions 2032 respectively.

In other words, when producing the photosensitive unit 200, each of the circuit junctions 2032 is preset on the main circuit board 2022. Then, the photosensitive sensors 221 are attached on the main circuit board 2022. Then, the conjoined encapsulation portion 201 is molded on the main circuit board 2022 and the photosensitive sensors 2021 by means of the MOC technology. At the same time, each of the terminal slots 2035 with predetermined length is preset and the respective circuit junction 2032 is revealed through the terminal slot 2035 for connecting with the motor terminal 601 of the respective motor unit 600. For example, when the photosensitive unit 200 is to be assembled on the array camera module, the motor terminals 601 of the motor units 600 are inserted into the terminal slots 2035 and connected to the circuit junctions 2032 of the main circuit board 2022 by welding and soldering respectively so as to electrically connect the motor units 600 with the main circuit board 2022 and to ensure stable connection for the motor terminals 601 of the motor units 600 and to keep unnecessary contact from the motor terminals 601.

Figure 49C:
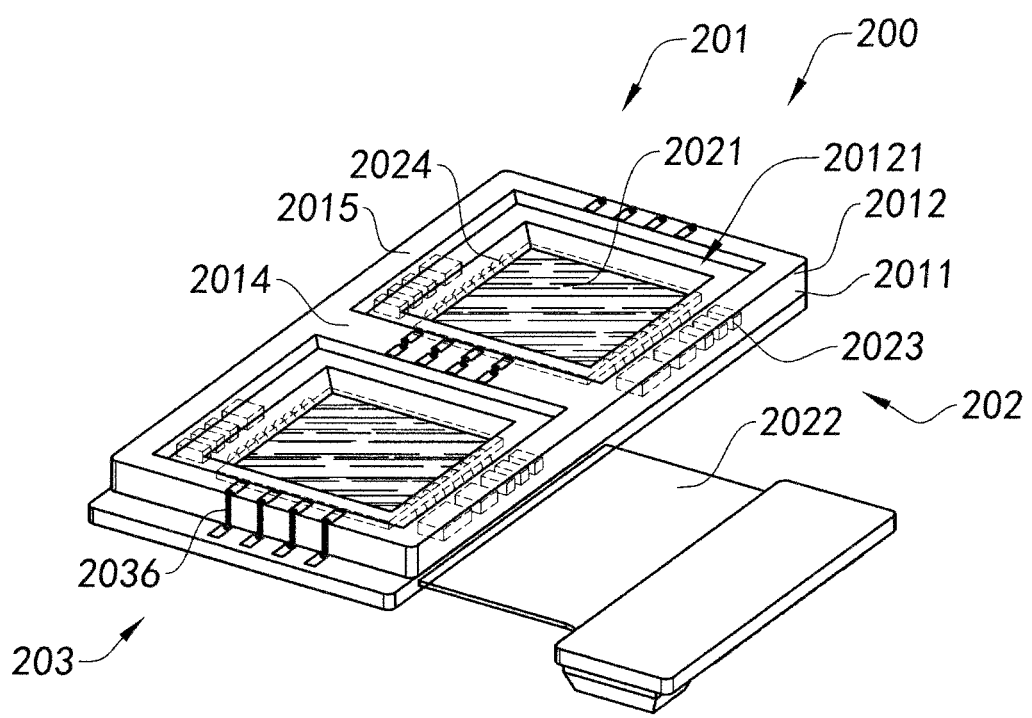

Referring to FIG. 49C, another alternative mode of the motor connecting structure of the above twentieth preferred embodiment of the present invention is illustrated. Each of the motor connecting structures 203 includes a carving line 2036. The carving lines 2036 are adapted to electrically connect the connecting elements, the photosensitive sensors 2021, and the motor units 600 on the main circuit board 2022. For example, but not limited to, the carving lines 2036 can be deployed by electronic carving or Laser Direct Structuring (LDS) during the forming of the conjoined encapsulation portion 201. In the conventional way of connection, components like driving motors are connected to the circuit board through independent lead wires, which involve relatively complicated manufacture technique. However, according to the molding method of the present invention, the arrangement of the carving lines 2036 in the molding process can not only substitute the conventional technological processes, like motor soldering, but also make the circuit connection more stable. More specifically, the formation process of the carving line 2036 can be carving on the conjoined encapsulation portion 201 and then laying the circuit by electroplating in the carved grooves.

In one embodiment of the present invention, the motor units 600 of the array camera module which are connected with the photosensitive unit 200 is described as an example that uses the motor connecting structure 203 for the connection, which includes, for example, using the connecting element 2031 for the connection. However, in other embodiments of the present invention, the connecting method for the motor unit 600 may also combine with the connecting methods as shown in FIGS. 49A, 49B, and 49C, such as utilizing the terminal slot 2033 and the lead wire 2034, the terminal slot 2035 and the circuit junction 2032, and etc. In another embodiments of the present invention, referring to FIG. 48B, the motor unit 600 may be connected with the photosensitive unit 200 with a traditional method, such as welding and soldering. Those skilled in the art should understand that specific way of connecting the motor 600 and the photosensitive unit 200 shall not limit the scope of the present invention.

Figure 50:
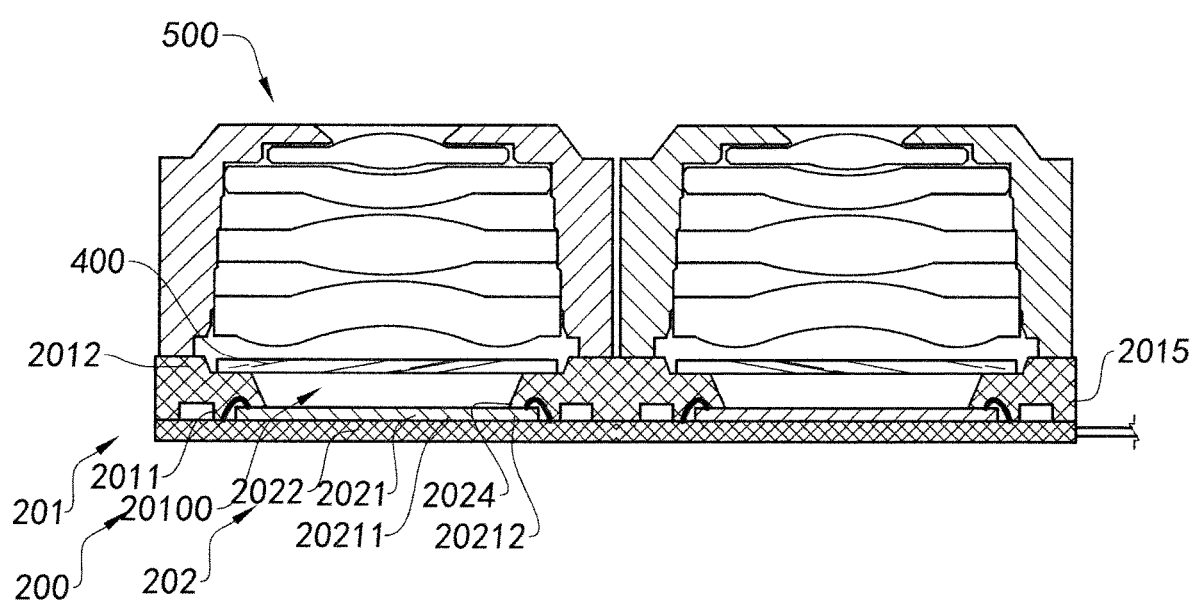
FIG. 50 is a sectional view of an alternative mode of the camera module according to the above 20th preferred embodiment of the present invention.

Referring to FIG. 50, another alternative mode of the array camera module according to the twentieth preferred embodiment of the present invention is illustrated, which can be a fixed focus array camera module including one the photosensitive unit 200, two the optical filters 400 and two the camera lenses 500.

The optical filters 400 are mounted above the photosensitive unit 200, while the camera lenses 500 are mounted on the photosensitive unit 200.

More specifically, the optical filters 400 are respectively mounted at the installing grooves 20121 of the optical filter installing section 2012 of the conjoined encapsulation portion 201 of the photosensitive unit 200. The camera lenses 500 are mounted on the top of conjoined encapsulation portion 201 of the photosensitive unit 200.

It is also worth mentioning that the camera lenses 500 are supported on the top of the conjoined encapsulation portion 201 of the photosensitive unit 200. Therefore, the conjoined encapsulation portion 201 can function as the independent mounting frame of a conventional camera module to provide a supportive and holding site, but the present invention is assembled by different technical process from the conventional COB technology. The mounting frame of a conventional camera module based on conventional COB technique is affixed on the circuit board by adhesive. However, the conjoined encapsulation portion 201 of the present invention is affixed on the main circuit board 2022 by means of the molding technique that does not require such adhering and affixing process. Contrasting to the conventional adhering and fixating process, the molding process of the present invention provides better connection stability and technological process controllability. Besides, it does not have to reserve any adhering space between the conjoined encapsulation portion 201 and the main circuit board 2022 for AA adjustment, which, therefore, saves the adhering space of AA adjustment of conventional camera module, and allows the thickness of the camera module to be further reduced. Meanwhile, the conjoined encapsulation portion 201 encapsulates and wraps the circuit elements 2023 and the connecting elements 2024, so that the frame function of conventional mounting frame, the circuit elements 2023 and the connecting elements 2024 can be spatially overlapped. It is different to the conventional camera module that requires to reserve safety distance around the circuit components. Accordingly, the height of the conjoined encapsulation portion 201, which has the function of the conventional independent frame, can be arranged in a smaller range, so as to further provide room for reducing the thickness of the array camera module of the present invention. Besides, the conjoined encapsulation portion 201 substitutes the conventional independent frame to avoid the tilt deviation occurred in attaching and assembling the conventional independent frame and to reduce the accumulated tolerance in the assembling of the camera module. In addition, the conjoined encapsulation portion 201 encapsulates and wraps up the connecting elements 2024 and extends to the non-photosensitive area 20212 of the photosensitive sensor 2021, which allows the conjoined encapsulation portion 201 to shrink inwards, so as to further reduce the lateral sizes in length and width of the array camera module.

Figure 51:
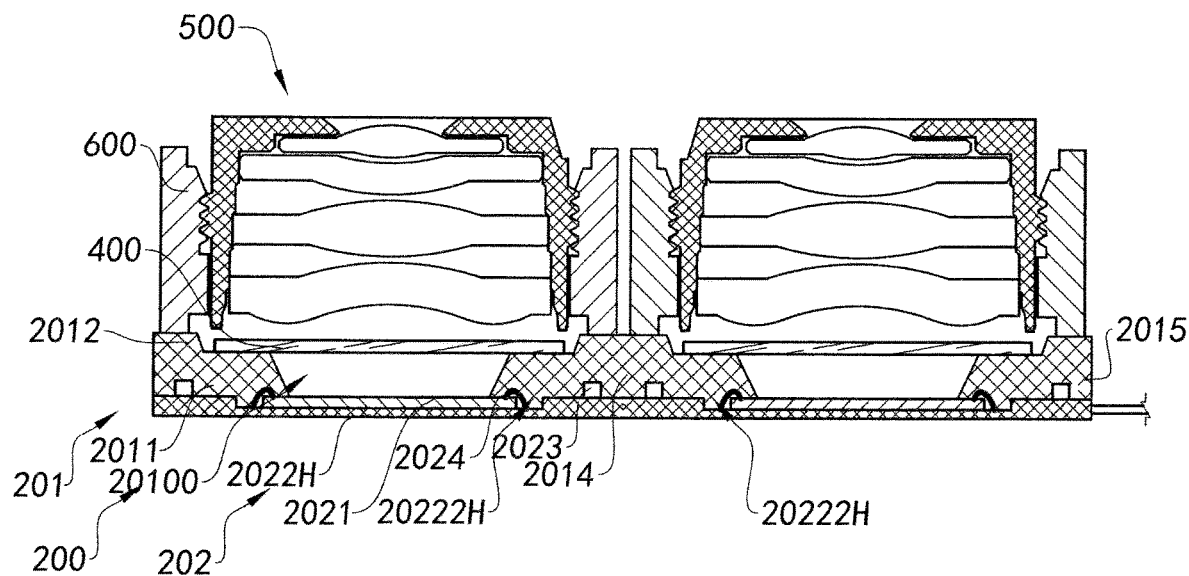
FIG. 51 is a sectional view of an array camera module with molded circuit unit according to a 21th preferred embodiment of the present invention.

Referring to FIG. 51, the array camera module with its photosensitive unit according to a twenty-first preferred embodiment of the present invention is illustrated. The different between this twenty-first preferred embodiment and the above preferred embodiments is that, the main circuit board 2022H has two inner grooves 20222H indented therein. The photosensitive sensors 2021 are respectively in in the inner grooves 20222H, so as to reduce the relative total height of the photosensitive sensors 2021 and the main circuit board 2022H. Therefore, when the conjoined encapsulation portion 201 covers and wraps up the photosensitive sensors 2021, a lower height demand of the conjoined encapsulation portion 201 can be achieved, and thus the height of the array camera module assembled with the photosensitive unit 200 can be further reduced.

Figure 52:
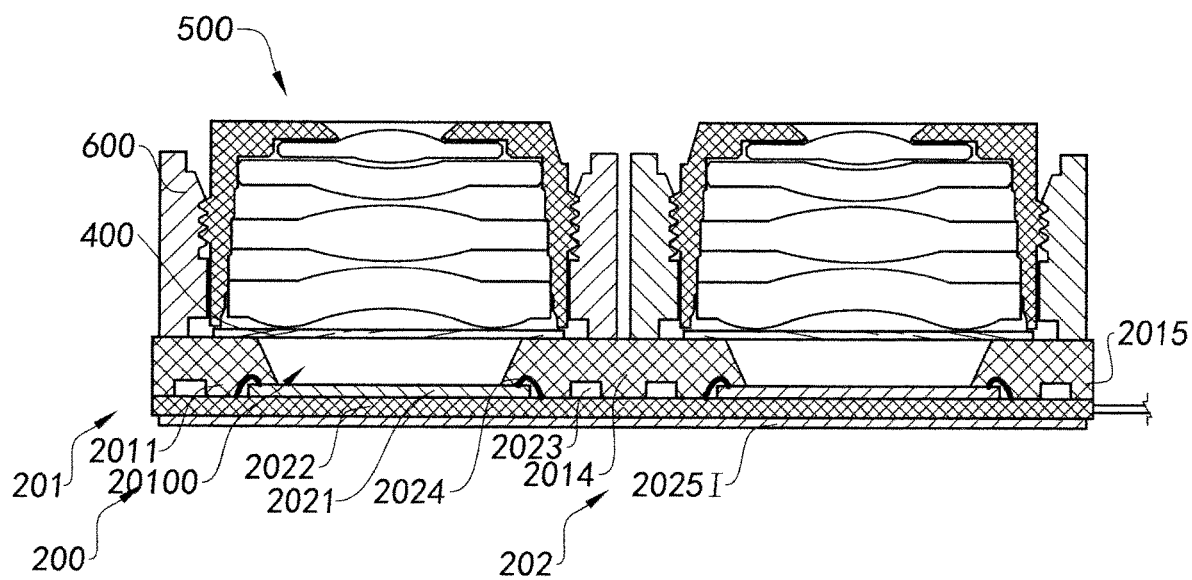
FIG. 52 is a sectional view of an array camera module with photosensitive unit according to a 22th preferred embodiment of the present invention.

Referring to FIG. 52, the array camera module with its photosensitive unit according to a twenty-second preferred embodiment of the present invention is illustrated.

The different between this twenty-second preferred embodiment and the above preferred embodiments is that, in the present embodiment of the present invention, the photosensitive portion 202 of the photosensitive unit 200 includes a reinforced layer 20251 overlappedly attached to the bottom of the main circuit board 2022, so as to reinforce the structural strength of the main circuit board 2022. In other words, the reinforced layer 20251 is adhered on the relative areas of the bottom portion of the main circuit board 2022 where the conjoined encapsulation portion 201 and the photosensitive sensors 2021 are located, so that the main circuit board 2022 reinforced by the reinforced layer 20251 can stably and reliably support the conjoined encapsulation portion 201 and the photosensitive sensors 2021.

Furthermore, the reinforced layer 20251 is embodied as a metal plate attaching on the bottom of the main circuit board 2022 to increase the structural strength of the main circuit board 2022 as well as to enhance the heat dissipation of the photosensitive unit 200 by effectively dissipating heat generated by the photosensitive sensors 2021.

It is worth mentioning that the main circuit board 2022 can be a Flex Print Circuit (FPC). By enhancing the rigidity of the FPC with the reinforced layer, the FPC that has excellent flexural property can still qualify for the load bearing requirement for the photosensitive unit 200. In other words, there are more available options for the main circuit board 2022, such as PCB (Printed Circuit Board), FPC (Flexible Printed Circuit), and RF (Rigid Flex). By using the reinforced layer 20251 to enhance the structural strength and heat dissipation of the main circuit board 2022, the thickness of the main circuit board 2022 can also be reduced, which helps to further reduce the height of the photosensitive unit 200 as well. Hence, the total height of the array camera module assembled thereby can be reduced.

Figure 53:
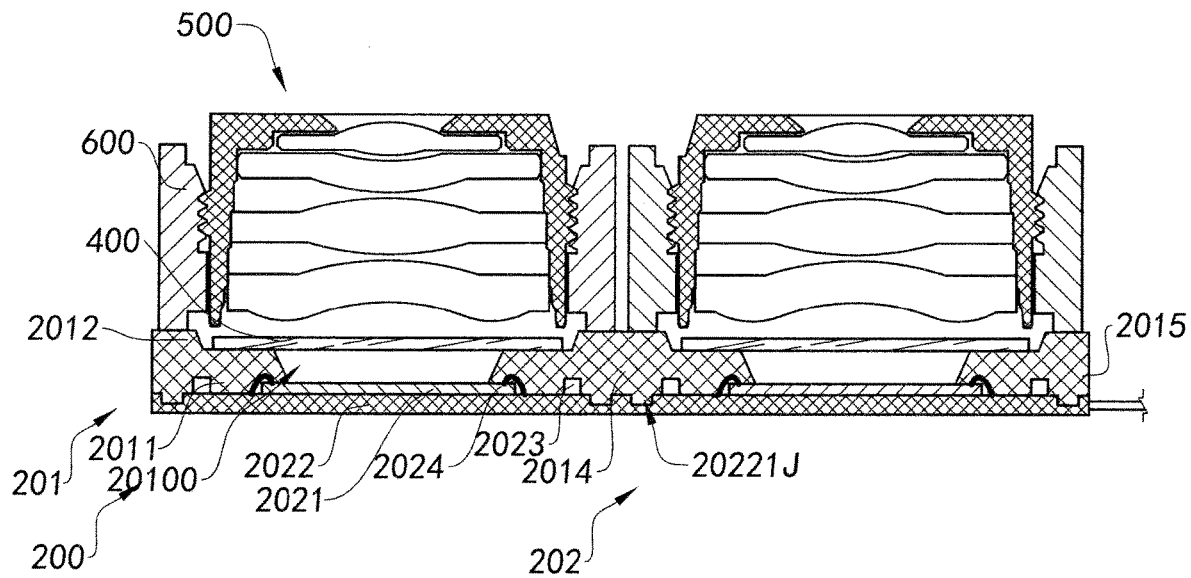
FIG. 53 is a sectional view of an array camera module with photosensitive unit according to a 23th preferred embodiment of the present invention.

Referring to FIG. 53, the array camera module with its photosensitive unit according to a twenty-third preferred embodiment of the present invention is illustrated.

The different between this twenty-third preferred embodiment and the above preferred embodiments is that, the main circuit board 2022J has one or more reinforced holes 20221J indented therein and the conjoined encapsulation portion is extended into the reinforced holes 20221J, so as to enhance the structural strength of the main circuit board 2022J.

The positions of the reinforced holes 20221J can be determined based on the practical needs. Also, it can be arranged based on the need of the structural strength of the circuit board, which can be, for example, arranged in a symmetrical construction. The arrangement of the reinforced holes 20221J makes the structural strength of the main circuit board 2022J being stronger, which allows the thickness of the main circuit board 2022J and the thickness of the camera module assembled thereof to be reduced. Besides, heat dissipation performance of the photosensitive unit 200 is enhanced as well.

It is worth mentioning that each of the reinforced holes 20221J is in groove shape, so that when manufacturing the photosensitive unit 200, the molding material of the conjoined encapsulation portion will not leak off from the reinforced holes 20221J.

Figure 54:
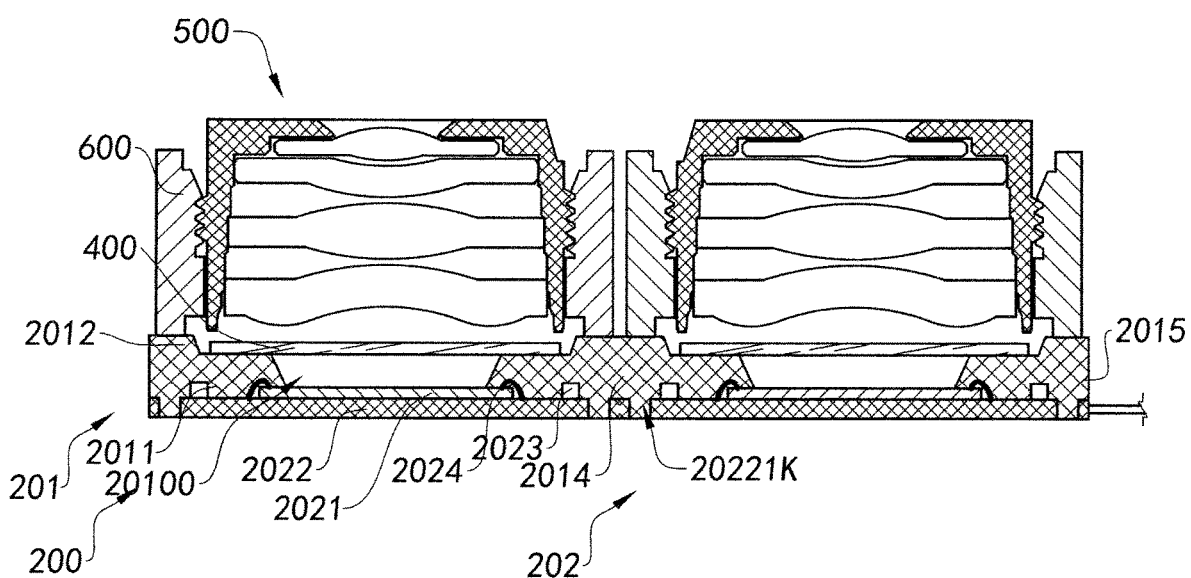
FIG. 54 is a sectional view of an array camera module with photosensitive unit according to a 24th preferred embodiment of the present invention.

Referring to FIG. 54, the array camera module with its photosensitive unit 200 according to a twenty-fourth preferred embodiment of the present invention is illustrated.

The different between this twenty-fourth preferred embodiment and the above preferred embodiments is that, the main circuit board 2022K has one or more reinforced holes 20221K provided therethrough and the conjoined encapsulation portion is extended to fill in the reinforced holes 20221K, so as to enhance the structural strength of the main circuit board 2022K.

The positions of the reinforced holes 20221K can be determined based on the practical needs. Also, they can be arranged based on the need of the structural strength of the circuit board, which can be, for example, arranged in a symmetrical construction. The arrangement of the reinforced holes 20221K makes the structural strength of the main circuit board 2022K being stronger, which allows the thickness of the main circuit board 2022K and the thickness of the camera module assembled thereof to be further reduced. Besides, heat dissipation performance of the photosensitive unit 200 is enhanced as well.

It is worth mentioning that the reinforced holes 20221K are through holes, which, in other words, penetrate through the main circuit board 2022K, so as to communicate the top side and the bottom side of the main circuit board 2022K. Therefore, during the production of the photosensitive unit 200, the molding material of the conjoined encapsulation portion can fill into reinforced holes 20221K and be fully bonded with the main circuit board 2022K and form a more solid structure of combined composite material. Besides, in comparison to the indented reinforced holes 20221J of the above twenty-third embodiment, the through hole type reinforced holes 20221K are is easier to be made and processed.

Figure 55:
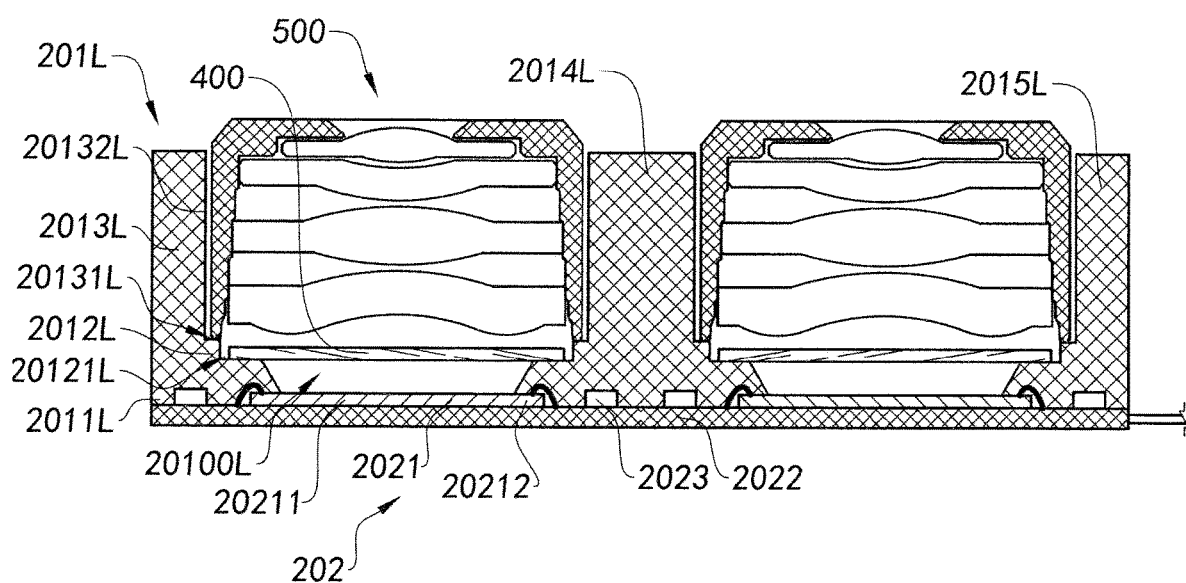
FIG. 55 is a sectional view of an array camera module with photosensitive unit according to a 25th preferred embodiment of the present invention.

Referring to FIG. 55, the array camera module with its photosensitive unit according to a twenty-fifth preferred embodiment of the present invention is illustrated.

The conjoined encapsulation portion 201L includes a covering section 2011L, an optical filter installing section 2012L and a camera lens installing section 2013L. The optical filter installing section 2012L and the camera lens installing section 2013L are integrally molded to extend upwardly from the covering section 2011L orderly to form an integral body. The covering section 2011L is molded to attach on the main circuit board 2022 for wrapping up and covering the circuit elements 2023 and the connecting elements 2024. The optical filter installing section 2012L is integrally molded to extend upwards from the covering section 2011L for mounting the optical filters 400. In other words, when the photosensitive unit 200 is utilized for assembling the array camera module, the optical filters 400 of the array camera module will be mounted at the optical filter installing section 2012L, wherein the optical filters 400 are deployed and aligned along the photosensitive paths of the photosensitive sensors 2021 respectively without the need of any additional mounting frame for installing the optical filter 400. In other words, the conjoined encapsulation portion 201L itself can function as a conventional mounting frame. Taking advantage of the molding technique, the top of the optical filter installing section 2012L can be modeled to have good flatness, smoothness and evenness, so as to allow the optical filters 400 to be evenly installed, wherein such feature is more superior to conventional camera modules. The camera lens installing section 2013L is integrally molded to extend upwards from the optical filter installing section 2012L for mounting the camera lenses 500. In other words, when the photosensitive unit 200 is utilized in the assembling the array camera module, the camera lenses 500 are mounted at the inner portion of the camera lens installing section 2013L of the conjoined encapsulation portion 201L, which provides stable mounting positions for the camera lenses 500.

The conjoined encapsulation portion 201L includes a connecting unit 2014L and two outer surrounding units 2015L. The connecting unit 2014L is integrally molded to connect between the two outer surrounding units 2015L, wherein the connecting unit 2014L also separates the two outer surrounding units 2015L into two neighboring portions, wherein each of the outer surrounding units 2015L forms a window 20100L. Two photosensitive sensors 2021 are respectively located at two sides of the connecting unit 2014L and aligned with the two outer surrounding units 2015L, the two windows 20100L and the two photosensitive sensors 2021 respectively, so as to be adapted for assembling the array camera module. It is worth mentioning that the connecting unit 2014L is a common segment for the two camera lenses 500 to share for installation, which means that as the two camera lenses 500 are installed, each of the camera lenses 500 occupies a corresponding portion of the connecting unit 2014L.

In addition, the optical filter installing section 2012L has two installing grooves 20121L formed therein. The installing grooves 20121L are respectively communicated to the windows 20100L respectively to provide adequate installation space for the optical filters 400, such that the optical filters 400 will not protrude from the top surface of the optical filter installing section. The camera lens installing section 2013L has two lens installing grooves 20131L provided therein. The two lens installing grooves 20131L are communicated with the two windows 20100L respectively, so as to provide adequate installation space for installing the two camera lenses 500.

In other words, the optical filter installing section 2012L and the camera lens installing section 2013L are integrally extended upwardly to form an internal step shape structure, which respectively provide supporting and affixing positions to the optical filters 400 and the camera lenses 500, which, therefore, does not require any extra part for the installation of the optical filters 400 and the camera lenses 500.

The integral camera lens installing section 2013L has two camera lens inner walls 20132L defining two installation chambers. Each of the camera lens inner walls 20132L has a close ring shape, which is adapted for providing the installation chamber for the respective camera lens 500. It is worth mentioning that the surfaces of the camera lens inner walls 20132L of the camera lens installing section 2013L are smooth for installing the threadless camera lenses 500 respectively to form a fixed focus array camera module. Particularly, the camera lenses 500 can be secured in the camera lens installing section 2013L by adhering.

Figure 56:
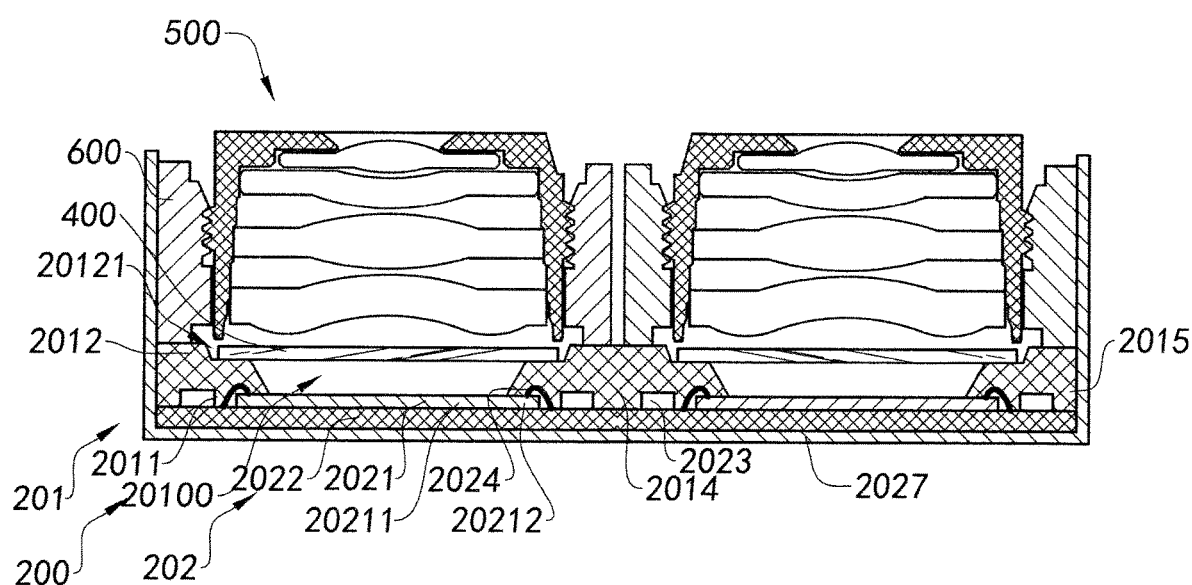
FIG. 56 is a sectional view of an array camera module with photosensitive unit according to a 26th preferred embodiment of the present invention.

Referring to FIG. 56, the array camera module with its photosensitive unit according to a twenty-sixth preferred embodiment of the present invention is illustrated. The different between this twenty-sixth preferred embodiment and the above preferred embodiments is that, the photosensitive unit 200 includes a shielding layer 227 that covers the main circuit board 2022 and the conjoined encapsulation portion 21, so as to not only reinforce the structural strength of the main circuit board 2022, but also enhance the electromagnetic immunity ability of the photosensitive unit 200.

Figure 57:
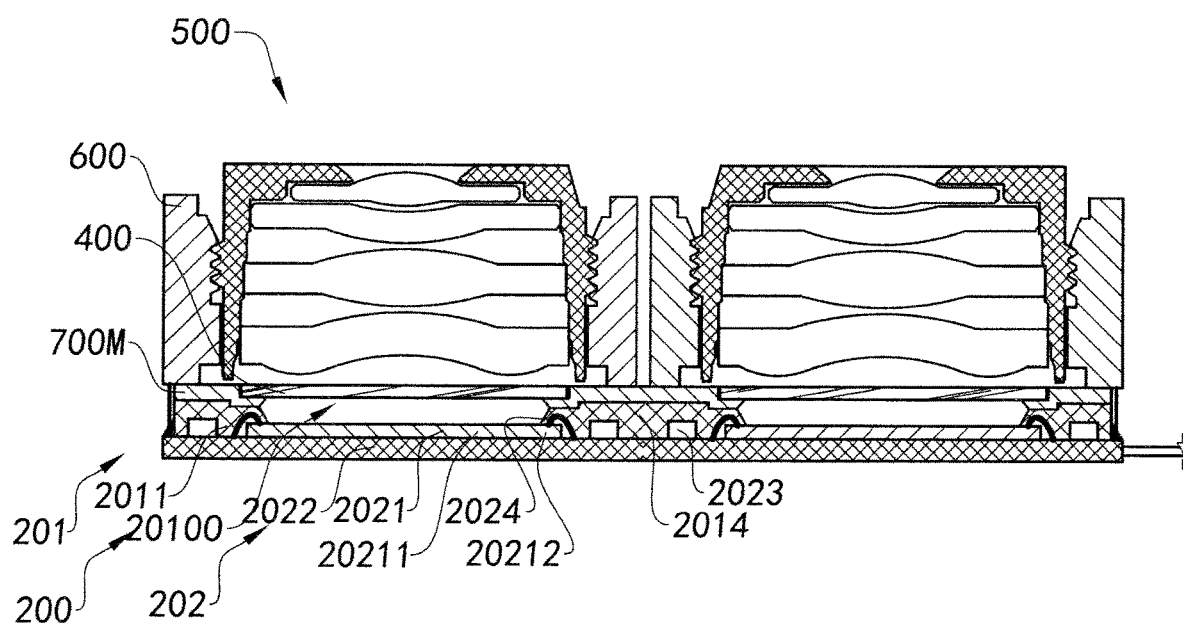
FIG. 57 is a sectional view of an array camera module with photosensitive unit according to a 27th preferred embodiment of the present invention.

Referring to FIG. 57, the array camera module with its circuit unit according to a twenty-seventh preferred embodiment of the present invention is illustrated. The different between this twenty-seventh preferred embodiment and the above embodiment is that, the array camera module includes a frame 700M, for installing the optical filters 400, the camera lenses 500, and/or the motor units 600. According to the present twenty-seventh preferred embodiment of the present invention, the frame 700M is mounted on the conjoined encapsulation portion 201. The two optical filters 40 are mounted on the frame 700M. The two motor units 600 are mounted on the frame 700M. Specific shape of the frame 700M can be arranged based on the practical needs, wherein, for example, the frame 700M can be embodied as a platform to install the optical filters and the motor units 600. The frame 700M can be a conjoined frame, which, in other words, can have a plurality of the optical filters 400 installed thereon. Alternatively, the frame 700M can also be a single frame, which can have only one optical filter 400 installed thereon and two independent frames are mounted on the conjoined encapsulation portion 201 to install the two optical filters 400. In the present twenty-seventh preferred embodiment of the present invention, the frame 700M is preferably, a conjoined frame. Those skilled in the art should understand that specific shape of the frame 700M shall not limit the scope the present invention.

Figure 58:
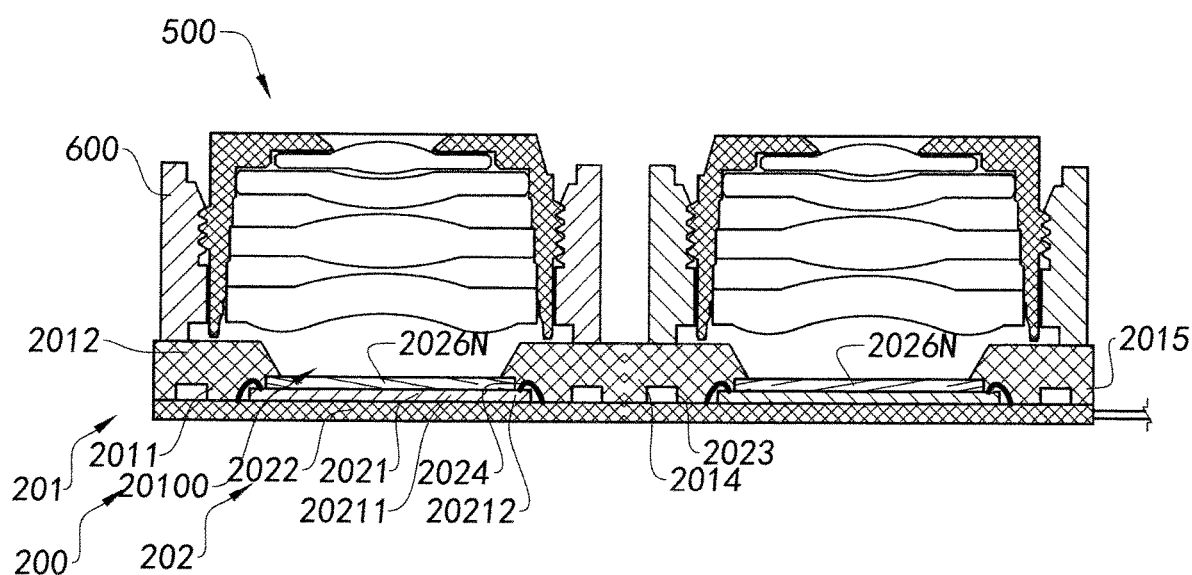
FIG. 58 is a sectional view of an array camera module with photosensitive unit according to a 28th preferred embodiment of the present invention.
Figure 59:
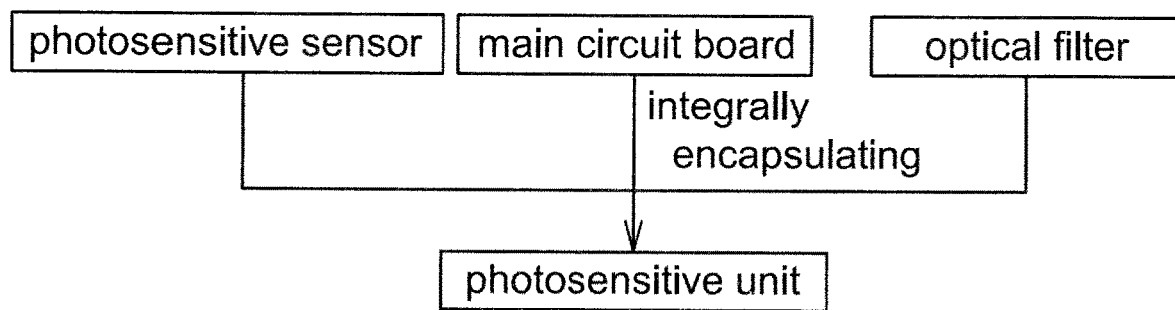
FIG. 59 is a block diagram illustrating the photosensitive unit according to the above preferred embodiment of the present invention.

Referring to FIG. 58, the array camera module with its photosensitive unit according to a twenty-eighth preferred embodiment of the present invention is illustrated. The array camera module includes a photosensitive unit 200N. The two camera lenses 500 are mounted on the photosensitive unit 200N for assembling and forming the array camera module.

Specifically, the camera lenses 500 can be affixed on top of the conjoined encapsulation portion 201N of the photosensitive unit 200N by means of adhering. In addition, taking advantage of the molding technique, the top of the conjoined encapsulation portion 201N can have a better flatness, evenness and smoothness, which provides an excellent installation condition for the camera lenses 500, so as to achieve a high quality array camera module. The photosensitive unit 200N is for assembling and producing the array camera module, so as to obtain the molded array camera modules.

The photosensitive unit 200N includes a conjoined encapsulation portion 201N and a photosensitive portion 202N, wherein the conjoined encapsulation portion 202N is integrally encapsulated to the photosensitive portion 202N, such that the conjoined encapsulation portion 201N is molded to connect to the photosensitive portion 202N.

The circuit board portion includes a main circuit board 2022N. The conjoined encapsulation portion 201N forms two windows 20100N therein, so that the conjoined encapsulation portion 201N is respectively positioned surrounding the outer portion of the photosensitive sensors 2021N and provides light paths from the camera lenses 500 to the photosensitive sensors 2021N through the windows 20100N respectively. The photosensitive sensors 2021N are installed at the positions corresponding to the windows 20100N on the main circuit board 2022N.

The conjoined encapsulation portion 201N includes a connecting unit 2014N and two outer surrounding units 2015N. The connecting unit 2014N is integrally molded to connect between the two outer surrounding units 2015N to form an integral body. The connecting unit 2014N separates the outer surrounding units 2015N into two neighboring portions. The two outer surrounding units 2015N form two windows 20100N respectively. The two photosensitive sensors 2021 are respectively located at two sides of the connecting unit 2014N and aligned with the two windows 20100N, so as to be adapted for assembling the array camera module. It is worth mentioning that the connecting unit 2014N is a common segment for the two camera lenses 500, which means that as the camera lenses 500 are installed, each of the camera lenses 500 respectively occupies a corresponding portion of the connecting unit 2014N.

The photosensitive portion 202N includes a main circuit board 2022N and the two photosensitive sensors 2021N, wherein the photosensitive sensors 2021N are respectively disposed on the main circuit board 2022N. According to the present twenty-eighth preferred embodiment of the present invention, the photosensitive sensors 2021N are molded to connect to the main circuit board 2022N.

According to the present twenty-eighth preferred embodiment of the present invention, the photosensitive portion 202N includes a connecting circuit (not shown in the figures) and one or more circuit elements 2023N. The connecting circuit is preinstalled in the main circuit board 2022N. The circuit elements 2023N are electrically connected to the connecting circuit and the photosensitive sensors 2021N, wherein the photosensitive sensors 2021N would process their photosensing processes. The circuit element 2023N is protrudingly deployed on the main circuit board 2022N. The circuit element 2023N can be, for example but not limited to, resistors, capacitors, diodes, triodes, potentiometers, electric relays, or actuators.

It is worth mentioning that the conjoined encapsulation portion 201N encapsulates and wraps up the circuit elements 2023N therein, so that the circuit elements 2023N will not be directly exposed in the open space, and more specifically, not be exposed in the environment that communicates with the photosensitive sensors 2021N. Therefore, during the assembling of the array camera module, the circuit elements 2023N will not be contaminated by pollutants, such as dusts, or influence the photosensitive sensor 2021N, which is different from the arrangement of conventional camera module that the circuit elements 2023N, such as resistance-capacitance components, are exposed to outside. The use of the molding method prevents sundries and dusts from staying on the surface of the circuit elements 2023N and avoids the photosensitive sensors 2021N from being contaminated and causing dark spots and other defectives of the array camera module.

According to the present twenty-eighth preferred embodiment of the present invention, the photosensitive portion 202N includes a plurality of connecting elements 2024N for respectively electrically connecting the photosensitive sensors 2021N with the main circuit board 2022N. Further, the connecting elements 2024N can each be embodied to be, specifically but not limited to, gold wire, copper wire, aluminum wire, and/or silver wire.

It is worth mentioning that the connecting elements 2024N are molded inside the conjoined encapsulation portion 201N, so that the conjoined encapsulation portion 201N substantially encloses, encapsulates and/or wraps up the connecting elements 2024N and keeps them from direct exposure to the outside. Therefore, during assembling the array camera module, the connecting elements 2024N will not suffer any collision or damage, which, at the same time, reduces the impact due to the environmental factors, such as temperature, on the connecting element 2024N and stabilizes the communication and connection between the photosensitive sensors 2021N and the main circuit board 2022N. This is not provided in the conventional art.

It is worth mentioning that the conjoined encapsulation portion 201N encapsulates and wraps up the circuit elements 2023N and the connecting elements 2024N, which advantages in protecting the circuit elements 2023N and the connecting elements 2024N as well as achieving a higher performance array camera module. However, those skilled in the art should understand that the conjoined encapsulation portion 201N shall not be limited in wrapping up the circuit elements 2023N and/or the connecting elements 2024N. In other words, in other embodiments of the present invention, the conjoined encapsulation portion 201N can be directly molded on the main circuit board 2022N without protruded circuit elements 2023N or be molded on various positions, such as the outer side, periphery, and etc., of the circuit elements.

In addition, each of the photosensitive sensors 2021N has a photosensitive area 20211N and a non-photosensitive area 20212N, wherein the non-photosensitive area 20212N is positioned surrounding the periphery of the photosensitive area 20211N. The photosensitive area 20211N is adapted for conducting photosensitization. The connecting elements 2024N are connected to the non-photosensitive area 20212N.

According to the twenty-eighth preferred embodiment of the present invention, the conjoined encapsulation portion 201N is extended on the non-photosensitive area 20212N of the photosensitive sensor 2021N, so as to overlappedly mount the photosensitive sensor 2021N on the main circuit board 2022N by molding. In this manner, such as by means of the process of Molding On Chip, the moldable area of the conjoined encapsulation portion 201N can be extended inwardly, such that the structural portion of the outer portion of the conjoined encapsulation portion 201N and the main circuit board 2022N can be reduced, which further reduces the size in length and width of the molded photosensitive portion 202N and reduces the size in length and width of the array camera module assembled thereby.

The photosensitive unit 200N further includes two optical filters 226N, wherein the optical filters 226N are molded to overlappedly mount on the photosensitive sensors 2021N respectively. The edges of the two optical filters 226N are encapsulated by the conjoined encapsulation portion 201N, so as to hold the optical filters 226N in position. It is worth mentioning that the optical filters 226N cover the two photosensitive sensors 2021N respectively and insulate the photosensitive sensors 2021N from the external environment to protect the photosensitive sensors 2021N from damages.

To produce the molded photosensitive unit, the photosensitive sensors 2021N are firstly adhered on the main circuit board 2022N and then the connecting elements 2024 connect the photosensitive sensors 2021N to the main circuit board 2022N. Then, the optical filters 226N are attached on the photosensitive sensors 2021N respectively. Thereafter, the main circuit board 2022N, the photosensitive sensors 2021N, and the optical filters 226N are molded to form the conjoined encapsulation portion 201N. During the molding process, because the optical filters 226N are attached on top of the photosensitive sensors 2021N, damages caused by the molding mould to the photosensitive sensors 2021N can be avoided. Besides, because the distance between the optical filters 226N and the photosensitive sensors 2021N is shortened, the back focal length of the array camera module assembled thereby can be shortened, which is able to reduce the height of the array camera module. Furthermore, because the optical filters 226N do not require any additional supportive component, the thickness of the array camera module can further be reduced to a certain extend.

In the present twenty-eighth preferred embodiment of the present invention, the conjoined encapsulation portion 201N is protrudingly positioned surrounding the outer portion of the photosensitive area 20211N of each photosensitive sensor 2021N. Particularly, the conjoined encapsulation portion 201N integrally encapsulates and encloses the connection of the photosensitive sensors 2021N and the main circuit board 2022N, so as to provide a good sealingness and tightness. Therefore, when the photosensitive unit 200N is used in assembling the array camera module, each photosensitive sensors 2021N is sealed to form a sealed inner space.

Specifically, to produce the photosensitive unit 200N, a conventional circuit board may be used to form the main circuit board 2022N. Then, the photosensitive sensors 2021N are arranged to install on the main circuit board 2022N and electrically connected with the connecting elements 2024N. Further, the optical filters 226N are overlappingly attached on the photosensitive sensors 2021N respectively. Then, after the initial assemble of main circuit board 2022N, the photosensitive sensors 2021N and the optical filters 226N are processed by Surface Mount Technology (SMT) and then molded, for example, by means of the insert molding technique by an injection molding machine, to form the conjoined encapsulation portion 201N, or by means of the pressing molding technique, which is commonly used in semiconductor packaging, to form the conjoined encapsulation portion 201N. The main circuit board 2022N can selectively be, for example but not limited to, rigid-flex board, ceramic substrate (without flexible board), or rigid PCB (without flexible board). The method to form the conjoined encapsulation portion 201N can be selected from, for example but not limited to, injection molding technique and pressing molding technique. The material of the conjoined encapsulation portion 201N can be, for example but not limited to, nylon, liquid crystal polymer (LCP), or polypropylene (PP) for injection molding technique, or resin for pressing molding technique. Those skilled in the art should understand that the above available manufacture methods and available materials are examples to describe available implementations of the present invention, rather than limitations of the present invention.

Figure 60A:
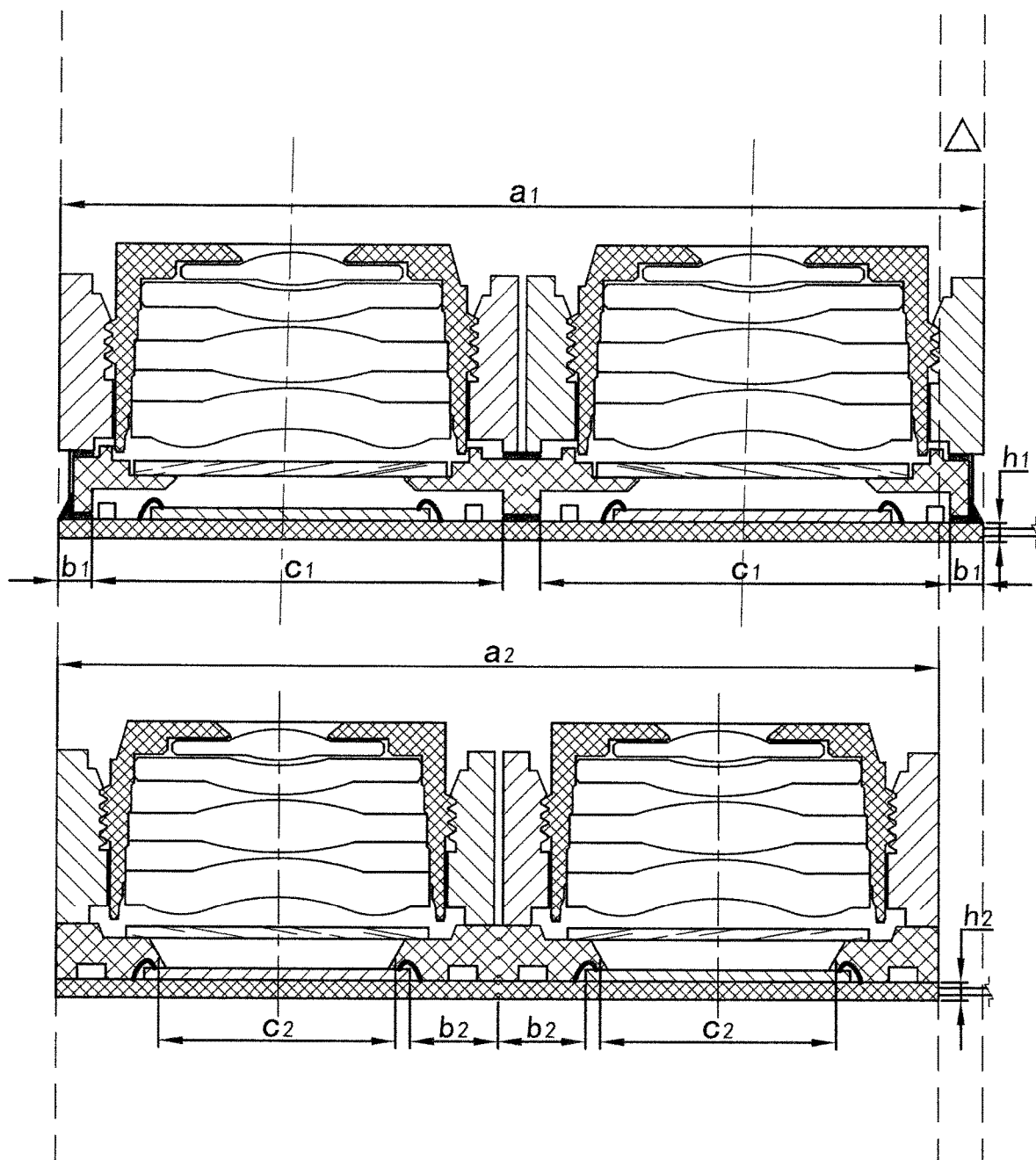
FIGS. 60A and 60B are comparison perspective diagrams of the array camera module according to the above preferred embodiments of the present invention and a conventional multi-lens camera module camera module.
Figure 60B:
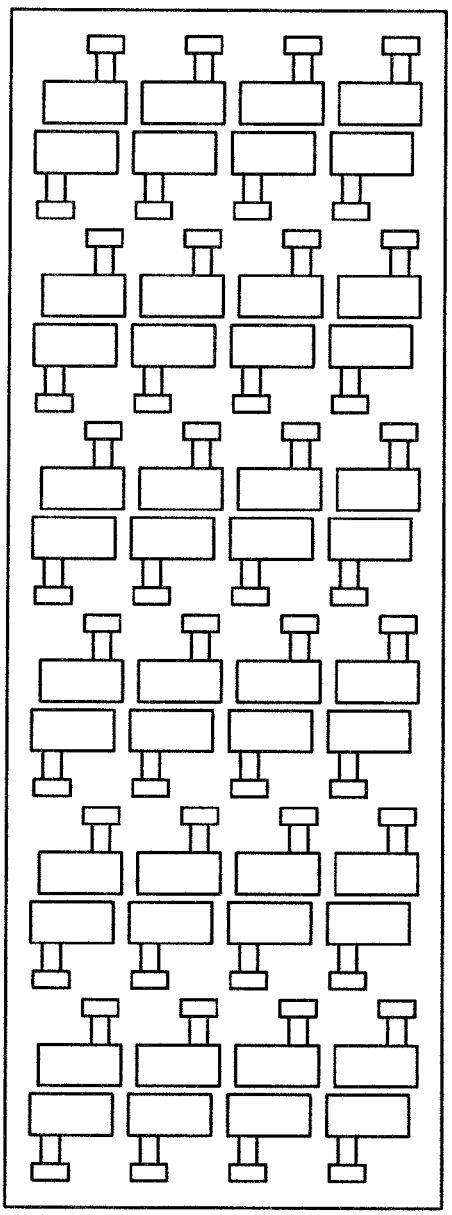
Figure 60B:
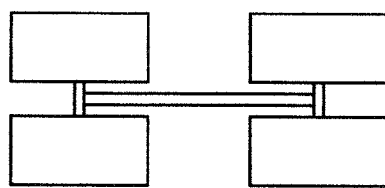

FIGS. 60A and 60B illustrate the comparison of the array camera module according to the above preferred embodiment of the present invention and a conventional multi-lens camera module. The left view of FIG. 60A refers to a conventional multi-lens camera module, while the right view of FIG. 60A refers to the array camera module of the present invention. The left view of FIG. 60B illustrates the manufacturing a conventional circuit board, while the right view of FIG. 60B illustrates the imposition process of the present invention. In view of above, the array camera module of the present invention has the following advantages:

1. The conjoined encapsulation portion of the array camera module of the present invention provides consistent installation condition for all of the camera lenses or motor units, such that the consistency among the optic axises of the camera lenses can be increased. This installation condition for camera lenses or motor units is better than what could be provided by the conventional independent frames and the frames adhered by means of the COB technique.

2. The conjoined encapsulation portion of the array camera module of the present invention provides all camera lenses or motor units installation positions. The manufacturing method according to the present invention can reduce the installation spacing among the camera lenses, which fully utilizes the space and reduces the lateral size of the array camera module.

3. It can decrease the size in length and width of the array camera module, wherein the encapsulation portion and circuit elements, such as resistance-capacitances, can be spatially overlapped. However, the frame of conventional solution has to be installed at the outer side of the capacitors and reserve a certain safety distance. The present invention can utilize the space of the capacitors directly to fill with molding material around the capacitors directly.

4. The tilt of the array module can be reduced. The encapsulation portion can substitute the conventional plastic frame to reduce the accumulated tolerance/deviance and eliminate the AA adjustment process.

5. The molding structure enhances the structural strength of the circuit board that, under the same structural strength, the circuit board can be thinner to reduce the overall height of the array camera module because the encapsulation portion can provide support and increase strength.

6. For the altitude space, a reserved safety space for assembling is required between capacitors and the base in the conventional camera module. However, the molding technique of the present invention does not require such safety space for assembling, that reduces the height of the array camera module. A safety gap between the top of the capacitors and the frame is required in the conventional camera module in order to prevent interferences, but the present invention can directly fill molding material around the capacitors.

7. The resistance-capacitance components can be wrapped by molding, so as to avoid dark spots and defectives of the camera module brought by solder resist or dust in the resistance-capacitance area, and to increase the product yield rate.

8. It is suitable for highly efficient mass production. Photosensitive unit of the present invention is more suitable for mass imposition process. According to the molding method of forming the photosensitive unit of the present invention, the photosensitive unit is more suitable by imposition process. In other words, only at most 8 conventional circuit boards can be produced in one conventional process, but more of the photosensitive units, as much as 80 to 90 pieces, can be finished at once by the present invention.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A photosensitive unit for a camera module comprising at least a camera lens, comprising:
   a photosensitive portion which comprises a circuit board including a main circuit board and one or more circuit elements, at least a photosensitive sensor which is provided on said circuit board and has a photosensitive area and a non-photosensitive area positioned around a periphery of said photosensitive area, and one or more connecting elements electrically connecting said main circuit board to said non-photosensitive area of said photosensitive sensor;
   an encapsulation portion which is integrally molded to form a support on said main circuit board and extended to said non-photosensitive area of said photosensitive sensor so as to overlappedly affix said photosensitive sensor on said main circuit board by means of molding, said encapsulation portion being protrudingly formed on said non-photosensitive area and surrounding said photosensitive area of said photosensitive sensor to form a lower covering section, an upper installing section and at least an annular inclined inner wall upwardly and outwardly extending from said non-photosensitive area of said photosensitive sensor to said installing section to define a window above said photosensitive area of said photosensitive sensor, wherein said covering section of said encapsulation portion is molded to have an integral enclosure connection with said main circuit board and to cover, encapsulate and wrap up said circuit elements and said connecting elements, wherein said installing section is adapted for enabling the camera lens to be installed thereon and aligned at a photosensitive path of said photosensitive sensor and positioned above said window; and
   a motor unit mounted on a top surface of said encapsulation portion and electrically connected to said main circuit board;
   wherein a molding area of said encapsulation portion is extended inwardly to reduce outer structural portions of said encapsulation portion and said main circuit board, and to reserve a terminal slot for accommodating a motor terminal of the motor unit.

2. The photosensitive unit, as recited in claim 1, wherein the terminal slot is extended from the top of the encapsulation portion to the main circuit board to present a circuit connection junction provided on the main circuit board and electrically connected to a connecting circuit in the main circuit board, and the motor terminal is adapted to insert into the terminal slot and connect to the circuit connection junction by soldering or welding.

3. The photosensitive unit, as recited in claim 2, wherein said installing section of said encapsulation portion has at least an installing groove provided on top of said encapsulation portion and communicated with said window, wherein said installing groove has a flat bottom surface, in parallel with said photosensitive area of said photosensitive sensor, adapted for an outer bottom peripheral portion of an optical filter being attached thereon.

4. The photosensitive unit, as recited in claim 2, wherein said photosensitive portion further includes a reinforced layer overlappedly attached to a bottom of said main circuit board so as to reinforce a structural strength of said main circuit board and enhance a heat dissipation of said photosensitive unit.

5. The photosensitive unit, as recited in claim 1, wherein said installing section of said encapsulation portion has at least an installing groove provided on top of said encapsulation portion and communicated with said window, wherein said installing groove has a flat bottom surface, in parallel with said photosensitive area of said photosensitive sensor, adapted for an outer bottom peripheral portion of an optical filter being attached thereon.

6. The photosensitive unit, as recited in claim 5, wherein said photosensitive portion further includes a reinforced layer overlappedly attached to a bottom of said main circuit board so as to reinforce a structural strength of said main circuit board and enhance a heat dissipation of said photosensitive unit.

7. The photosensitive unit, as recited in claim 1, wherein said photosensitive portion further includes a reinforced layer overlappedly attached to a bottom of said main circuit board so as to reinforce a structural strength of said main circuit board and enhance a heat dissipation of said photosensitive unit.

8. A photosensitive unit for a camera module comprising at least a camera lens, comprising:
   a photosensitive portion which comprises a circuit board including a main circuit board and one or more circuit elements, at least a photosensitive sensor which is provided on said circuit board and has a photosensitive area and a non-photosensitive area positioned around a periphery of said photosensitive area, and one or more connecting elements electrically connecting said main circuit board to said non-photosensitive area of said photosensitive sensor; and
   an encapsulation portion which is integrally molded to form a support on said main circuit board and extended to said non-photosensitive area of said photosensitive sensor so as to overlappedly affix said photosensitive sensor on said main circuit board by means of molding, said encapsulation portion being protrudingly formed on said non-photosensitive area and surrounding said photosensitive area of said photosensitive sensor to form a lower covering section, an upper installing section and at least an annular inclined inner wall upwardly and outwardly extending from said non-photosensitive area of said photosensitive sensor to said installing section to define a window above said photosensitive area of said photosensitive sensor, wherein said covering section of said encapsulation portion is molded to have an integral enclosure connection with said main circuit board and to cover, encapsulate and wrap up said circuit elements and said connecting elements, wherein said installing section is adapted for enabling the camera lens to be installed thereon and aligned at a photosensitive path of said photosensitive sensor and positioned above said window, wherein a molding area of said encapsulation portion is extended inwardly to reduce outer structural portions of said encapsulation portion and said main circuit board so as to reduce a size in length and width of said photosensitive unit, and to reserve a terminal slot for accommodating a motor terminal of a motor unit.

9. The photosensitive unit, as recited in claim 8, wherein said installing section of said encapsulation portion has at least an installing groove provided on top of said encapsulation portion and communicated with said window adapted for an optical filter mounting thereon while a top surface of an optical filter being not protruded on a top surface of said encapsulation portion, wherein said installing groove has a flat bottom surface, in parallel with said photosensitive area of said photosensitive sensor, for an outer bottom peripheral portion of the optical filter being attached thereon for ensuring the optical filter being mounted in parallel with said photosensitive sensor.

10. The photosensitive unit, as recited in claim 8, further comprising an optical filter which is overlappedly disposed on said photosensitive sensor.

11. The photosensitive unit, as recited in claim 10, wherein said optical filter is molded to overlappedly disposed on said photosensitive sensor, wherein edges of said optical filter are molded by said encapsulation portion so as to affix said optical filter in position.

12. The photosensitive unit, as recited in claim 11, wherein said photosensitive portion further includes a reinforced layer overlappedly attached to a bottom of said main circuit board so as to reinforce a structural strength of said main circuit board and enhance a heat dissipation of said photosensitive unit.

13. The photosensitive unit, as recited in claim 8, wherein said photosensitive portion further includes a reinforced layer overlappedly attached to a bottom of said main circuit board so as to reinforce a structural strength of said main circuit board and enhance a heat dissipation of said photosensitive unit.

14. The photosensitive unit, as recited in claim 8, further comprising a motor connecting structure which is arranged for connecting to said motor unit and includes at least one carving line arranged to electrically connect said one or more connecting elements, said photosensitive sensor and said motor unit on said main circuit board.

15. The photosensitive unit, as recited in claim 14, wherein said at least one carving line is formed on a surface of said encapsulation portion providing an electrical circuit connection with said one or more connecting elements, said photosensitive sensor and said motor unit.

16. The photosensitive unit, as recited in claim 15, wherein said at least one carving line is formed by providing at least one carving slot in said encapsulation portion and then electroplating said at least one carving slot to form said at least one carving line for electrically connecting said motor unit with said main circuit board of said photosensitive portion.

17. The photosensitive unit, as recited in claim 16, wherein said photosensitive portion further includes a reinforced layer overlappedly attached to a bottom of said main circuit board so as to reinforce a structural strength of said main circuit board and enhance a heat dissipation of said photosensitive unit.

18. A photosensitive unit for a camera module comprising at least a camera lens, comprising:

a photosensitive portion which comprises a circuit board including a main circuit board and one or more circuit elements, at least a photosensitive sensor which is provided on said circuit board and has a photosensitive area and a non-photosensitive area positioned around a periphery of said photosensitive area, and one or more connecting elements electrically connecting said main circuit board to said non-photosensitive area of said photosensitive sensor; and an encapsulation portion which is integrally molded to form a support on said main circuit board and extended to said non-photosensitive area of said photosensitive sensor so as to overlappedly affix said photosensitive sensor on said main circuit board by means of molding, said encapsulation portion being protrudingly formed on said non-photosensitive area and surrounding said photosensitive area of said photosensitive sensor to form a lower covering section, an upper installing section and at least an annular inclined inner wall upwardly and outwardly extending from said non-photosensitive area of said photosensitive sensor to said installing section to define a window above said photosensitive area of said photosensitive sensor, wherein said covering section of said encapsulation portion is molded to have an integral enclosure connection with said main circuit board and to cover, encapsulate and wrap up said circuit elements and said connecting elements, wherein said installing section is adapted for enabling the camera lens to be installed thereon and aligned at a photosensitive path of said photosensitive sensor and positioned above said window, wherein said installing section of said encapsulation portion has at least an installing groove provided on top of said encapsulation portion and communicated with said window adapted for an optical filter mounting thereon while a top surface of an optical filter being not protruded on a top surface of said encapsulation portion, wherein said installing groove has a flat bottom surface, in parallel with said photosensitive area of said photosensitive sensor, for an outer bottom peripheral portion of the optical filter being attached thereon for ensuring the optical filter being mounted in parallel with said photosensitive sensor, and wherein a molding area of said encapsulation portion is extended inwardly to reduce outer structural portions of said encapsulation portion and said main circuit board, and to reserve a terminal slot for accommodating a motor terminal of a motor unit.

19. The photosensitive unit, as recited in claim 18, wherein said main circuit board is processed by Surface Mount Technology (SMT) before said encapsulation portion is molded thereon, wherein said main circuit board is selected from the group consisting of rigid-flex board, ceramic substrate, and rigid PCB, wherein a molding material of said encapsulation portion is selected from the group consisting of nylon, liquid crystal polymer (LCP), or polypropylene (PP) for injection molding technique, or resin.

20. The photosensitive unit, as recited in claim 18, wherein said photosensitive portion further includes a reinforced layer overlappedly attached to a bottom of said main circuit board so as to reinforce a structural strength of said main circuit board and enhance a heat dissipation of said photosensitive unit.

* * * * *